United States Patent
Lutgen et al.

(10) Patent No.: US 12,243,906 B2
(45) Date of Patent: Mar. 4, 2025

(54) LOW RESISTANCE CURRENT SPREADING TO N-CONTACTS OF MICRO-LED ARRAY

(71) Applicant: Meta Platforms Technologies, LLC, Menlo Park, CA (US)

(72) Inventors: Stephan Lutgen, Dresden (DE); Markus Broell, Unterhaching (DE); Thomas Lauermann, Berlin (DE); Berthold Hahn, Cork (IE); Christophe Antoine Hurni, Seattle, WA (US); Guillaume Lheureux, Cork (IE)

(73) Assignee: META PLATFORMS TECHNOLOGIES, LLC, Menlo Park, CA (US)

(*) Notice: Subject to any disclaimer, the term of this patent is extended or adjusted under 35 U.S.C. 154(b) by 531 days.

(21) Appl. No.: 17/525,442

(22) Filed: Nov. 12, 2021

(65) Prior Publication Data
US 2022/0173159 A1    Jun. 2, 2022

Related U.S. Application Data

(60) Provisional application No. 63/119,412, filed on Nov. 30, 2020.

(51) Int. Cl.
*H01L 27/15* (2006.01)
*G02B 27/01* (2006.01)
(Continued)

(52) U.S. Cl.
CPC ........ *H01L 27/156* (2013.01); *G02B 27/0101* (2013.01); *H01L 33/005* (2013.01);
(Continued)

(58) Field of Classification Search
CPC ..... H01L 27/156; H01L 33/005; H01L 33/20; H01L 33/62; H01L 2933/0066;
(Continued)

(56) References Cited

U.S. PATENT DOCUMENTS 11,139,417 B1    10/2021  Hurni et al.
2010/0265983 A1*  10/2010  Adachi ............... H01S 5/18
                                              372/50.23
(Continued)

OTHER PUBLICATIONS

International Preliminary Report on Patentability for International Application No. PCT/US2021/061233, mailed Jun. 15, 2023, 9 pages.
(Continued)

*Primary Examiner* — Mohammad A Rahman
(74) *Attorney, Agent, or Firm* — Weaver Austin Villeneuve & Sampson LLP

(57) ABSTRACT

A light source includes an epitaxial layer stack that includes an n-type semiconductor layer, a light-emitting layer, and a p-type semiconductor layer. The epitaxial layer stack includes a two-dimensional (2-D) array of mesa structures formed therein. The light source further includes an array of p-contacts electrically coupled to the p-type semiconductor layer of the 2-D array of mesa structures, a metal layer in regions surrounding individual mesa structures of the 2-D array of mesa structures, and a plurality of n-contacts
(Continued)

coupling the metal layer to the n-type semiconductor layer at a plurality of locations between the individual mesa structures of the 2-D array of mesa structures.

21 Claims, 30 Drawing Sheets

(51) Int. Cl.
    *H01L 33/00*       (2010.01)
    *H01L 33/20*       (2010.01)
    *H01L 33/62*       (2010.01)

(52) U.S. Cl.
    CPC .............. *H01L 33/20* (2013.01); *H01L 33/62* (2013.01); *H01L 2933/0066* (2013.01)

(58) Field of Classification Search
    CPC . H01L 25/167; H01L 33/0093; H01L 33/385; H01L 33/58; H01L 33/60; H01L 33/38; H01L 27/15; G02B 27/0101; G02B 27/0172; G02B 3/0075
    See application file for complete search history.

(56) References Cited

U.S. PATENT DOCUMENTS

| | | |
|---|---|---|
| 2015/0311415 A1 | 10/2015 | Song et al. |
| 2018/0301875 A1* | 10/2018 | Burroughs ............ H01S 5/0071 |
| 2019/0006327 A1 | 1/2019 | Kang et al. |
| 2020/0058824 A1* | 2/2020 | Jang ...................... H01L 27/156 |
| 2020/0235161 A1* | 7/2020 | Kwak ................... H01L 27/156 |
| 2020/0381588 A1 | 12/2020 | Thompson et al. |
| 2021/0111319 A1 | 4/2021 | Lutgen et al. |
| 2021/0159376 A1 | 5/2021 | Hurni et al. |
| 2021/0288222 A1 | 9/2021 | Young et al. |

OTHER PUBLICATIONS

International Search Report and Written Opinion for International Application No. PCT/US2021/061233, mailed Mar. 28, 2022, 11 pages.

* cited by examiner

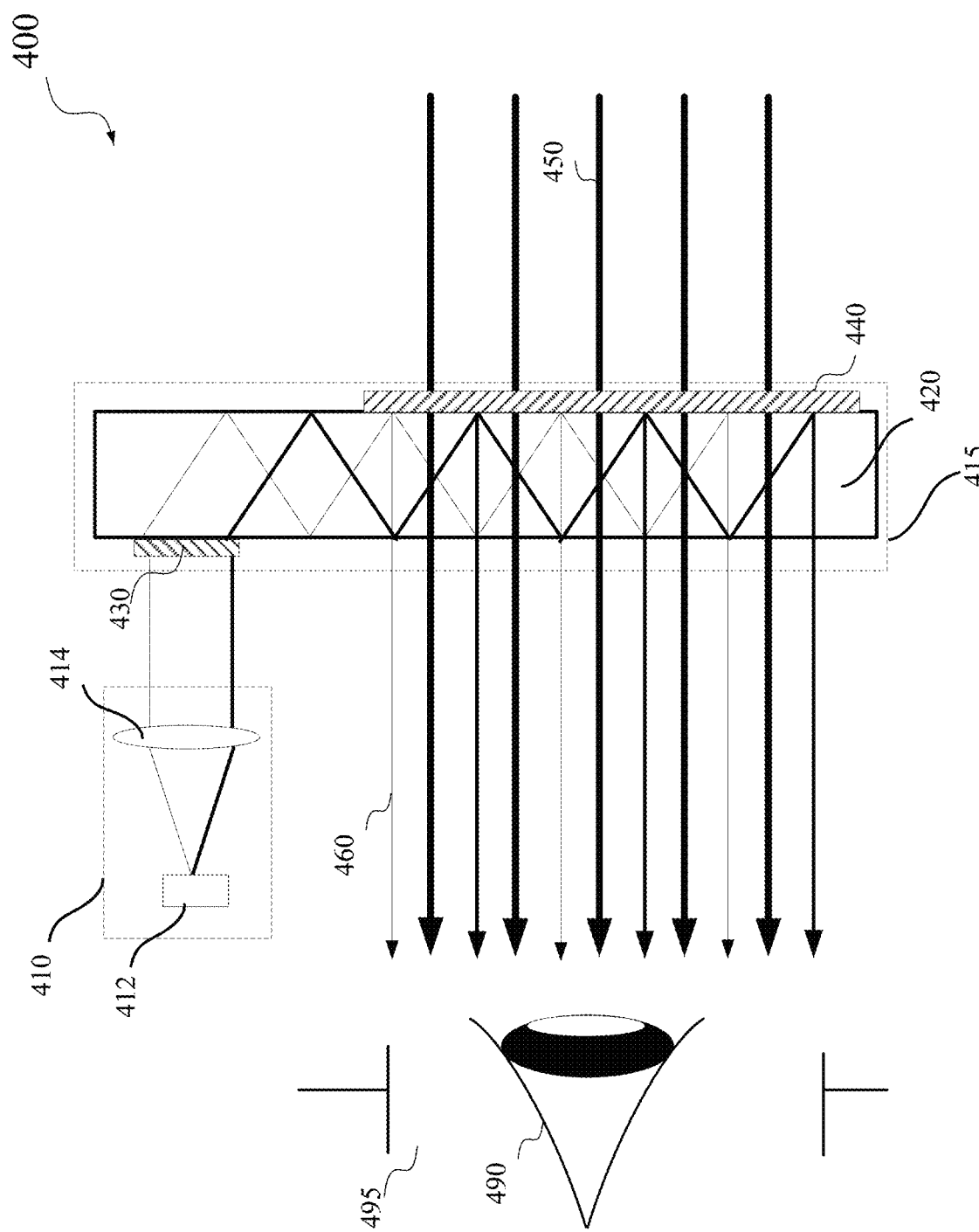

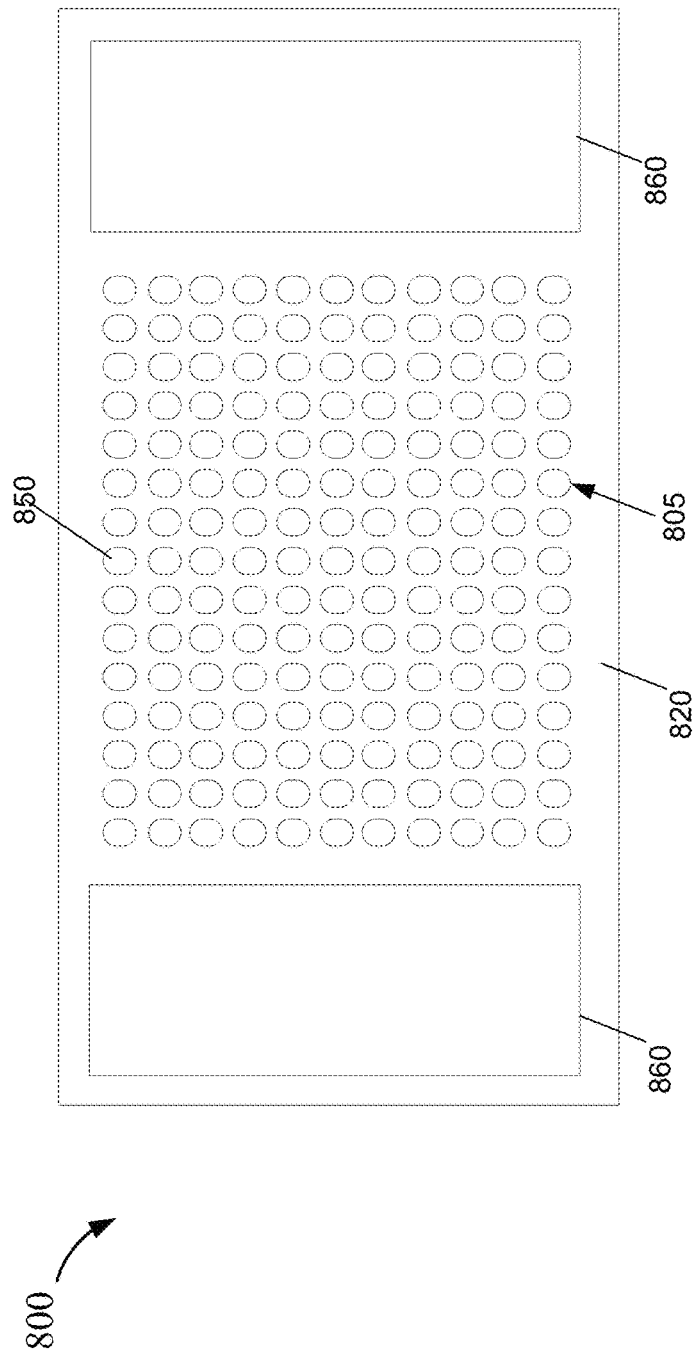
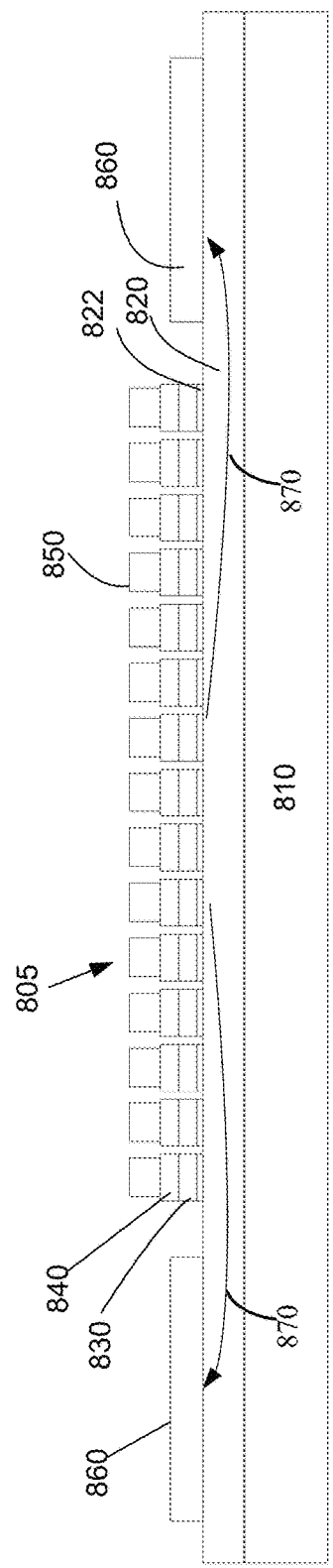
FIG. 8A
FIG. 8B

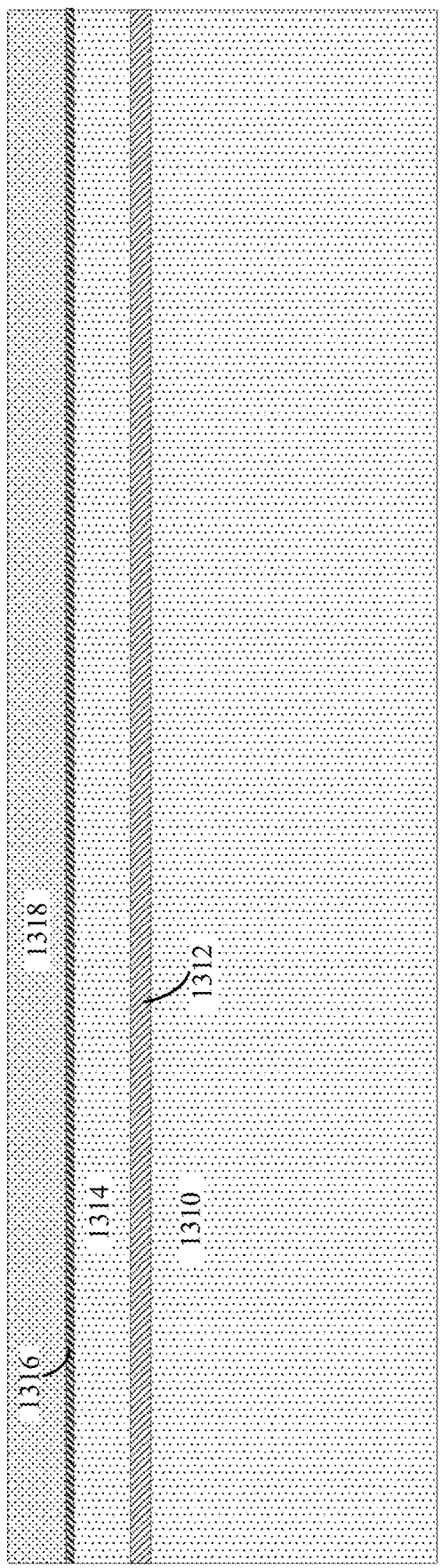
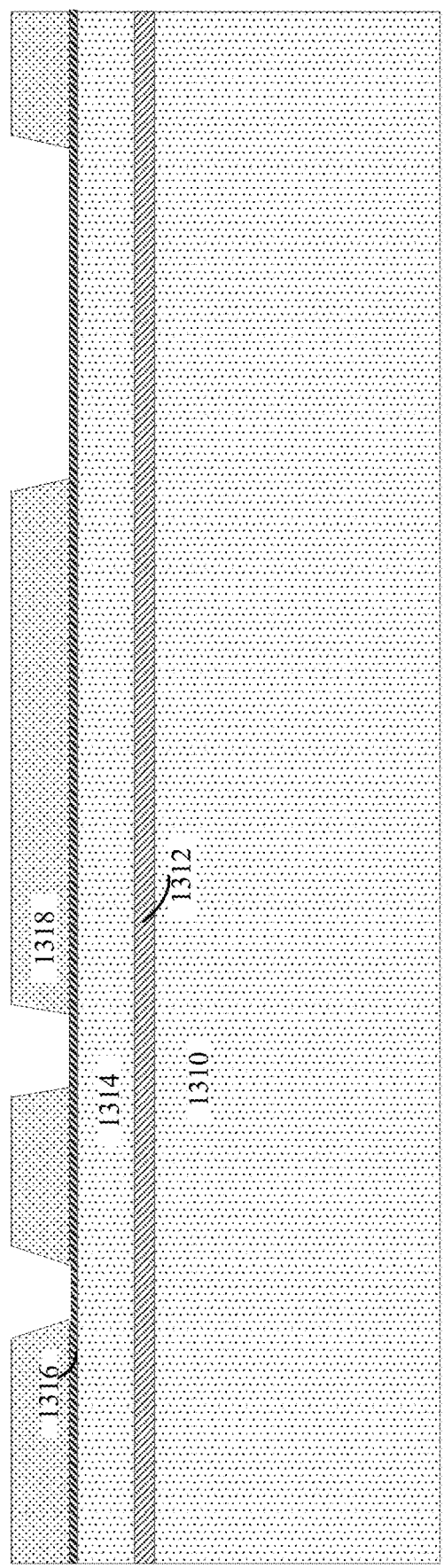
FIG. 13A
FIG. 13B

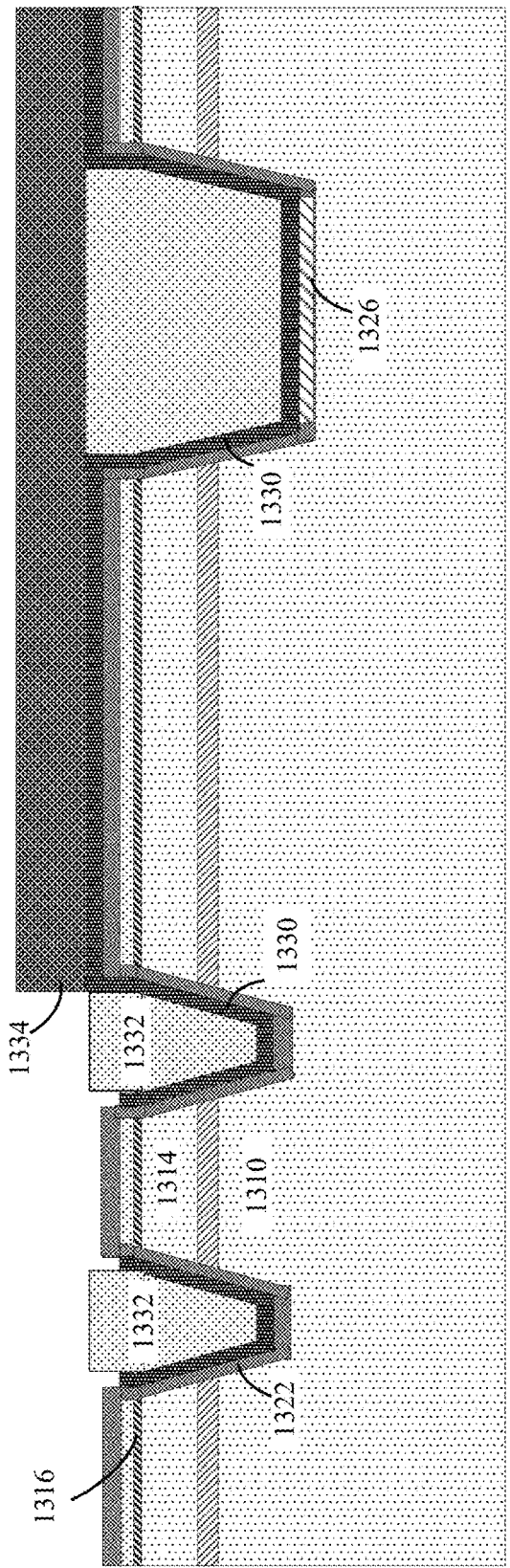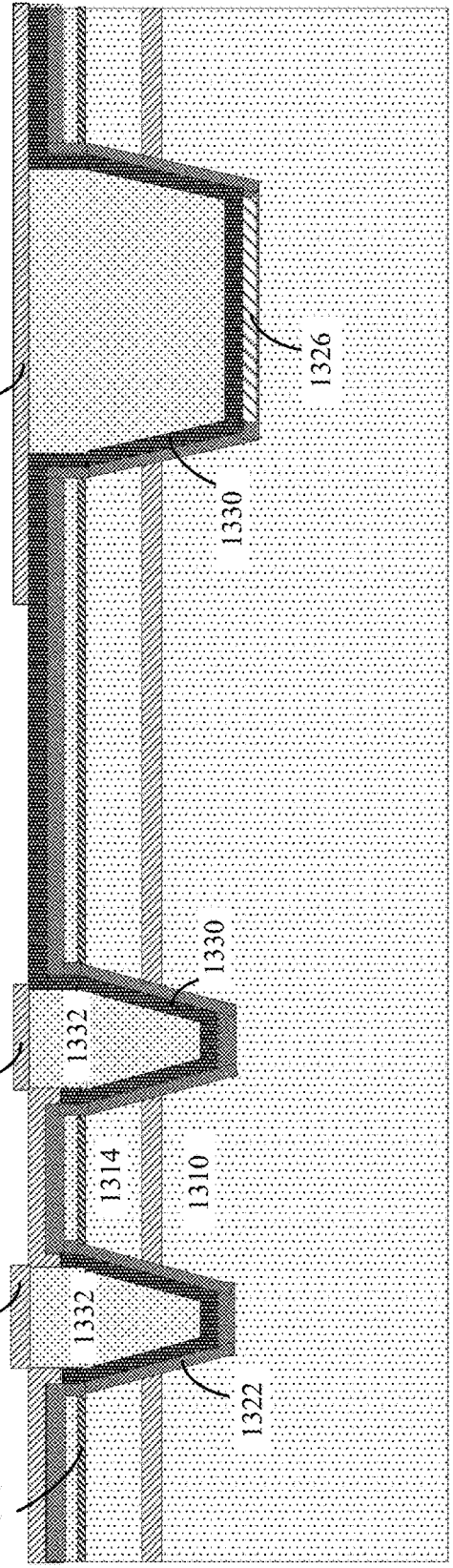

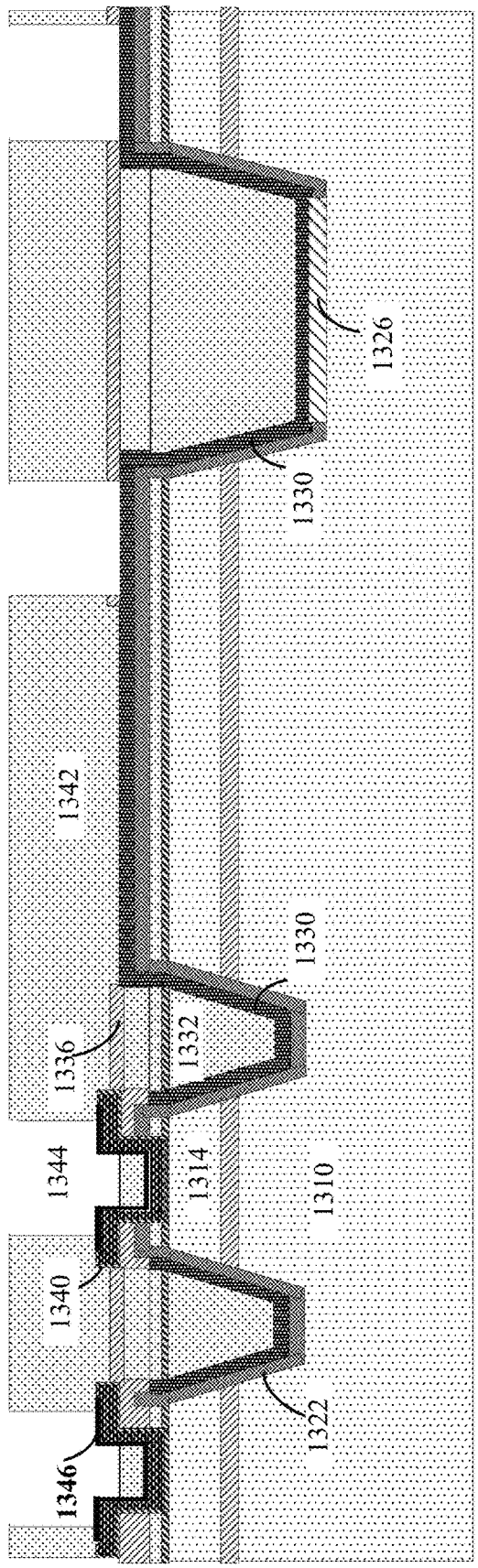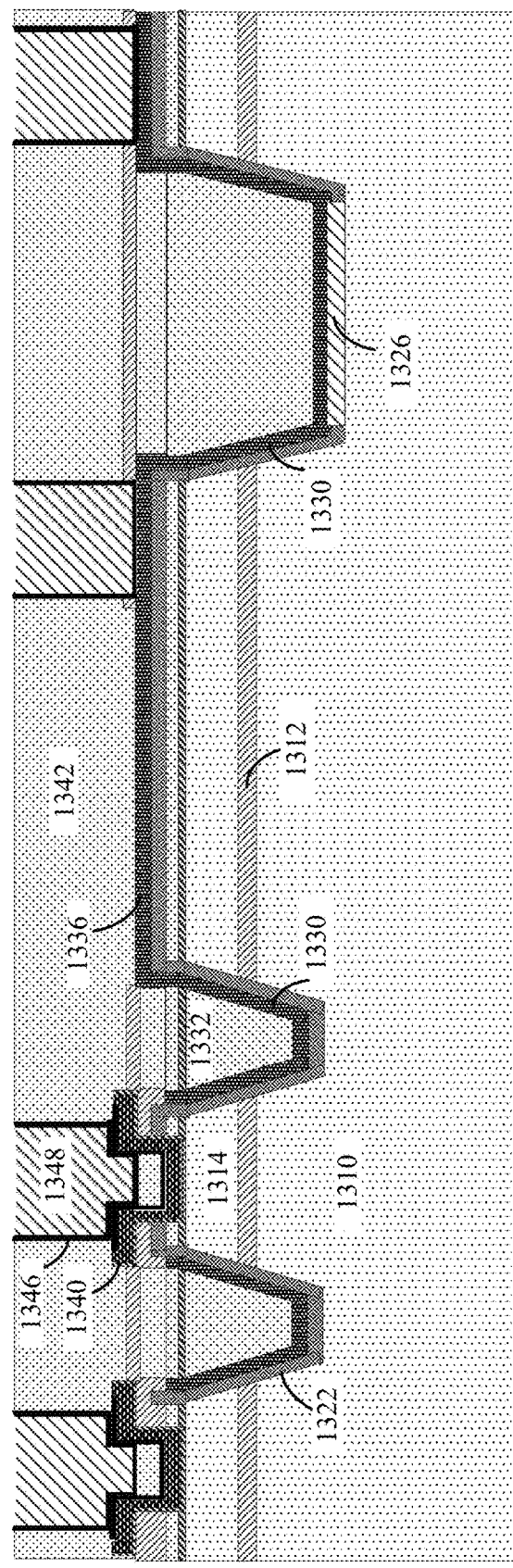
FIG. 13M
FIG. 13N

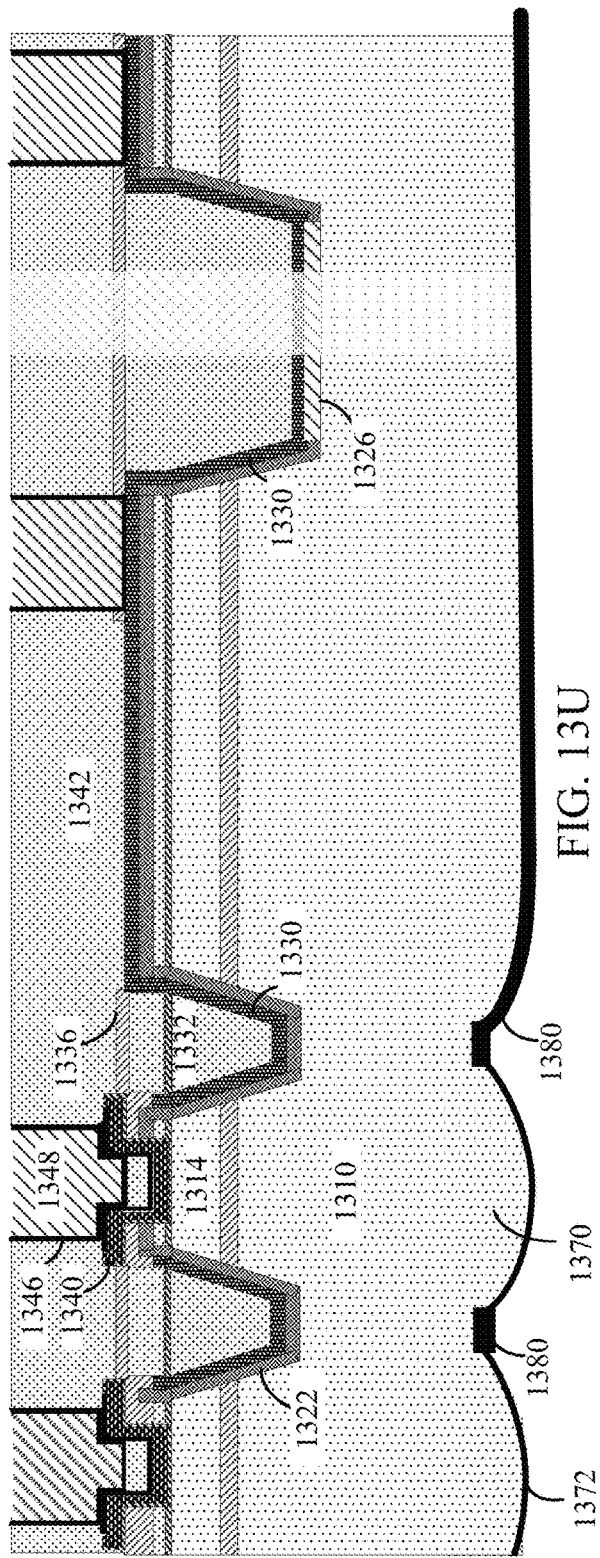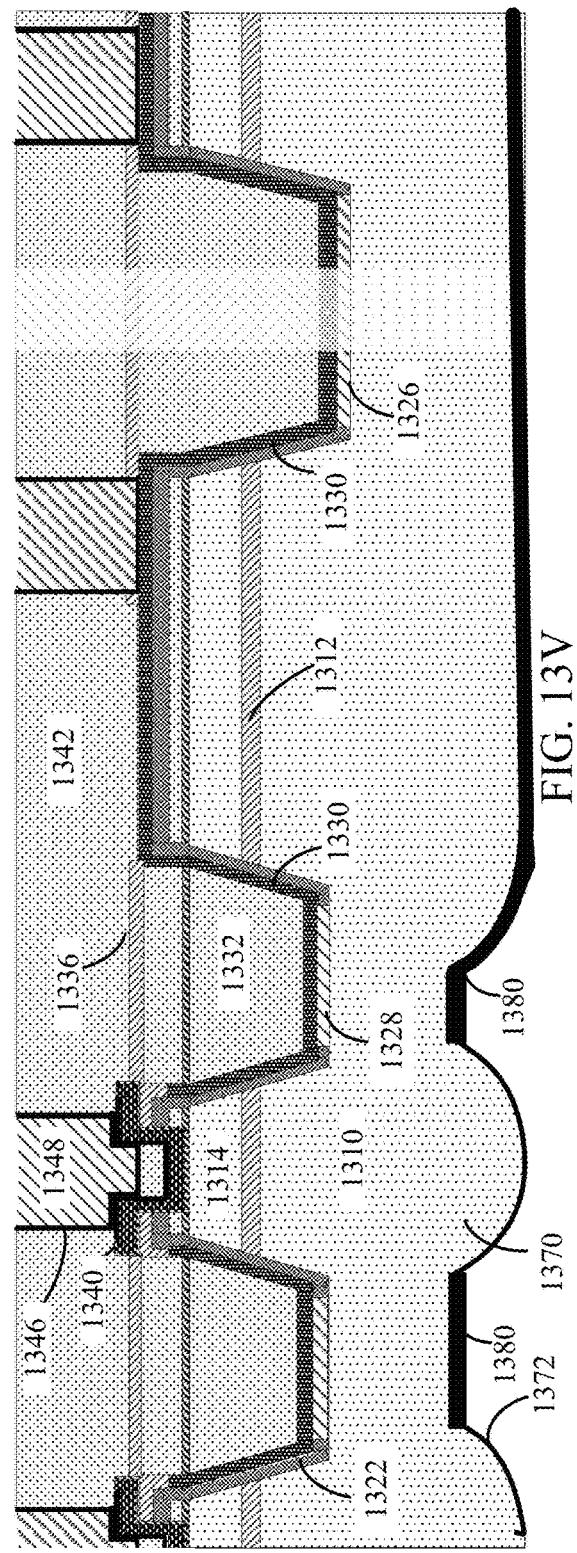
FIG. 13U
FIG. 13V

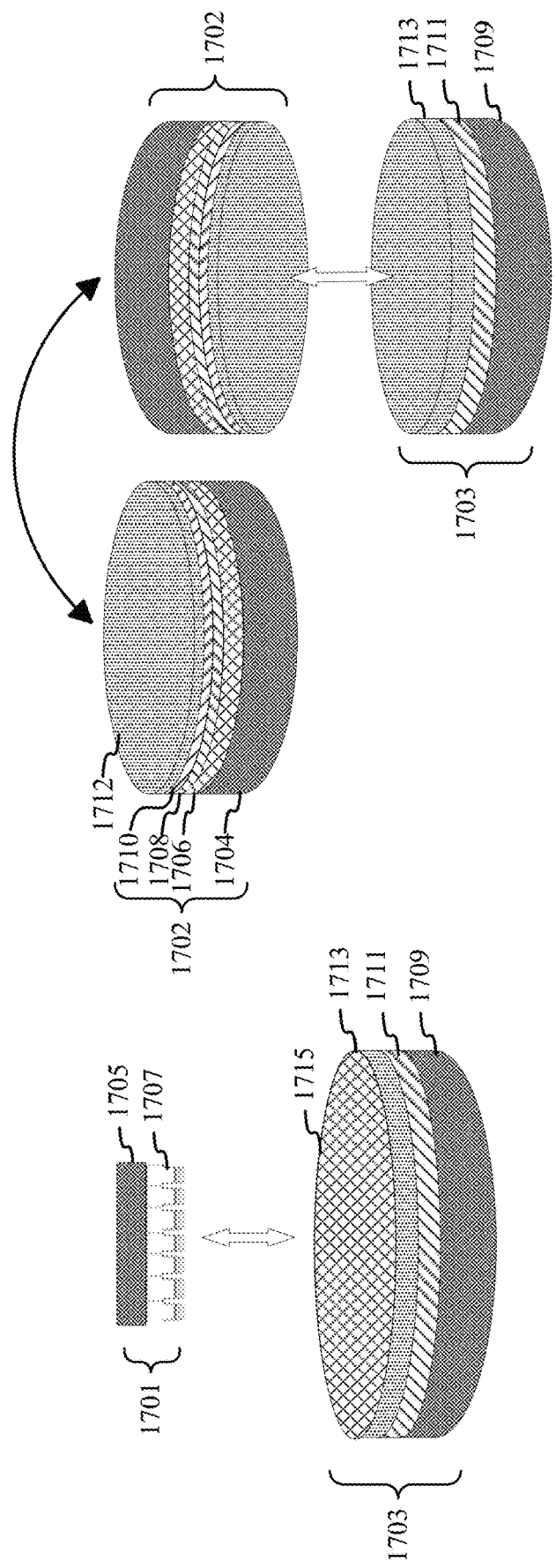

LOW RESISTANCE CURRENT SPREADING TO N-CONTACTS OF MICRO-LED ARRAY

CROSS-REFERENCE TO RELATED APPLICATIONS

This application claims the benefit of and priority to U.S. Provisional Application No. 63/119,412, filed Nov. 30, 2020, entitled "Low Resistance Current Spreading to n-contacts of Micro-LED Array," which is herein incorporated by reference in its entirety for all purposes.

BACKGROUND

Light emitting diodes (LEDs) convert electrical energy into optical energy, and offer many benefits over other light sources, such as reduced size, improved durability, and increased efficiency. LEDs can be used as light sources in many display systems, such as televisions, computer monitors, laptop computers, tablets, smartphones, projection systems, and wearable electronic devices. Micro-LEDs ("µLEDs") based on III-nitride semiconductors, such as alloys of AlN, GaN, InN, AlGaN, InSb, AlGaInP, other arsenide and phosphide alloys including GaInAsPN, AlGaInSb, AlGaInAsP, and the like, have begun to be developed for various display applications due to their small size (e.g., with a linear dimension less than 100 µm, less than 50 µm, less than 10 µm, or less than 5 µm), high packing density (and hence higher resolution), and high brightness. For example, micro-LEDs that emit light of different colors (e.g., red, green, and blue) can be used to form the sub-pixels of a display system, such as a television or a near-eye display system.

SUMMARY

This disclosure relates generally to micro light emitting diodes (micro-LEDs). More specifically, this disclosure relates to micro-LED arrays with low-resistance current paths. According to certain embodiments, a light source includes an epitaxial layer stack including an n-type semiconductor layer, a light-emitting layer, and a p-type semiconductor layer. The epitaxial layer stack includes a two-dimensional (2-D) array of mesa structures formed therein. The light source further includes an array of p-contacts electrically coupled to the p-type semiconductor layer in the 2-D array of mesa structures, a metal layer in regions surrounding individual mesa structures of the 2-D array of mesa structures, and a plurality of n-contacts coupling the metal layer to the n-type semiconductor layer at a plurality of locations between the individual mesa structures of the 2-D array of mesa structures.

The plurality of n-contacts and the array of p-contacts may be on a same side of the n-type semiconductor layer, or on opposite sides of the n-type semiconductor layer. In some embodiments, the light source may include an elongated n-contact at an area outside of the 2-D array of mesa structures, the elongated n-contact coupling the metal layer to the n-type semiconductor layer at the area outside of the 2-D array of mesa structures. In some embodiments, the light source may include an array of micro-lenses on a surface of the n-type semiconductor layer. The array of micro-lenses may be formed in the n-type semiconductor layer or a dielectric layer formed on the n-type semiconductor layer. In some embodiments, the metal layer is between individual micro-lenses of the array of micro-lenses. In some embodiments, the metal layer may be on sidewalls of the 2-D array of mesa structures and regions between the 2-D array of mesa structures. The light source may include a dielectric layer between the sidewalls of the 2-D array of mesa structures and the metal layer, where the dielectric layer and the metal layer form a sidewall reflector. In some embodiments, the light source may include a transparent conductive material layer between the array of p-contacts and the p-type semiconductor layer.

In some embodiments, the metal layer may be characterized by at least one of a thickness greater than 50 nm or a drive current density equal to or greater than 1 A/cm$^2$ at a drive voltage equal to or less than 4.5 V. The metal layer may include Al, Au, Ni, Ti, Pd, Ge, Ag, Cu, or any combination thereof. In some embodiments, each n-contact of the plurality of n-contacts is located at a center of a square region including four mesa structures. A pitch of the 2-D array of mesa structures may be equal to or less than 5 µm. Each mesa structure of the 2-D array of mesa structures may be characterized by a lateral linear dimension equal to or less than 3 µm. The light source may include a second metal layer on a surface of the n-type semiconductor layer, where the metal layer and the second metal layer are on opposite sides of the n-type semiconductor layer.

According to some embodiments, a display device may include a micro-LED array and a semiconductor substrate bonded to the micro-LED array, for example, by high-precision hybrid bonding. The micro-LED array may include an epitaxial layer stack including an n-type semiconductor layer, a light-emitting layer, and a p-type semiconductor layer, where a two-dimensional (2-D) array of mesa structures is formed in the epitaxial layer stack. The micro-LED array may also include an array of p-contacts electrically coupled to the p-type semiconductor layer in the 2-D array of mesa structures, a metal layer in regions surrounding individual mesa structures of the 2-D array of mesa structures, and a plurality of n-contacts coupling the metal layer to a first surface of the n-type semiconductor layer at a plurality of locations between the individual mesa structures of the 2-D array of mesa structures. The semiconductor substrate includes electrical circuits electrically coupled to the array of p-contacts and the plurality of n-contacts.

In some embodiments, the plurality of n-contacts and the array of p-contacts may be on a same side or on opposite sides of the n-type semiconductor layer. In some embodiments, each n-contact of the plurality of n-contacts is located at a center of a square region including four mesa structures. In some embodiments, the metal layer may be on at least a portion of sidewalls of the individual mesa structures of the 2-D array of mesa structures. In some embodiments, the display device may include an array of micro-lenses on the n-type semiconductor layer. The array of micro-lenses may be formed in the n-type semiconductor layer or a dielectric layer deposited on the n-type semiconductor layer. In some embodiments, the metal layer may be between individual micro-lenses of the array of micro-lenses. The metal layer may be characterized by at least one of a thickness greater than 50 nm or a drive current density equal to or greater than 1 A/cm$^2$ at a drive voltage equal to or less than 4.5 V. In some embodiments, a pitch of the 2-D array of mesa structures may be equal to or less than 5 µm. Each mesa structure of the 2-D array of mesa structures may be characterized by a lateral linear dimension equal to or less than 3 µm.

In some embodiments, the micro-LED array may include a second metal layer on a surface of the n-type semiconductor layer, where the metal layer and the second metal layer may be on opposite sides of the n-type semiconductor layer. In some embodiments, the micro-LED array may include metal pads in a first dielectric layer, where the metal pads are electrically coupled to the array of p-contacts and the plurality of n-contacts. The electrical circuits may include metal pads in a second dielectric layer. The metal pads of the electrical circuits may be bonded to the metal pads of the micro-LED array, and the first dielectric layer may be bonded to the second dielectric layer, for example, using high-precision hybrid bonding.

According to certain embodiments, a method may include fabricating a micro-LED array, fabricating electrical circuits on a semiconductor substrate, and bonding the micro-LED array to the semiconductor substrate, for example, using high-precision hybrid bonding. The micro-LED array may include an epitaxial layer stack including an n-type semiconductor layer, a light-emitting layer, and a p-type semiconductor layer. The epitaxial layer stack includes a two-dimensional (2-D) array of mesa structures formed therein. The micro-LED array may further include an array of p-contacts electrically coupled to the p-type semiconductor layer in the 2-D array of mesa structures, a metal layer in regions surrounding individual mesa structures of the 2-D array of mesa structures, and a plurality of n-contacts coupling the metal layer to the n-type semiconductor layer at a plurality of locations between the individual mesa structures of the 2-D array of mesa structures. The electrical circuits on the semiconductor substrate may be coupled to the array of p-contacts and the plurality of n-contacts.

In some embodiments, the method may include forming an array of micro-lenses on a surface of the n-type semiconductor layer. In some embodiments, the metal layer may be between individual micro-lenses of the array of micro-lenses. In some embodiments, the method may include forming a second metal layer on the n-type semiconductor layer, the metal layer and the second metal layer on opposite sides of the n-type semiconductor layer.

In some embodiments, bonding the micro-LED array to the semiconductor substrate may include activating a surface of the micro-LED array that includes a first dielectric layer and a first set of metal pads that is electrically coupled to the array of p-contacts and the plurality of n-contacts, activating a surface of the semiconductor substrate that includes a second dielectric layer and a second set of metal pads, bonding the first dielectric layer to the second dielectric layer at room temperature, and annealing the micro-LED array and the semiconductor substrate to bond the first set of metal pads to the second set of metal pads.

In some embodiments, fabricating the micro-LED array may include growing the epitaxial layer stack on a second substrate, etching the epitaxial layer stack to form the 2-D array of mesa structures in the epitaxial layer stack, depositing a first dielectric layer on surfaces of the 2-D array of mesa structures, forming the plurality of n-contacts at regions between mesa structures of the 2-D array of mesa structures, depositing the metal layer on the first dielectric layer and the plurality of n-contacts, patterning the metal layer, forming a patterned second dielectric layer on the metal layer, forming the array of p-contacts in the patterned second dielectric layer, forming a patterned third dielectric layer, and forming p-electrodes and n-electrodes in the patterned third dielectric layer, where the p-electrodes are connected to the array of p-contacts, and the n-electrodes are connected to the plurality of n-contacts.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

FIG. 4 illustrates an example of an optical see-through augmented reality system including a waveguide display according to certain embodiments.

FIGS. 8A and 8B illustrate an example of an array of micro-LEDs.

FIG. 17A illustrates an example of a method of die-to-wafer bonding for arrays of LEDs according to certain embodiments.

FIG. 17B illustrates an example of a method of wafer-to-wafer bonding for arrays of LEDs according to certain embodiments.

Figure 1:
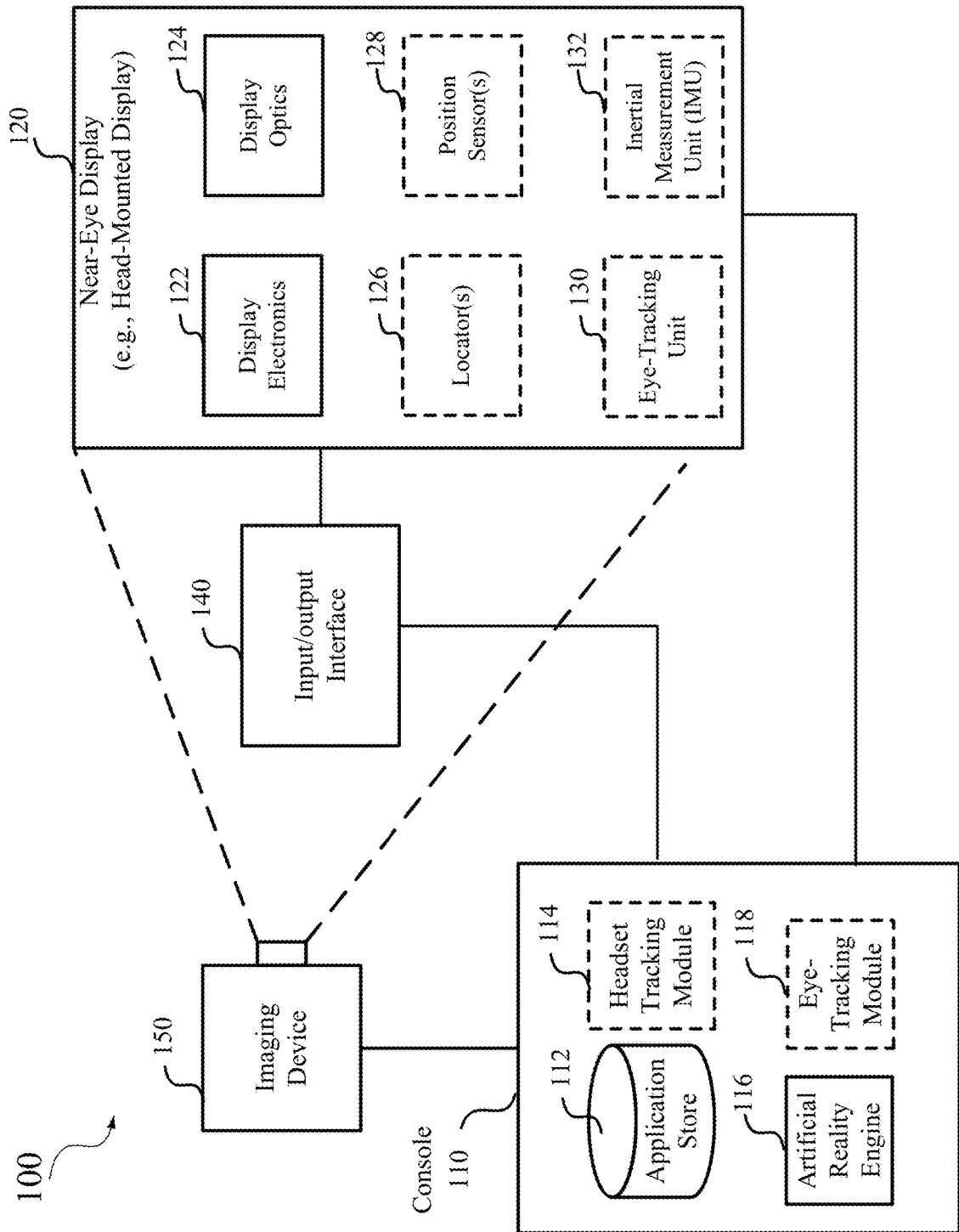
FIG. 1 is a simplified block diagram of an example of an artificial reality system environment including a near-eye display according to certain embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This disclosure relates generally to light emitting diodes (LEDs). More specifically, and without limitation, disclosed herein are micro-LED arrays with low-resistance current paths. Various inventive embodiments are described herein, including devices, systems, methods, materials, and the like.

In head-mounted displays or some other display systems, micro-LED arrays may be used to generate images that are then projected to user's eyes. A micro-LED array may include an array of micro-LEDs that may be individually addressable. Each micro-LED in the micro-LED array may have a respective p-contact (or n contact), but may share one or more common n-contacts (or p-contacts) with other micro-LEDs. Due to the small size (e.g., less than about 3 μm or 1 μm) and small pitch (e.g., less than about 5 μm or 3 μm) of the array of micro-LEDs, the common n-contacts may need to be farther away from some micro-LEDs than from other micro-LEDs in the array, such that the electrical signal path (and the resistance) between the p-contact of a micro-LED and an n-contact of the array of micro-LEDs may depend on the position of the micro-LED in an array. As such, different voltages may be needed to drive the micro-LEDs in order to achieve a same current density, or a calibration process may be needed because, when the driving voltage is the same, the current density may be different for micro-LEDs at different locations of the micro-LED array, and the current density difference may affect the uniformity of the displayed images.

According to certain embodiments, in order to reduce the variation in resistance and voltage drop between micro-LEDs at different locations of the micro-LED array, the micro-LED array may include individually addressable p-contacts for the respective micro-LEDs, a low-resistance current spreading layer (e.g., a metal layer such as an aluminum layer) coupled to a common n-electrode, and a plurality of n-contacts between the p-contacts and coupled to the low-resistance current spreading layer. As such, there may be one or more n-contacts adjacent to each micro-LED to provide a low resistance electrical path from the n-electrode, via the low-resistance current spreading layer and the plurality of n-contacts, to the n-type semiconductor layer of the mesa structure of the micro-LED. As such, the resistance from the n-electrode to the n-type semiconductor layer of each individual micro-LED may be low and more uniform. In some embodiments, a second metal current spreading layer may be formed on the light-emitting side of the n-type semiconductor layer, where the second metal current spreading layer may also absorb parasitic internal light in the n-type semiconductor layer and/or absorb external light to reduce external light reflection, thereby improving the contrast ratio between the micro-LEDs in the micro-LED array. Therefore, techniques disclosed herein can reduce the drive voltage, improve the efficiency and light emitting uniformity of the micro-LEDs, and improve the contrast ratio between the micro-LEDs in the micro-LED array.

The micro-LEDs described herein may be used in conjunction with various technologies, such as an artificial reality system. An artificial reality system, such as a head-mounted display (HMD) or heads-up display (HUD) system, generally includes a display configured to present artificial images that depict objects in a virtual environment. The display may present virtual objects or combine images of real objects with virtual objects, as in virtual reality (VR), augmented reality (AR), or mixed reality (MR) applications. For example, in an AR system, a user may view both displayed images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through). In some AR systems, the artificial images may be presented to users using an LED-based display subsystem.

As used herein, the term "light emitting diode (LED)" refers to a light source that includes at least an n-type semiconductor layer, a p-type semiconductor layer, and a light emitting region (i.e., active region) between the n-type semiconductor layer and the p-type semiconductor layer. The light emitting region may include one or more semiconductor layers that form one or more heterostructures, such as quantum wells. In some embodiments, the light emitting region may include multiple semiconductor layers that form one or more multiple-quantum-wells (MQWs), each including multiple (e.g., about 2 to 6) quantum wells.

As used herein, the term "micro-LED" or "μLED" refers to an LED that has a chip where a linear dimension of the chip is less than about 200 μm, such as less than 100 μm, less than 50 μm, less than 20 μm, less than 10 μm, or smaller. For example, the linear dimension of a micro-LED may be as small as 6 μm, 5 μm, 4 μm, 2 μm, or smaller. Some micro-LEDs may have a linear dimension (e.g., length or diameter) comparable to the minority carrier diffusion length. However, the disclosure herein is not limited to micro-LEDs, and may also be applied to mini-LEDs and large LEDs.

As used herein, the term "bonding" may refer to various methods for physically and/or electrically connecting two or more devices and/or wafers, such as adhesive bonding, metal-to-metal bonding, metal oxide bonding, wafer-towafer bonding, die-to-wafer bonding, hybrid bonding, soldering, under-bump metallization, and the like. For example, adhesive bonding may use a curable adhesive (e.g., an epoxy) to physically bond two or more devices and/or wafers through adhesion. Metal-to-metal bonding may include, for example, wire bonding or flip chip bonding using soldering interfaces (e.g., pads or balls), conductive adhesive, or welded joints between metals. Metal oxide bonding may form a metal and oxide pattern on each surface, bond the oxide sections together, and then bond the metal sections together to create a conductive path. Wafer-to-wafer bonding may bond two wafers (e.g., silicon wafers or other semiconductor wafers) without any intermediate layers and is based on chemical bonds between the surfaces of the two wafers. Wafer-to-wafer bonding may include wafer cleaning and other preprocessing, aligning and pre-bonding at room temperature, and annealing at elevated temperatures, such as about 250° C. or higher. Die-to-wafer bonding may use bumps on one wafer to align features of a pre-formed chip with drivers of a wafer. Hybrid bonding may include, for example, wafer cleaning, high-precision alignment of contacts of one wafer with contacts of another wafer, dielectric bonding of dielectric materials within the wafers at room temperature, and metal bonding of the contacts by annealing at, for example, 250-300° C. or higher. As used herein, the term "bump" may refer generically to a metal interconnect used or formed during bonding.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1 is a simplified block diagram of an example of an artificial reality system environment 100 including a near-eye display 120 in accordance with certain embodiments. Artificial reality system environment 100 shown in FIG. 1 may include near-eye display 120, an optional external imaging device 150, and an optional input/output interface 140, each of which may be coupled to an optional console 110. While FIG. 1 shows an example of artificial reality system environment 100 including one near-eye display 120, one external imaging device 150, and one input/output interface 140, any number of these components may be included in artificial reality system environment 100, or any of the components may be omitted. For example, there may be multiple near-eye displays 120 monitored by one or more external imaging devices 150 in communication with console 110. In some configurations, artificial reality system environment 100 may not include external imaging device 150, optional input/output interface 140, and optional console 110. In alternative configurations, different or additional components may be included in artificial reality system environment 100.

Near-eye display 120 may be a head-mounted display that presents content to a user. Examples of content presented by near-eye display 120 include one or more of images, videos, audio, or any combination thereof. In some embodiments, audio may be presented via an external device (e.g., speakers and/or headphones) that receives audio information from near-eye display 120, console 110, or both, and presents audio data based on the audio information. Near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 120 may be implemented in any suitable form-factor, including a pair of glasses. Some embodiments of near-eye display 120 are further described below with respect to FIGS. 2 and 3. Additionally, in various embodiments, the functionality described herein may be used in a headset that combines images of an environment external to near-eye display 120 and artificial reality content (e.g., computer-generated images). Therefore, near-eye display 120 may augment images of a physical, real-world environment external to near-eye display 120 with generated content (e.g., images, video, sound, etc.) to present an augmented reality to a user.

In various embodiments, near-eye display 120 may include one or more of display electronics 122, display optics 124, and an eye-tracking unit 130. In some embodiments, near-eye display 120 may also include one or more locators 126, one or more position sensors 128, and an inertial measurement unit (IMU) 132. Near-eye display 120 may omit any of eye-tracking unit 130, locators 126, position sensors 128, and IMU 132, or include additional elements in various embodiments. Additionally, in some embodiments, near-eye display 120 may include elements combining the function of various elements described in conjunction with FIG. 1.

Display electronics 122 may display or facilitate the display of images to the user according to data received from, for example, console 110. In various embodiments, display electronics 122 may include one or more display panels, such as a liquid crystal display (LCD), an organic light emitting diode (OLED) display, an inorganic light emitting diode (ILED) display, a micro light emitting diode (µLED) display, an active-matrix OLED display (AMO-LED), a transparent OLED display (TOLED), or some other display. For example, in one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include pixels to emit light of a predominant color such as red, green, blue, white, or yellow. In some implementations, display electronics 122 may display a three-dimensional (3D) image through stereoscopic effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 124 may display image content optically (e.g., using optical waveguides and couplers) or magnify image light received from display electronics 122, correct optical errors associated with the image light, and present the corrected image light to a user of near-eye display 120. In various embodiments, display optics 124 may include one or more optical elements, such as, for example, a substrate, optical waveguides, an aperture, a Fresnel lens, a convex lens, a concave lens, a filter, input/output couplers, or any other suitable optical elements that may affect image light emitted from display electronics 122. Display optics 124 may include a combination of different optical elements as well as mechanical couplings to maintain relative spacing and orientation of the optical elements in the combination. One or more optical elements in display optics 124 may have an optical coating, such as an anti-reflective coating, a reflective coating, a filtering coating, or a combination of different optical coatings.

Magnification of the image light by display optics 124 may allow display electronics 122 to be physically smaller, weigh less, and consume less power than larger displays. Additionally, magnification may increase a field of view of the displayed content. The amount of magnification of image light by display optics 124 may be changed by adjusting, adding, or removing optical elements from display optics 124. In some embodiments, display optics 124 may project displayed images to one or more image planes that may be further away from the user's eyes than near-eye display 120.

Display optics 124 may also be designed to correct one or more types of optical errors, such as two-dimensional optical errors, three-dimensional optical errors, or any combination thereof. Two-dimensional errors may include optical aberrations that occur in two dimensions. Example types of two-dimensional errors may include barrel distortion, pincushion distortion, longitudinal chromatic aberration, and transverse chromatic aberration. Three-dimensional errors may include optical errors that occur in three dimensions. Example types of three-dimensional errors may include spherical aberration, comatic aberration, field curvature, and astigmatism.

Locators 126 may be objects located in specific positions on near-eye display 120 relative to one another and relative to a reference point on near-eye display 120. In some implementations, console 110 may identify locators 126 in images captured by external imaging device 150 to determine the artificial reality headset's position, orientation, or both. A locator 126 may be an LED, a corner cube reflector, a reflective marker, a type of light source that contrasts with an environment in which near-eye display 120 operates, or any combination thereof. In embodiments where locators 126 are active components (e.g., LEDs or other types of light emitting devices), locators 126 may emit light in the visible band (e.g., about 380 nm to 750 nm), in the infrared (IR) band (e.g., about 750 nm to 1 mm), in the ultraviolet band (e.g., about 10 nm to about 380 nm), in another portion of the electromagnetic spectrum, or in any combination of portions of the electromagnetic spectrum.

External imaging device 150 may include one or more cameras, one or more video cameras, any other device capable of capturing images including one or more of locators 126, or any combination thereof. Additionally, external imaging device 150 may include one or more filters (e.g., to increase signal to noise ratio). External imaging device 150 may be configured to detect light emitted or reflected from locators 126 in a field of view of external imaging device 150. In embodiments where locators 126 include passive elements (e.g., retroreflectors), external imaging device 150 may include a light source that illuminates some or all of locators 126, which may retro-reflect the light to the light source in external imaging device 150. Slow calibration data may be communicated from external imaging device 150 to console 110, and external imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 may include accelerometers, gyroscopes, magnetometers, other motion-detecting or error-correcting sensors, or any combination thereof. For example, in some embodiments, position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IMU 132 may be an electronic device that generates fast calibration data based on measurement signals received from one or more of position sensors 128. Position sensors 128 may be located external to IMU 132, internal to IMU 132, or any combination thereof. Based on the one or more measurement signals from one or more position sensors 128, IMU 132 may generate fast calibration data indicating an estimated position of near-eye display 120 relative to an initial position of near-eye display 120. For example, IMU 132 may integrate measurement signals received from accelerometers over time to estimate a velocity vector and integrate the velocity vector over time to determine an estimated position of a reference point on near-eye display 120. Alternatively, IMU 132 may provide the sampled measurement signals to console 110, which may determine the fast calibration data. While the reference point may generally be defined as a point in space, in various embodiments, the reference point may also be defined as a point within near-eye display 120 (e.g., a center of IMU 132).

Eye-tracking unit 130 may include one or more eye-tracking systems. Eye tracking may refer to determining an eye's position, including orientation and location of the eye, relative to near-eye display 120. An eye-tracking system may include an imaging system to image one or more eyes and may optionally include a light emitter, which may generate light that is directed to an eye such that light reflected by the eye may be captured by the imaging system. For example, eye-tracking unit 130 may include a non-coherent or coherent light source (e.g., a laser diode) emitting light in the visible spectrum or infrared spectrum, and a camera capturing the light reflected by the user's eye. As another example, eye-tracking unit 130 may capture reflected radio waves emitted by a miniature radar unit. Eye-tracking unit 130 may use low-power light emitters that emit light at frequencies and intensities that would not injure the eye or cause physical discomfort. Eye-tracking unit 130 may be arranged to increase contrast in images of an eye captured by eye-tracking unit 130 while reducing the overall power consumed by eye-tracking unit 130 (e.g., reducing power consumed by a light emitter and an imaging system included in eye-tracking unit 130). For example, in some implementations, eye-tracking unit 130 may consume less than 100 milliwatts of power.

Near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or any combination thereof. Because the orientation may be determined for both eyes of the user, eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect. The direction of the user's gaze may be the direction of a line passing through the point of convergence and the mid-point between the pupils of the user's eyes.

Input/output interface 140 may be a device that allows a user to send action requests to console 110. An action request may be a request to perform a particular action. For example, an action request may be to start or to end an application or to perform a particular action within the application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. For example, input/output interface 140 may provide haptic feedback when an action request is received, or when console 110 has performed a requested action and communicates instructions to input/output interface 140. In some embodiments, external imaging device 150 may be used to track input/output interface 140, such as tracking the location or position of a controller (which may include, for example, an IR light source) or a hand of the user to determine the motion of the user. In some embodiments, near-eye display 120 may include one or more imaging devices to track input/output interface 140, such as tracking the location or position of a controller or a hand of the user to determine the motion of the user.

Console 110 may provide content to near-eye display 120 for presentation to the user in accordance with information received from one or more of external imaging device 150, near-eye display 120, and input/output interface 140. In the example shown in FIG. 1, console 110 may include an application store 112, a headset tracking module 114, an artificial reality engine 116, and an eye-tracking module 118. Some embodiments of console 110 may include different or additional modules than those described in conjunction with FIG. 1. Functions further described below may be distributed among components of console 110 in a different manner than is described here.

In some embodiments, console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In various embodiments, the modules of console 110 described in conjunction with FIG. 1 may be encoded as instructions in the non-transitory computer-readable storage medium that, when executed by the processor, cause the processor to perform the functions further described below.

Application store 112 may store one or more applications for execution by console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback application, or other suitable applications.

Headset tracking module 114 may track movements of near-eye display 120 using slow calibration information from external imaging device 150. For example, headset tracking module 114 may determine positions of a reference point of near-eye display 120 using observed locators from the slow calibration information and a model of near-eye display 120. Headset tracking module 114 may also determine positions of a reference point of near-eye display 120 using position information from the fast calibration information. Additionally, in some embodiments, headset tracking module 114 may use portions of the fast calibration information, the slow calibration information, or any combination thereof, to predict a future location of near-eye display 120. Headset tracking module 114 may provide the estimated or predicted future position of near-eye display 120 to artificial reality engine 116.

Artificial reality engine 116 may execute applications within artificial reality system environment 100 and receive position information of near-eye display 120, acceleration information of near-eye display 120, velocity information of near-eye display 120, predicted future positions of near-eye display 120, or any combination thereof from headset tracking module 114. Artificial reality engine 116 may also receive estimated eye position and orientation information from eye-tracking module 118. Based on the received information, artificial reality engine 116 may determine content to provide to near-eye display 120 for presentation to the user. For example, if the received information indicates that the user has looked to the left, artificial reality engine 116 may generate content for near-eye display 120 that mirrors the user's eye movement in a virtual environment. Additionally, artificial reality engine 116 may perform an action within an application executing on console 110 in response to an action request received from input/output interface 140, and provide feedback to the user indicating that the action has been performed. The feedback may be visual or audible feedback via near-eye display 120 or haptic feedback via input/output interface 140.

Eye-tracking module 118 may receive eye-tracking data from eye-tracking unit 130 and determine the position of the user's eye based on the eye tracking data. The position of the eye may include an eye's orientation, location, or both relative to near-eye display 120 or any element thereof. Because the eye's axes of rotation change as a function of the eye's location in its socket, determining the eye's location in its socket may allow eye-tracking module 118 to more accurately determine the eye's orientation.

Figure 2:
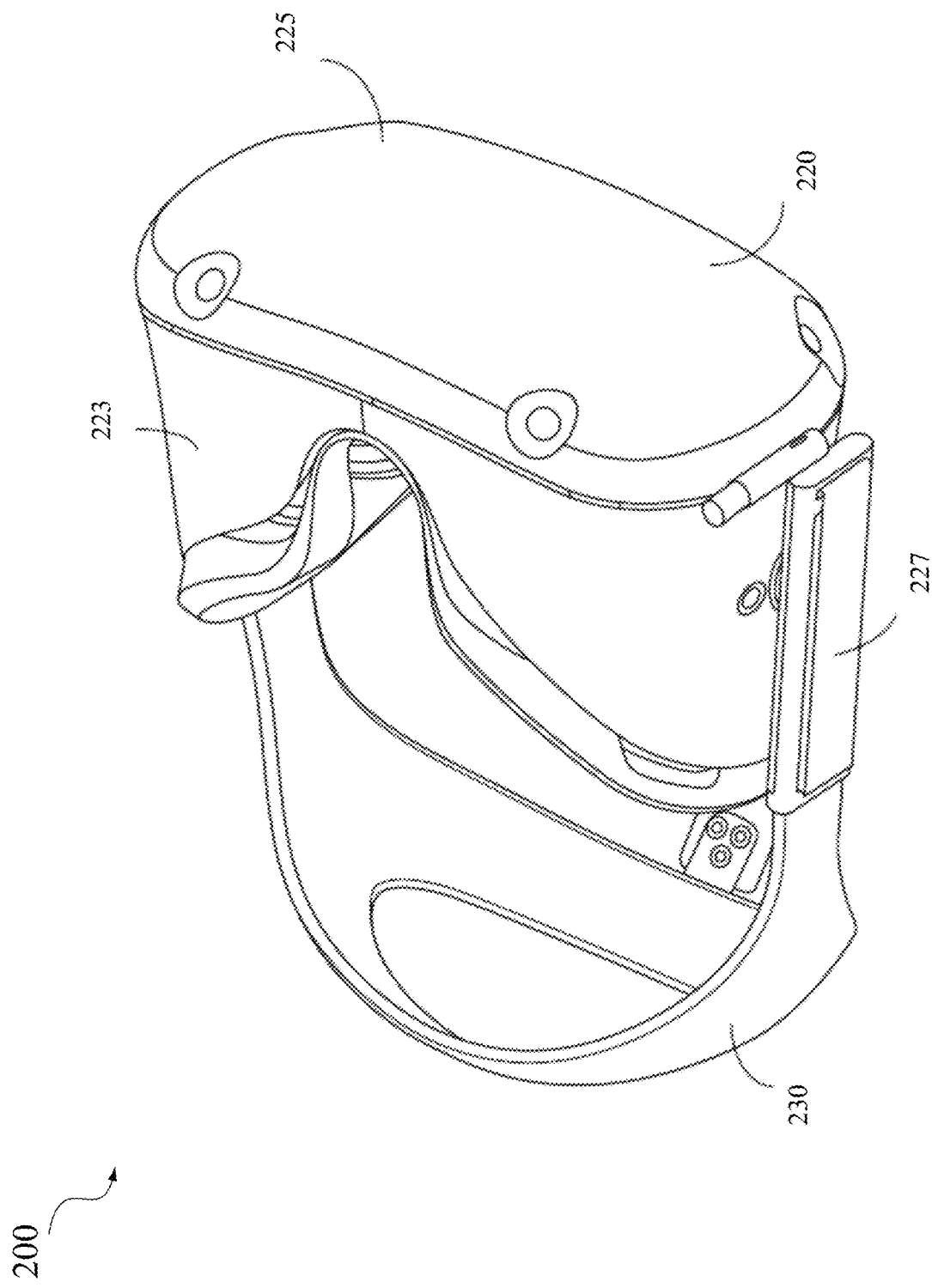
FIG. 2 is a perspective view of an example of a near-eye display in the form of a head-mounted display (HMD) device for implementing some of the examples disclosed herein.

FIG. 2 is a perspective view of an example of a near-eye display in the form of an HMD device 200 for implementing some of the examples disclosed herein. HMD device 200 may be a part of, e.g., a VR system, an AR system, an MR system, or any combination thereof. HMD device 200 may include a body 220 and a head strap 230. FIG. 2 shows a bottom side 223, a front side 225, and a left side 227 of body 220 in the perspective view. Head strap 230 may have an adjustable or extendible length. There may be a sufficient space between body 220 and head strap 230 of HMD device 200 for allowing a user to mount HMD device 200 onto the user's head. In various embodiments, HMD device 200 may include additional, fewer, or different components. For example, in some embodiments, HMD device 200 may include eyeglass temples and temple tips as shown in, for example, FIG. 3 below, rather than head strap 230.

HMD device 200 may present to a user media including virtual and/or augmented views of a physical, real-world environment with computer-generated elements. Examples of the media presented by HMD device 200 may include images (e.g., two-dimensional (2D) or three-dimensional (3D) images), videos (e.g., 2D or 3D videos), audio, or any combination thereof. The images and videos may be presented to each eye of the user by one or more display assemblies (not shown in FIG. 2) enclosed in body 220 of HMD device 200. In various embodiments, the one or more display assemblies may include a single electronic display panel or multiple electronic display panels (e.g., one display panel for each eye of the user). Examples of the electronic display panel(s) may include, for example, an LCD, an OLED display, an ILED display, a μLED display, an AMO-LED, a TOLED, some other display, or any combination thereof. HMD device 200 may include two eye box regions.

In some implementations, HMD device 200 may include various sensors (not shown), such as depth sensors, motion sensors, position sensors, and eye tracking sensors. Some of these sensors may use a structured light pattern for sensing. In some implementations, HMD device 200 may include an input/output interface for communicating with a console. In some implementations, HMD device 200 may include a virtual reality engine (not shown) that can execute applications within HMD device 200 and receive depth information, position information, acceleration information, velocity information, predicted future positions, or any combination thereof of HMD device 200 from the various sensors. In some implementations, the information received by the virtual reality engine may be used for producing a signal (e.g., display instructions) to the one or more display assemblies. In some implementations, HMD device 200 may include locators (not shown, such as locators 126) located in fixed positions on body 220 relative to one another and relative to a reference point. Each of the locators may emit light that is detectable by an external imaging device.

Figure 3:
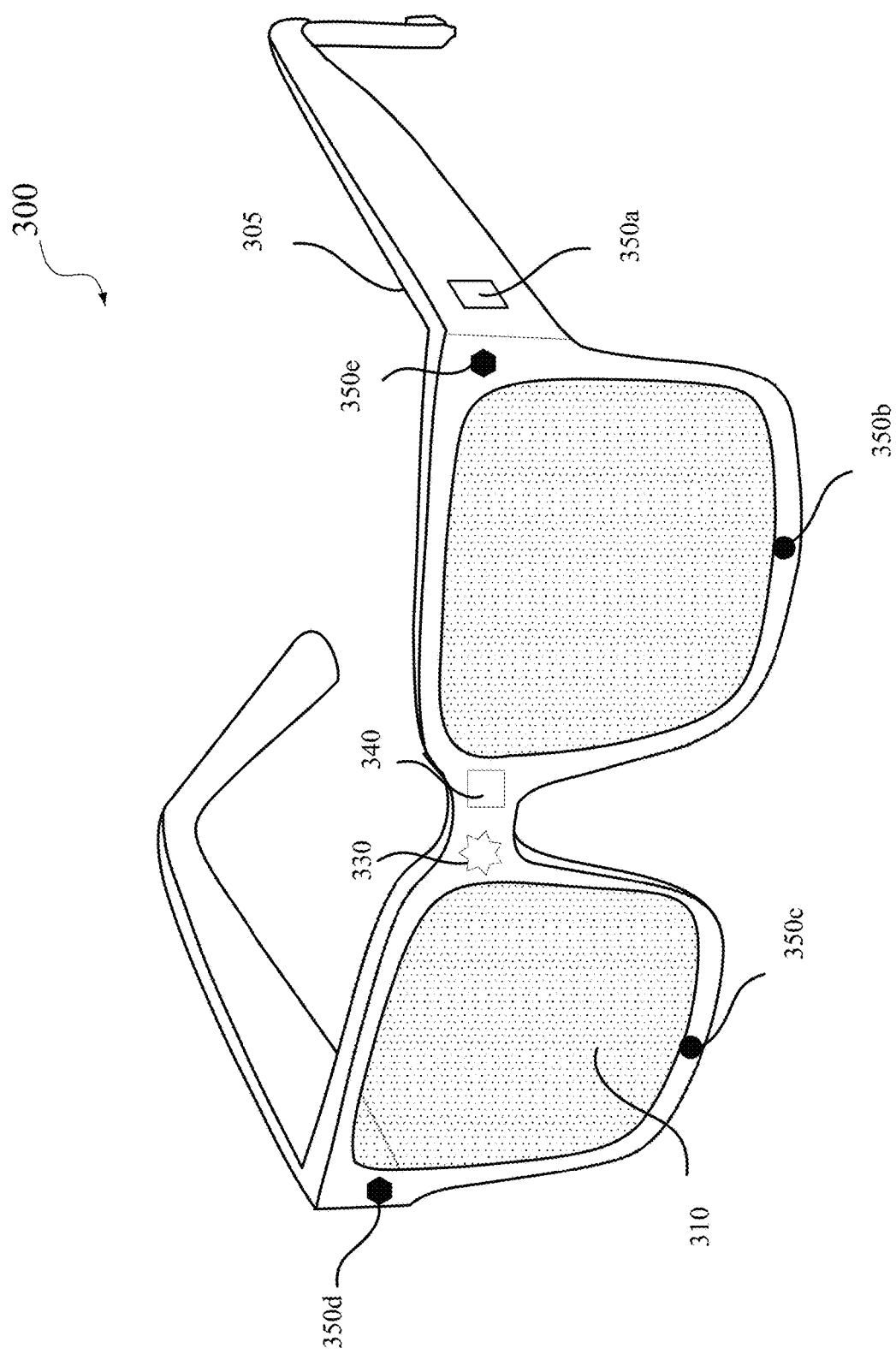
FIG. 3 is a perspective view of an example of a near-eye display in the form of a pair of glasses for implementing some of the examples disclosed herein.

FIG. 3 is a perspective view of an example of a near-eye display 300 in the form of a pair of glasses for implementing some of the examples disclosed herein. Near-eye display 300 may be a specific implementation of near-eye display 120 of FIG. 1, and may be configured to operate as a virtual reality display, an augmented reality display, and/or a mixed reality display. Near-eye display 300 may include a frame 305 and a display 310. Display 310 may be configured to present content to a user. In some embodiments, display 310 may include display electronics and/or display optics. For example, as described above with respect to near-eye display 120 of FIG. 1, display 310 may include an LCD display panel, an LED display panel, or an optical display panel (e.g., a waveguide display assembly).

Near-eye display 300 may further include various sensors 350a, 350b, 350c, 350d, and 350e on or within frame 305. In some embodiments, sensors 350a-350e may include one or more depth sensors, motion sensors, position sensors, inertial sensors, or ambient light sensors. In some embodiments, sensors 350a-350e may include one or more image sensors configured to generate image data representing different fields of views in different directions. In some embodiments, sensors 350a-350e may be used as input devices to control or influence the displayed content of near-eye display 300, and/or to provide an interactive VR/AR/MR experience to a user of near-eye display 300. In some embodiments, sensors 350a-350e may also be used for stereoscopic imaging.

In some embodiments, near-eye display 300 may further include one or more illuminators 330 to project light into the physical environment. The projected light may be associated with different frequency bands (e.g., visible light, infra-red light, ultra-violet light, etc.), and may serve various purposes. For example, illuminator(s) 330 may project light in a dark environment (or in an environment with low intensity of infra-red light, ultra-violet light, etc.) to assist sensors 350a-350e in capturing images of different objects within the dark environment. In some embodiments, illuminator(s) 330 may be used to project certain light patterns onto the objects within the environment. In some embodiments, illuminator(s) 330 may be used as locators, such as locators 126 described above with respect to FIG. 1.

In some embodiments, near-eye display 300 may also include a high-resolution camera 340. Camera 340 may capture images of the physical environment in the field of view. The captured images may be processed, for example, by a virtual reality engine (e.g., artificial reality engine 116 of FIG. 1) to add virtual objects to the captured images or modify physical objects in the captured images, and the processed images may be displayed to the user by display 310 for AR or MR applications.

FIG. 4 illustrates an example of an optical see-through augmented reality system 400 including a waveguide display according to certain embodiments. Augmented reality system 400 may include a projector 410 and a combiner 415. Projector 410 may include a light source or image source 412 and projector optics 414. In some embodiments, light source or image source 412 may include one or more micro-LED devices described above. In some embodiments, image source 412 may include a plurality of pixels that displays virtual objects, such as an LCD display panel or an LED display panel. In some embodiments, image source 412 may include a light source that generates coherent or partially coherent light. For example, image source 412 may include a laser diode, a vertical cavity surface emitting laser, an LED, and/or a micro-LED described above. In some embodiments, image source 412 may include a plurality of light sources (e.g., an array of micro-LEDs described above), each emitting a monochromatic image light corresponding to a primary color (e.g., red, green, or blue). In some embodiments, image source 412 may include three two-dimensional arrays of micro-LEDs, where each two-dimensional array of micro-LEDs may include micro-LEDs configured to emit light of a primary color (e.g., red, green, or blue). In some embodiments, image source 412 may include an optical pattern generator, such as a spatial light modulator. Projector optics 414 may include one or more optical components that can condition the light from image source 412, such as expanding, collimating, scanning, or projecting light from image source 412 to combiner 415. The one or more optical components may include, for example, one or more lenses, liquid lenses, mirrors, apertures, and/or gratings. For example, in some embodiments, image source 412 may include one or more one-dimensional arrays or elongated two-dimensional arrays of micro-LEDs, and projector optics 414 may include one or more one-dimensional scanners (e.g., micro-mirrors or prisms) configured to scan the one-dimensional arrays or elongated two-dimensional arrays of micro-LEDs to generate image frames. In some embodiments, projector optics 414 may include a liquid lens (e.g., a liquid crystal lens) with a plurality of electrodes that allows scanning of the light from image source 412.

Combiner 415 may include an input coupler 430 for coupling light from projector 410 into a substrate 420 of combiner 415. Combiner 415 may transmit at least 50% of light in a first wavelength range and reflect at least 25% of light in a second wavelength range. For example, the first wavelength range may be visible light from about 400 nm to about 650 nm, and the second wavelength range may be in the infrared band, for example, from about 800 nm to about 1000 nm. Input coupler 430 may include a volume holographic grating, a diffractive optical element (DOE) (e.g., a surface-relief grating), a slanted surface of substrate 420, or a refractive coupler (e.g., a wedge or a prism). For example, input coupler 430 may include a reflective volume Bragg grating or a transmissive volume Bragg grating. Input coupler 430 may have a coupling efficiency of greater than 30%, 50%, 75%, 90%, or higher for visible light. Light coupled into substrate 420 may propagate within substrate 420 through, for example, total internal reflection (TIR). Substrate 420 may be in the form of a lens of a pair of eyeglasses. Substrate 420 may have a flat or a curved surface, and may include one or more types of dielectric materials, such as glass, quartz, plastic, polymer, poly(methyl methacrylate) (PMMA), crystal, or ceramic. A thickness of the substrate may range from, for example, less than about 1 mm to about 10 mm or more. Substrate 420 may be transparent to visible light.

Substrate 420 may include or may be coupled to a plurality of output couplers 440, each configured to extract at least a portion of the light guided by and propagating within substrate 420 from substrate 420, and direct extracted light 460 to an eyebox 495 where an eye 490 of the user of augmented reality system 400 may be located when augmented reality system 400 is in use. The plurality of output couplers 440 may replicate the exit pupil to increase the size of eyebox 495 such that the displayed image is visible in a larger area. As input coupler 430, output couplers 440 may include grating couplers (e.g., volume holographic gratings or surface-relief gratings), other diffraction optical elements (DOEs), prisms, etc. For example, output couplers 440 may include reflective volume Bragg gratings or transmissive volume Bragg gratings. Output couplers 440 may have different coupling (e.g., diffraction) efficiencies at different locations. Substrate 420 may also allow light 450 from the environment in front of combiner 415 to pass through with little or no loss. Output couplers 440 may also allow light 450 to pass through with little loss. For example, in some implementations, output couplers 440 may have a very low diffraction efficiency for light 450 such that light 450 may be refracted or otherwise pass through output couplers 440 with little loss, and thus may have a higher intensity than extracted light 460. In some implementations, output couplers 440 may have a high diffraction efficiency for light 450 and may diffract light 450 in certain desired directions (i.e., diffraction angles) with little loss. As a result, the user may be able to view combined images of the environment in front of combiner 415 and images of virtual objects projected by projector 410.

Figure 5B:
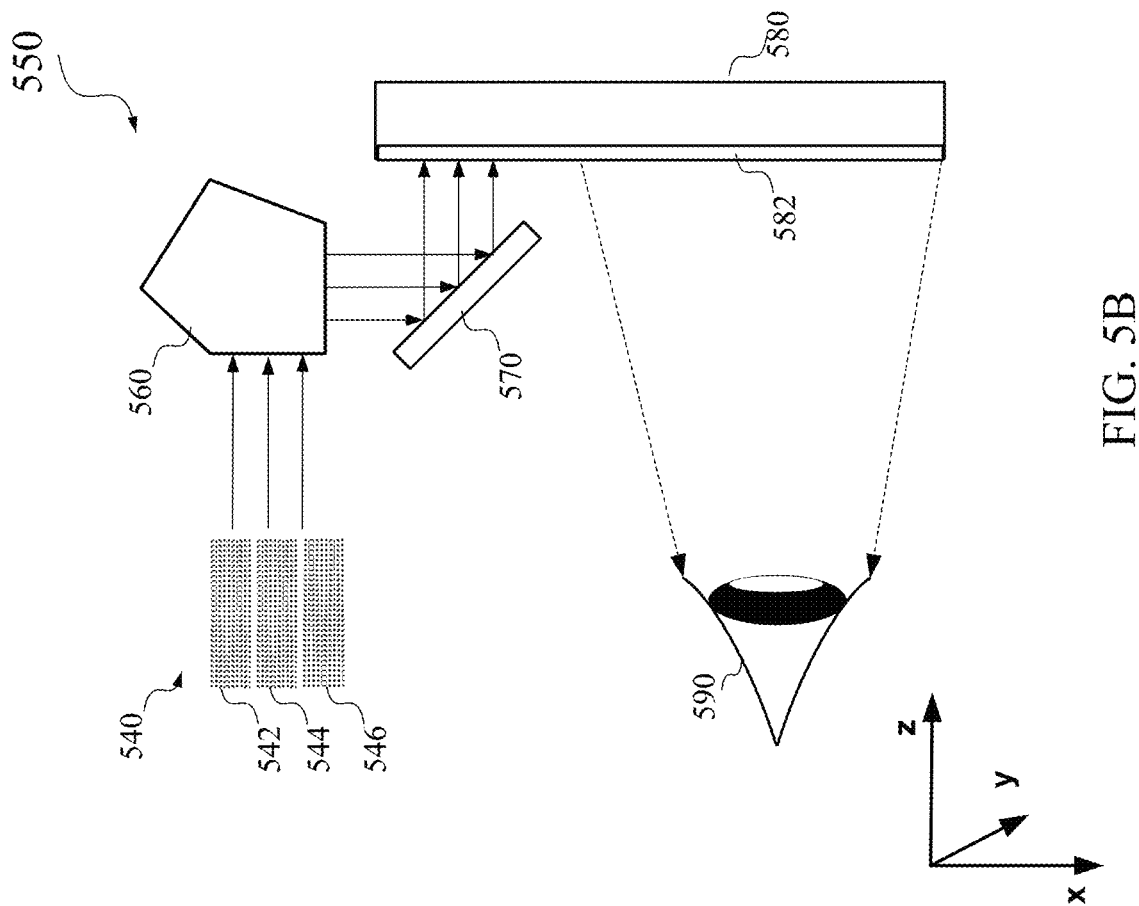
FIG. 5B illustrates an example of a near-eye display device including a waveguide display according to certain embodiments.
Figure 5A:
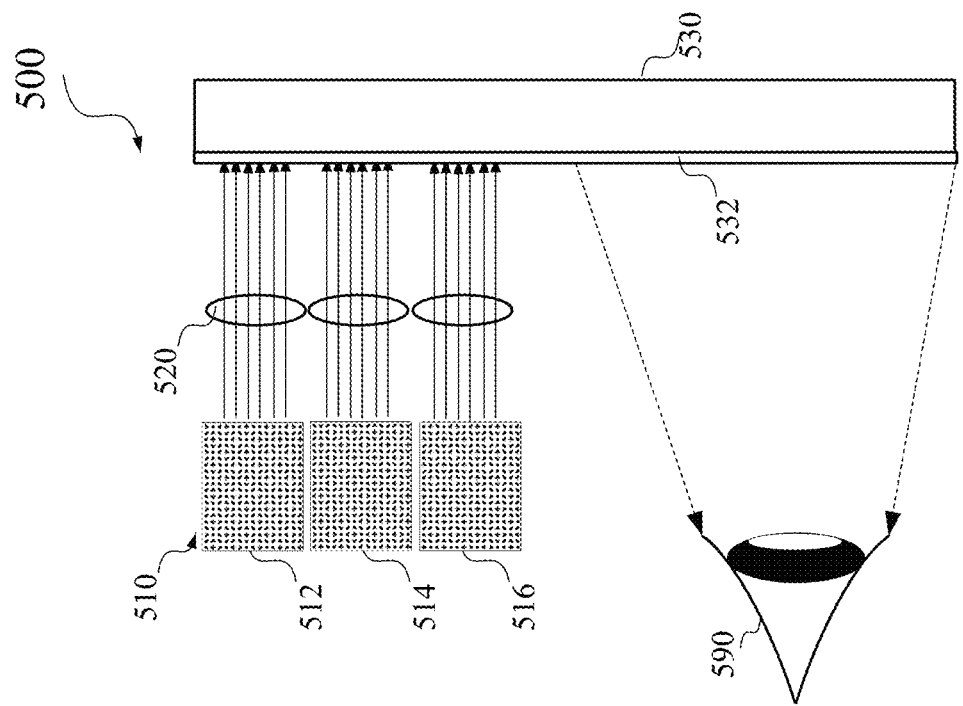
FIG. 5A illustrates an example of a near-eye display device including a waveguide display according to certain embodiments.

FIG. 5A illustrates an example of a near-eye display (NED) device 500 including a waveguide display 530 according to certain embodiments. NED device 500 may be an example of near-eye display 120, augmented reality system 400, or another type of display device. NED device 500 may include a light source 510, projection optics 520, and waveguide display 530. Light source 510 may include multiple panels of light emitters for different colors, such as a panel of red light emitters 512, a panel of green light emitters 514, and a panel of blue light emitters 516. The red light emitters 512 are organized into an array; the green light emitters 514 are organized into an array; and the blue light emitters 516 are organized into an array. The dimensions and pitches of light emitters in light source 510 may be small. For example, each light emitter may have a diameter less than 2 µm (e.g., about 1.2 µm) and the pitch may be less than 2 µm (e.g., about 1.5 µm). As such, the number of light emitters in each red light emitters 512, green light emitters 514, and blue light emitters 516 can be equal to or greater than the number of pixels in a display image, such as 960×720, 1280×720, 1440×1080, 1920×1080, 2160×1080, or 2560×1080 pixels. Thus, a display image may be generated simultaneously by light source 510. A scanning element may not be used in NED device 500.

Before reaching waveguide display 530, the light emitted by light source 510 may be conditioned by projection optics 520, which may include a lens array. Projection optics 520 may collimate or focus the light emitted by light source 510 to waveguide display 530, which may include a coupler 532 for coupling the light emitted by light source 510 into waveguide display 530. The light coupled into waveguide display 530 may propagate within waveguide display 530 through, for example, total internal reflection as described above with respect to FIG. 4. Coupler 532 may also couple portions of the light propagating within waveguide display 530 out of waveguide display 530 and towards user's eye 590.

FIG. 5B illustrates an example of a near-eye display (NED) device 550 including a waveguide display 580 according to certain embodiments. In some embodiments, NED device 550 may use a scanning mirror 570 to project light from a light source 540 to an image field where a user's eye 590 may be located. NED device 550 may be an example of near-eye display 120, augmented reality system 400, or another type of display device. Light source 540 may include one or more rows or one or more columns of light emitters of different colors, such as multiple rows of red light emitters 542, multiple rows of green light emitters 544, and multiple rows of blue light emitters 546. For example, red light emitters 542, green light emitters 544, and blue light emitters 546 may each include N rows, each row including, for example, 2560 light emitters (pixels). The red light emitters 542 are organized into an array; the green light emitters 544 are organized into an array; and the blue light emitters 546 are organized into an array. In some embodiments, light source 540 may include a single line of light emitters for each color. In some embodiments, light source 540 may include multiple columns of light emitters for each of red, green, and blue colors, where each column may include, for example, 1080 light emitters. In some embodiments, the dimensions and/or pitches of the light emitters in light source 540 may be relatively large (e.g., about 3-5 µm) and thus light source 540 may not include sufficient light emitters for simultaneously generating a full display image. For example, the number of light emitters for a single color may be fewer than the number of pixels (e.g., 2560×1080 pixels) in a display image. The light emitted by light source 540 may be a set of collimated or diverging beams of light.

Before reaching scanning mirror 570, the light emitted by light source 540 may be conditioned by various optical devices, such as collimating lenses or a freeform optical element 560. Freeform optical element 560 may include, for example, a multi-facet prism or another light folding element that may direct the light emitted by light source 540 towards scanning mirror 570, such as changing the propagation direction of the light emitted by light source 540 by, for example, about 90° or larger. In some embodiments, freeform optical element 560 may be rotatable to scan the light. Scanning mirror 570 and/or freeform optical element 560 may reflect and project the light emitted by light source 540 to waveguide display 580, which may include a coupler 582 for coupling the light emitted by light source 540 into waveguide display 580. The light coupled into waveguide display 580 may propagate within waveguide display 580 through, for example, total internal reflection as described above with respect to FIG. 4. Coupler 582 may also couple portions of the light propagating within waveguide display 580 out of waveguide display 580 and towards user's eye 590.

Scanning mirror 570 may include a microelectromechanical system (MEMS) mirror or any other suitable mirrors. Scanning mirror 570 may rotate to scan in one or two dimensions. As scanning mirror 570 rotates, the light emitted by light source 540 may be directed to a different area of waveguide display 580 such that a full display image may be projected onto waveguide display 580 and directed to user's eye 590 by waveguide display 580 in each scanning cycle. For example, in embodiments where light source 540 includes light emitters for all pixels in one or more rows or columns, scanning mirror 570 may be rotated in the column or row direction (e.g., x or y direction) to scan an image. In embodiments where light source 540 includes light emitters for some but not all pixels in one or more rows or columns, scanning mirror 570 may be rotated in both the row and column directions (e.g., both x and y directions) to project a display image (e.g., using a raster-type scanning pattern).

NED device 550 may operate in predefined display periods. A display period (e.g., display cycle) may refer to a duration of time in which a full image is scanned or projected. For example, a display period may be a reciprocal of the desired frame rate. In NED device 550 that includes scanning mirror 570, the display period may also be referred to as a scanning period or scanning cycle. The light generation by light source 540 may be synchronized with the rotation of scanning mirror 570. For example, each scanning cycle may include multiple scanning steps, where light source 540 may generate a different light pattern in each respective scanning step.

In each scanning cycle, as scanning mirror 570 rotates, a display image may be projected onto waveguide display 580 and user's eye 590. The actual color value and light intensity (e.g., brightness) of a given pixel location of the display image may be an average of the light beams of the three colors (e.g., red, green, and blue) illuminating the pixel location during the scanning period. After completing a scanning period, scanning mirror 570 may revert back to the initial position to project light for the first few rows of the next display image or may rotate in a reverse direction or scan pattern to project light for the next display image, where a new set of driving signals may be fed to light source 540. The same process may be repeated as scanning mirror 570 rotates in each scanning cycle. As such, different images may be projected to user's eye 590 in different scanning cycles.

Figure 6:
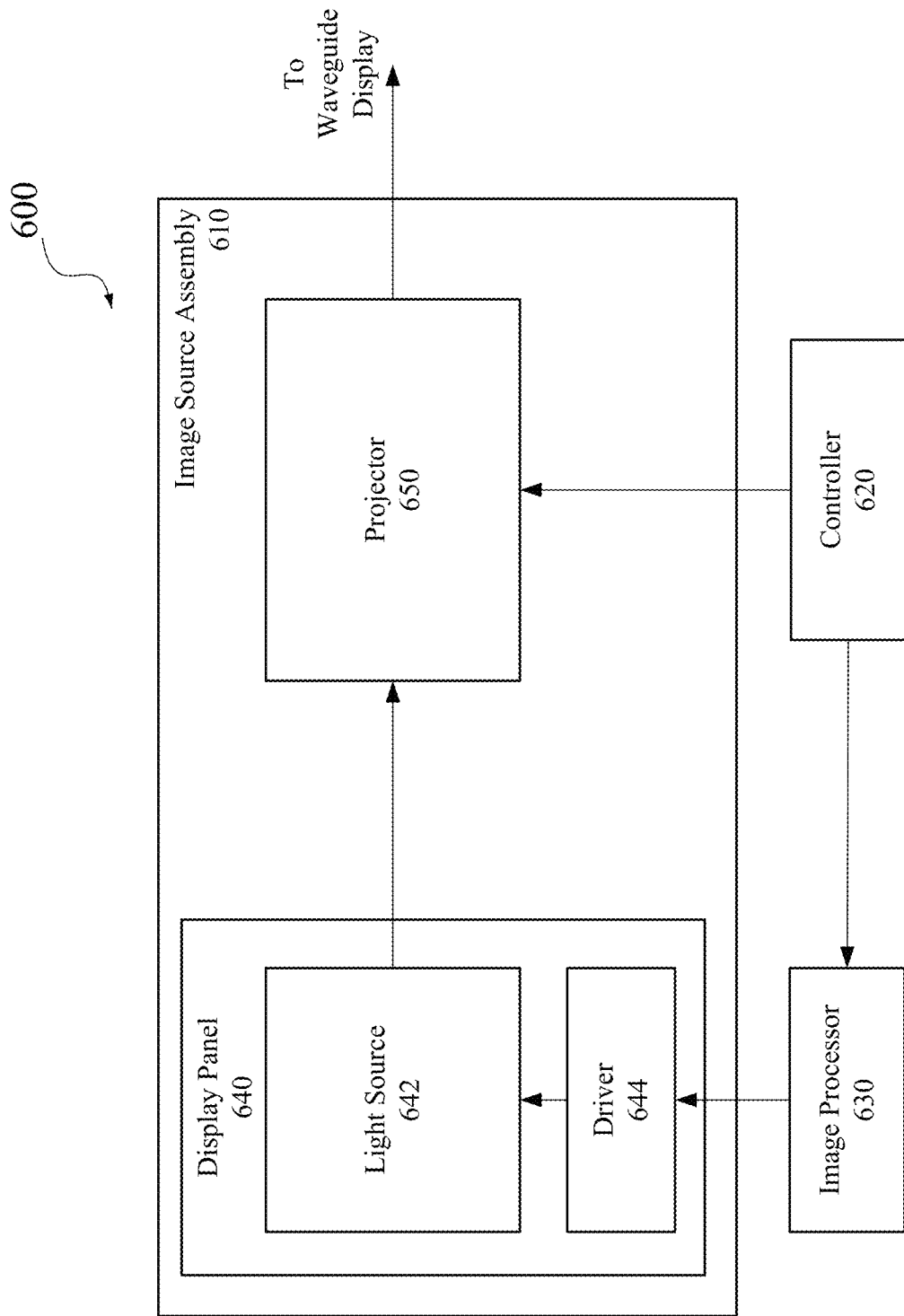
FIG. 6 illustrates an example of an image source assembly in an augmented reality system according to certain embodiments.

FIG. 6 illustrates an example of an image source assembly 610 in a near-eye display system 600 according to certain embodiments. Image source assembly 610 may include, for example, a display panel 640 that may generate display images to be projected to the user's eyes, and a projector 650 that may project the display images generated by display panel 640 to a waveguide display as described above with respect to FIGS. 4-5B. Display panel 640 may include a light source 642 and a driver circuit 644 for light source 642. Light source 642 may include, for example, light source 510 or 540. Projector 650 may include, for example, freeform optical element 560, scanning mirror 570, and/or projection optics 520 described above. Near-eye display system 600 may also include a controller 620 that synchronously controls light source 642 and projector 650 (e.g., scanning mirror 570). Image source assembly 610 may generate and output an image light to a waveguide display (not shown in FIG. 6), such as waveguide display 530 or 580. As described above, the waveguide display may receive the image light at one or more input-coupling elements, and guide the received image light to one or more output-coupling elements. The input and output coupling elements may include, for example, a diffraction grating, a holographic grating, a prism, or any combination thereof. The input-coupling element may be chosen such that total internal reflection occurs with the waveguide display. The output-coupling element may couple portions of the total internally reflected image light out of the waveguide display.

As described above, light source 642 may include a plurality of light emitters arranged in an array or a matrix. Each light emitter may emit monochromatic light, such as red light, blue light, green light, infra-red light, and the like. While RGB colors are often discussed in this disclosure, embodiments described herein are not limited to using red, green, and blue as primary colors. Other colors can also be used as the primary colors of near-eye display system 600. In some embodiments, a display panel in accordance with an embodiment may use more than three primary colors. Each pixel in light source 642 may include three subpixels that include a red micro-LED, a green micro-LED, and a blue micro-LED. A semiconductor LED generally includes an active light emitting layer within multiple layers of semiconductor materials. The multiple layers of semiconductor materials may include different compound materials or a same base material with different dopants and/or different doping densities. For example, the multiple layers of semiconductor materials may include an n-type material layer, an active region that may include hetero-structures (e.g., one or more quantum wells), and a p-type material layer. The multiple layers of semiconductor materials may be grown on a surface of a substrate having a certain orientation. In some embodiments, to increase light extraction efficiency, a mesa that includes at least some of the layers of semiconductor materials may be formed.

Controller 620 may control the image rendering operations of image source assembly 610, such as the operations of light source 642 and/or projector 650. For example, controller 620 may determine instructions for image source assembly 610 to render one or more display images. The instructions may include display instructions and scanning instructions. In some embodiments, the display instructions may include an image file (e.g., a bitmap file). The display instructions may be received from, for example, a console, such as console 110 described above with respect to FIG. 1. The scanning instructions may be used by image source assembly 610 to generate image light. The scanning instructions may specify, for example, a type of a source of image light (e.g., monochromatic or polychromatic), a scanning rate, an orientation of a scanning apparatus, one or more illumination parameters, or any combination thereof. Controller 620 may include a combination of hardware, software, and/or firmware not shown here so as not to obscure other aspects of the present disclosure.

In some embodiments, controller 620 may be a graphics processing unit (GPU) of a display device. In other embodiments, controller 620 may be other kinds of processors. The operations performed by controller 620 may include taking content for display and dividing the content into discrete sections. Controller 620 may provide to light source 642 scanning instructions that include an address corresponding to an individual source element of light source 642 and/or an electrical bias applied to the individual source element. Controller 620 may instruct light source 642 to sequentially present the discrete sections using light emitters corresponding to one or more rows of pixels in an image ultimately displayed to the user. Controller 620 may also instruct projector 650 to perform different adjustments of the light. For example, controller 620 may control projector 650 to scan the discrete sections to different areas of a coupling element of the waveguide display (e.g., waveguide display 580) as described above with respect to FIG. 5B. As such, at the exit pupil of the waveguide display, each discrete portion is presented in a different respective location. While each discrete section is presented at a different respective time, the presentation and scanning of the discrete sections occur fast enough such that a user's eye may integrate the different sections into a single image or series of images.

Image processor 630 may be a general-purpose processor and/or one or more application-specific circuits that are dedicated to performing the features described herein. In one embodiment, a general-purpose processor may be coupled to a memory to execute software instructions that cause the processor to perform certain processes described herein. In another embodiment, image processor 630 may be one or more circuits that are dedicated to performing certain features. While image processor 630 in FIG. 6 is shown as a stand-alone unit that is separate from controller 620 and driver circuit 644, image processor 630 may be a sub-unit of controller 620 or driver circuit 644 in other embodiments. In other words, in those embodiments, controller 620 or driver circuit 644 may perform various image processing functions of image processor 630. Image processor 630 may also be referred to as an image processing circuit.

In the example shown in FIG. 6, light source 642 may be driven by driver circuit 644, based on data or instructions (e.g., display and scanning instructions) sent from controller 620 or image processor 630. In one embodiment, driver circuit 644 may include a circuit panel that connects to and mechanically holds various light emitters of light source 642. Light source 642 may emit light in accordance with one or more illumination parameters that are set by the controller 620 and potentially adjusted by image processor 630 and driver circuit 644. An illumination parameter may be used by light source 642 to generate light. An illumination parameter may include, for example, source wavelength, pulse rate, pulse amplitude, beam type (continuous or pulsed), other parameter(s) that may affect the emitted light, or any combination thereof. In some embodiments, the source light generated by light source 642 may include multiple beams of red light, green light, and blue light, or any combination thereof.

Projector 650 may perform a set of optical functions, such as focusing, combining, conditioning, or scanning the image light generated by light source 642. In some embodiments, projector 650 may include a combining assembly, a light conditioning assembly, or a scanning mirror assembly. Projector 650 may include one or more optical components that optically adjust and potentially re-direct the light from light source 642. One example of the adjustment of light may include conditioning the light, such as expanding, collimating, correcting for one or more optical errors (e.g., field curvature, chromatic aberration, etc.), some other adjustments of the light, or any combination thereof. The optical components of projector 650 may include, for example, lenses, mirrors, apertures, gratings, or any combination thereof.

Projector 650 may redirect image light via its one or more reflective and/or refractive portions so that the image light is projected at certain orientations toward the waveguide display. The location where the image light is redirected toward the waveguide display may depend on specific orientations of the one or more reflective and/or refractive portions. In some embodiments, projector 650 includes a single scanning mirror that scans in at least two dimensions. In other embodiments, projector 650 may include a plurality of scanning mirrors that each scan in directions orthogonal to each other. Projector 650 may perform a raster scan (horizontally or vertically), a bi-resonant scan, or any combination thereof. In some embodiments, projector 650 may perform a controlled vibration along the horizontal and/or vertical directions with a specific frequency of oscillation to scan along two dimensions and generate a two-dimensional projected image of the media presented to user's eyes. In other embodiments, projector 650 may include a lens or prism that may serve similar or the same function as one or more scanning mirrors. In some embodiments, image source assembly 610 may not include a projector, where the light emitted by light source 642 may be directly incident on the waveguide display.

In semiconductor LEDs, photons are usually generated at a certain internal quantum efficiency through the recombination of electrons and holes within an active region (e.g., one or more semiconductor layers), where the internal quantum efficiency is the proportion of the radiative electron-hole recombination in the active region that emits photons. The generated light may then be extracted from the LEDs in a particular direction or within a particular solid angle. The ratio between the number of emitted photons extracted from an LED and the number of electrons passing through the LED is referred to as the external quantum efficiency, which describes how efficiently the LED converts injected electrons to photons that are extracted from the device.

The external quantum efficiency may be proportional to the injection efficiency, the internal quantum efficiency, and the extraction efficiency. The injection efficiency refers to the proportion of electrons passing through the device that are injected into the active region. The extraction efficiency is the proportion of photons generated in the active region that escape from the device. For LEDs, and in particular, micro-LEDs with reduced physical dimensions, improving the internal and external quantum efficiency and/or controlling the emission spectrum may be challenging. In some embodiments, to increase the light extraction efficiency, a mesa that includes at least some of the layers of semiconductor materials may be formed.

Figure 7A:
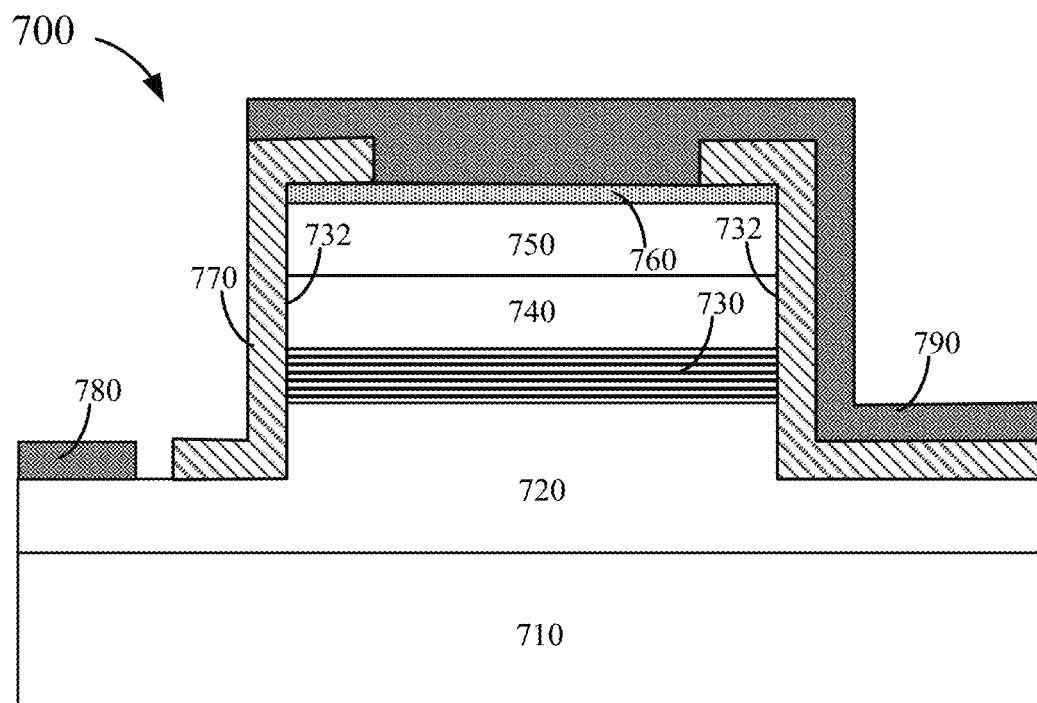
FIG. 7A illustrates an example of a light emitting diode (LED) having a vertical mesa structure according to certain embodiments.

FIG. 7A illustrates an example of an LED 700 having a vertical mesa structure. LED 700 may be a light emitter in light source 510, 540, or 642. LED 700 may be a micro-LED made of inorganic materials, such as multiple layers of semiconductor materials. The layered semiconductor light emitting device may include multiple layers of III-V semiconductor materials. A III-V semiconductor material may include one or more Group III elements, such as aluminum (Al), gallium (Ga), or indium (In), in combination with a Group V element, such as nitrogen (N), phosphorus (P), arsenic (As), or antimony (Sb). When the Group V element of the III-V semiconductor material includes nitrogen, the III-V semiconductor material is referred to as a III-nitride material. The layered semiconductor light emitting device may be manufactured by growing multiple epitaxial layers on a substrate using techniques such as vapor-phase epitaxy (VPE), liquid-phase epitaxy (LPE), molecular beam epitaxy (MBE), or metalorganic chemical vapor deposition (MOCVD). For example, the layers of the semiconductor materials may be grown layer-by-layer on a substrate with a certain crystal lattice orientation (e.g., polar, nonpolar, or semi-polar orientation), such as a GaN, GaAs, or GaP substrate, or a substrate including, but not limited to, sapphire, silicon carbide, silicon, zinc oxide, boron nitride, lithium aluminate, lithium niobate, germanium, aluminum nitride, lithium gallate, partially substituted spinels, or quaternary tetragonal oxides sharing the beta-LiAlO$_2$ structure, where the substrate may be cut in a specific direction to expose a specific plane as the growth surface.

In the example shown in FIG. 7A, LED 700 may include a substrate 710, which may include, for example, a sapphire substrate or a GaN substrate. A semiconductor layer 720 may be grown on substrate 710. Semiconductor layer 720 may include a III-V material, such as GaN, and may be p-doped (e.g., with Mg, Ca, Zn, or Be) or n-doped (e.g., with Si or Ge). One or more active layers 730 may be grown on semiconductor layer 720 to form an active region. Active layer 730 may include III-V materials, such as one or more InGaN layers, one or more AlInGaP layers, one or more AlGaN layers, and/or one or more GaN layers, which may form one or more heterostructures, such as one or more quantum wells or MQWs. A semiconductor layer 740 may be grown on active layer 730. Semiconductor layer 740 may include a III-V material, such as GaN, and may be p-doped (e.g., with Mg, Ca, Zn, or Be) or n-doped (e.g., with Si or Ge). One of semiconductor layer 720 and semiconductor layer 740 may be a p-type layer and the other one may be an n-type layer. Semiconductor layer 720 and semiconductor layer 740 sandwich active layer 730 to form the light emitting region. For example, LED 700 may include a layer of InGaN situated between a layer of p-type GaN doped with magnesium and a layer of n-type GaN doped with silicon or oxygen. In some embodiments, LED 700 may include a layer of AlInGaP situated between a layer of p-type AlInGaP doped with zinc or magnesium and a layer of n-type AlInGaP doped with selenium, silicon, or tellurium.

In some embodiments, an electron-blocking layer (EBL) (not shown in FIG. 7A) may be grown to form a layer between active layer 730 and at least one of semiconductor layer 720 or semiconductor layer 740. The EBL may reduce the electron leakage current and improve the efficiency of the LED. In some embodiments, a heavily-doped semiconductor layer 750, such as a P$^+$ or P$^{++}$ semiconductor layer, may be formed on semiconductor layer 740 and act as a contact layer for forming an ohmic contact and reducing the contact impedance of the device. In some embodiments, a conductive layer 760 may be formed on heavily-doped semiconductor layer 750. Conductive layer 760 may include, for example, an indium tin oxide (ITO) or Al/Ni/Au film. In one example, conductive layer 760 may include a transparent ITO layer.

To make contact with semiconductor layer 720 (e.g., an n-GaN layer) and to more efficiently extract light emitted by active layer 730 from LED 700, the semiconductor material layers (including heavily-doped semiconductor layer 750, semiconductor layer 740, active layer 730, and semiconductor layer 720) may be etched to expose semiconductor layer 720 and to form a mesa structure that includes layers 720-760. The mesa structure may confine the carriers within the device. Etching the mesa structure may lead to the formation of sidewalls 732 that may be orthogonal to the growth planes. A passivation layer 770 may be formed on sidewalls 732 of the mesa structure. Passivation layer 770 may include an oxide layer, such as a SiO$_2$ layer, and may act as a reflector to reflect emitted light out of LED 700. A contact layer 780, which may include a metal layer, such as Al, Au, Ni, Ti, or any combination thereof, may be formed on semiconductor layer 720 and may act as an electrode of LED 700. In addition, another contact layer 790, such as an Al/Ni/Au metal layer, may be formed on conductive layer 760 and may act as another electrode of LED 700.

When a voltage signal is applied to contact layers 780 and 790, electrons and holes may recombine in active layer 730, where the recombination of electrons and holes may cause photon emission. The wavelength and energy of the emitted photons may depend on the energy bandgap between the valence band and the conduction band in active layer 730. For example, InGaN active layers may emit green or blue light, AlGaN active layers may emit blue to ultraviolet light, while AlInGaP active layers may emit red, orange, yellow, or green light. The emitted photons may be reflected by passivation layer 770 and may exit LED 700 from the top (e.g., conductive layer 760 and contact layer 790) or bottom (e.g., substrate 710).

In some embodiments, LED 700 may include one or more other components, such as a lens, on the light emission surface, such as substrate 710, to focus or collimate the emitted light or couple the emitted light into a waveguide. In some embodiments, an LED may include a mesa of another shape, such as planar, conical, semi-parabolic, or parabolic, and a base area of the mesa may be circular, rectangular, hexagonal, or triangular. For example, the LED may include a mesa of a curved shape (e.g., paraboloid shape) and/or a non-curved shape (e.g., conic shape). The mesa may be truncated or non-truncated.

Figure 7B:
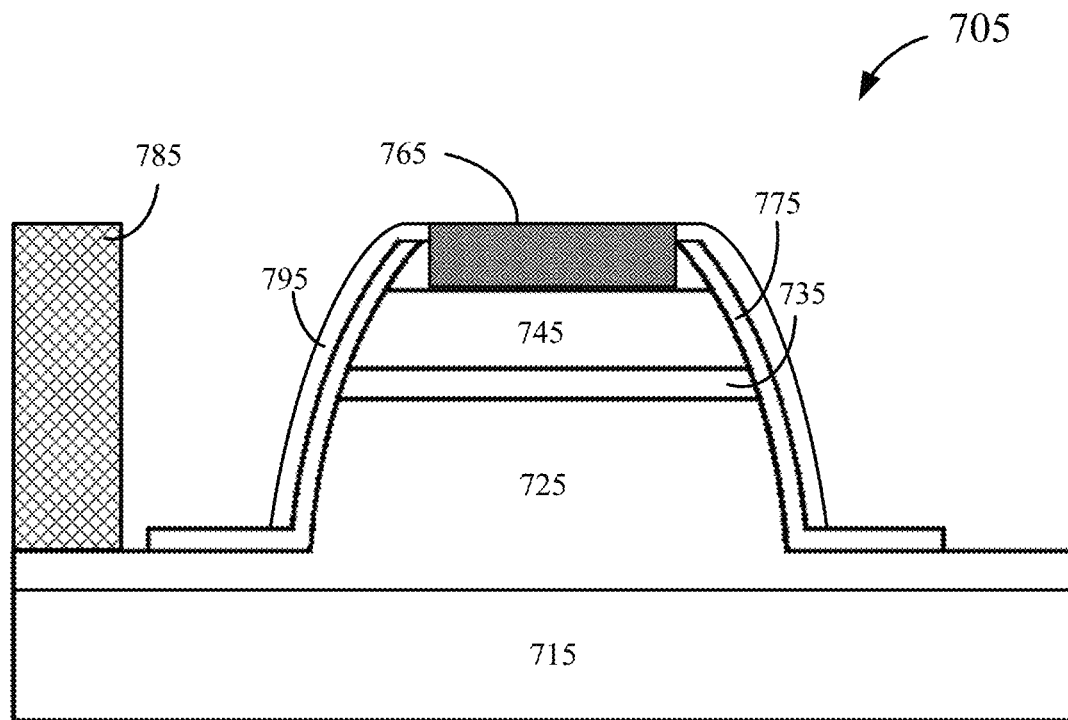
FIG. 7B is a cross-sectional view of an example of an LED having a parabolic mesa structure according to certain embodiments.

FIG. 7B is a cross-sectional view of an example of an LED 705 having a parabolic mesa structure. Similar to LED 700, LED 705 may include multiple layers of semiconductor materials, such as multiple layers of III-V semiconductor materials. The semiconductor material layers may be epitaxially grown on a substrate 715, such as a GaN substrate or a sapphire substrate. For example, a semiconductor layer 725 may be grown on substrate 715. Semiconductor layer 725 may include a III-V material, such as GaN, and may be p-doped (e.g., with Mg, Ca, Zn, or Be) or n-doped (e.g., with Si or Ge). One or more active layer 735 may be grown on semiconductor layer 725. Active layer 735 may include III-V materials, such as one or more InGaN layers, one or more AlInGaP layers, and/or one or more GaN layers, which may form one or more heterostructures, such as one or more quantum wells. A semiconductor layer 745 may be grown on active layer 735. Semiconductor layer 745 may include a III-V material, such as GaN, and may be p-doped (e.g., with Mg, Ca, Zn, or Be) or n-doped (e.g., with Si or Ge). One of semiconductor layer 725 and semiconductor layer 745 may be a p-type layer and the other one may be an n-type layer.

To make contact with semiconductor layer 725 (e.g., an n-type GaN layer) and to more efficiently extract light emitted by active layer 735 from LED 705, the semiconductor layers may be etched to expose semiconductor layer 725 and to form a mesa structure that includes layers 725-745. The mesa structure may confine carriers within the injection area of the device. Etching the mesa structure may lead to the formation of mesa side walls (also referred to herein as facets) that may be non-parallel with, or in some cases, orthogonal, to the growth planes associated with crystalline growth of layers 725-745.

As shown in FIG. 7B, LED 705 may have a mesa structure that includes a flat top. A dielectric layer 775 (e.g., SiO₂ or SiNx) may be formed on the facets of the mesa structure. In some embodiments, dielectric layer 775 may include multiple layers of dielectric materials. In some embodiments, a metal layer 795 may be formed on dielectric layer 775. Metal layer 795 may include one or more metal or metal alloy materials, such as aluminum (Al), silver (Ag), gold (Au), platinum (Pt), titanium (Ti), copper (Cu), or any combination thereof. Dielectric layer 775 and metal layer 795 may form a mesa reflector that can reflect light emitted by active layer 735 toward substrate 715. In some embodiments, the mesa reflector may be parabolic-shaped to act as a parabolic reflector that may at least partially collimate the emitted light.

Electrical contact 765 and electrical contact 785 may be formed on semiconductor layer 745 and semiconductor layer 725, respectively, to act as electrodes. Electrical contact 765 and electrical contact 785 may each include a conductive material, such as Al, Au, Pt, Ag, Ni, Ti, Cu, or any combination thereof (e.g., Ag/Pt/Au or Al/Ni/Au), and may act as the electrodes of LED 705. In the example shown in FIG. 7B, electrical contact 785 may be an n-contact, and electrical contact 765 may be a p-contact. Electrical contact 765 and semiconductor layer 745 (e.g., a p-type semiconductor layer) may form a back reflector for reflecting light emitted by active layer 735 back toward substrate 715. In some embodiments, electrical contact 765 and metal layer 795 include same material(s) and can be formed using the same processes. In some embodiments, an additional conductive layer (not shown) may be included as an intermediate conductive layer between the electrical contacts 765 and 785 and the semiconductor layers.

When a voltage signal is applied across electrical contacts 765 and 785, electrons and holes may recombine in active layer 735. The recombination of electrons and holes may cause photon emission, thus producing light. The wavelength and energy of the emitted photons may depend on the energy bandgap between the valence band and the conduction band in active layer 735. For example, InGaN active layers may emit green or blue light, while AlInGaP active layers may emit red, orange, yellow, or green light. The emitted photons may propagate in many different directions, and may be reflected by the mesa reflector and/or the back reflector and may exit LED 705, for example, from the bottom side (e.g., substrate 715) shown in FIG. 7B. One or more other secondary optical components, such as a lens or a grating, may be formed on the light emission surface, such as substrate 715, to focus or collimate the emitted light and/or couple the emitted light into a waveguide.

FIG. 8A is a simplified top view of an example of a micro-LED array 800. FIG. 8B is a cross-sectional view of the example of micro-LED array 800. Micro-LED array 800 may include a two-dimensional array of micro-LEDs 805 formed on a substrate 810. As described above, the two-dimensional array of micro-LEDs 805 may be formed by growing epitaxial layers (e.g., GaN, InGaN, AlGaN, AlGaI-nAsP, InSb, or AlInGaP layers) on substrate 810, etching the epitaxial layers to form individual mesa structures, and forming electrical contacts to the individual mesa structures. In the illustrated example, each micro-LED 805 may include an n-type semiconductor layer 822 (e.g., an n-GaN layer), an active region 830 that may include multiple quantum wells for light emission, a p-type semiconductor layer 840, and a p-contact 850. The n-type semiconductor layer 822 in the mesa structures of individual micro-LEDs may be connected to n-contacts 860 through a common n-type semiconductor layer 820. N-type semiconductor layer 822 may be a portion of n-type semiconductor layer 820. In some embodiments, at least a sublayer of n-type semiconductor layer 820 may be heavily doped and thus mat have a higher conductivity for current spreading. The feature size (e.g., the diameter or side) of each micro-LED 805 may range from sub-micrometers to tens of micrometers (e.g., from 0.1 μm to 20 μm). The pitch of micro-LED array 800 may range from sub-micrometers to tens of micrometers. Each micro-LED may correspond to a pixel or sub-pixel of a display.

During operation of micro-LED array 800, a current (or voltage) signal may be applied between individual p-contacts 850 and n-contacts 860 to inject carriers into active regions 830 of micro-LEDs 805 to cause radiative recombination. Because the array of micro-LEDs 805 share two n-contacts 860 near edges of micro-LED array 800, the electrical path distance between p-contacts 850 and n-contacts 860 may be different for micro-LEDs at different locations of the array. For example, an micro-LED near the edge of micro-LED array 800 may be close to an re-contact 860, while a micro-LED near the center of micro-LED array 800 may have a longer distance to the nearest n-contact 860 of micro-LED array 800. Therefore, carriers may need to travel different distances to reach the n-type semiconductor layers of different micro-LEDs, and thus the resistance between a signal source and the n-type semiconductor layer of the mesa structure may be different for different micro-LEDs.

These different distances between n-contact and p-contact for the micro-LEDs of the micro-LED array 800 may also create a current crowding problem. In order to turn on micro-LEDs 805 of micro-LED array 800, current 870 may need to spread from n-contacts 860 through n-type semiconductor layer 820 to individual micro-LEDs 805 in micro-LED array 800. When most micro-LEDs 805 are turned on, a large current may flow through the n-side. For micro-LEDs 805 in the center region, the current may need to go through a longer distance to reach the center LED than micro-LEDs 805 near the edge regions. Since n-type semiconductor layer 820 may has a finite resistance, the voltage drop between n-contacts 860 and n-type semiconductor layer 822 of each micro-LED 805 may be different for micro-LEDs 805 at different regions of micro-LED array 800. As such, different voltages may be needed to drive the micro-LEDs 805 to achieve a same current density, or a calibration process may be needed because, when the driving voltage is the same, the current density may be different for micro-LEDs 805 at different locations of micro-LED array 800, and the current density difference may affect the uniformity of the displayed images.

According to certain embodiments, in order to reduce the variation in resistance and voltage drop between micro-LEDs at different locations of the micro-LED array, the micro-LED array may include individually addressable p-contacts for the respective micro-LEDs, a low resistance current spreading layer (e.g., a metal layer such as an aluminum layer) coupled to a common n-electrode, and a plurality of n-contacts between the p-contacts and coupled to the current spreading layer. As such, there may be n-contacts close to each micro-LED to provide a low resistance electrical path from the n-electrode, via the low resistance current spreading layer and the n-contact, to the n-type semiconductor layer of the mesa structure of the micro-LED. As such, the resistance from the n-electrode to the n-type semiconductor layer of each individual micro-LED may be low and more uniform. Therefore, techniques disclosed herein can reduce the drive voltage and improve the efficiency and uniformity of the micro-LEDs in the micro-LED array.

Figures 9A, 9B:
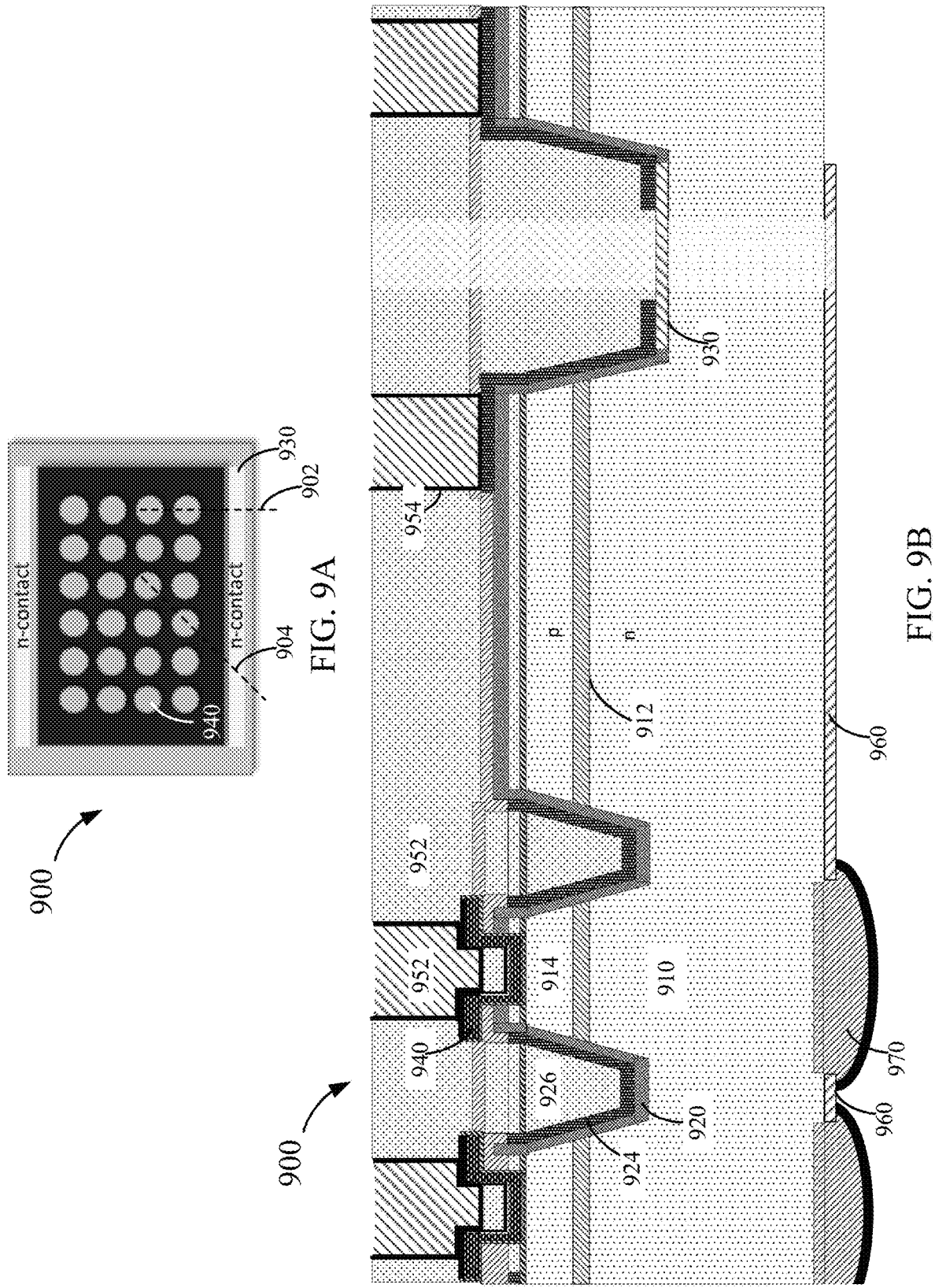
FIG. 9A illustrates an example of a micro-LED array according to certain embodiments.
FIG. 9B illustrates a cross-sectional view of the example of micro-LED array shown in FIG. 9A according to certain embodiments.

FIG. 9A illustrates an example of a micro-LED array 900 according to certain embodiments. FIG. 9B illustrates a cross-sectional view of the example of micro-LED array 900 according to certain embodiments. Micro-LED array 900 may include a two-dimensional array of micro-LEDs arranged in a plurality of columns and rows. FIG. 9A shows individual p-contacts 940 for the micro-LEDs in micro-LED array 900, and two shared n-contacts 930 near two edges of micro-LED array 900. FIG. 9B shows the cross-section along a line 902.

In the example shown in FIG. 9B, micro-LED array 900 may include an n-type semiconductor layer 910 (e.g., an n-type GaN, InGaN, or GaInP layer), an active layer 912 that may include one or more quantum wells, and a p-type semiconductor layer 914. Semiconductor layers 910, 912, and 914 may be etched to form individual mesa structures. A patterned dielectric layer 920 (e.g., SiN) may be formed on the surfaces of the mesa structures as a barrier layer, and an n-contact 930 may be formed on the exposed n-type semiconductor layer 910. A metal (e.g., aluminum) layer 924 may be formed on dielectric layer 920 and n-contact 930. P-contacts 940 may be formed on p-type semiconductor layers 914 of the mesa structures. Regions between the mesa structures may be filled with a dielectric material 926, such as $SiO_2$. Metal interconnects 950 (e.g., Cu interconnects) may be formed in a dielectric layer 952 to connect to p-contacts 940 and n-contact 930. A barrier and/or metal seed layer 954 (e.g., TiN/Ti or TaN/Ta) may be between metal interconnects 950 and dielectric layer 952. A patterned current spreading layer 960 may be formed on the bottom surface of n-type semiconductor layer to provide additional n-contacts near each individual micro-LEDs. In some embodiments, at least a sublayer of n-type semiconductor layer 910 may be heavily doped and thus mat have a higher conductivity for current spreading. Light extraction structures 970 (e.g., micro-lenses) may be formed on the exposed regions of n-type semiconductor layer 910. An example of a process to manufacture micro-LED array 900 is described in detail below.

In some embodiments, patterned current spreading layer 960 and light extraction structures 970 may be formed on n-type semiconductor layer 910 after micro-LED array 900 is bonded to a driver circuit fabricated on a silicon wafer as described below, such that the silicon wafer may be used as the handle wafer and the processes can be performed from the side of n-type semiconductor layer 910.

Figure 10:
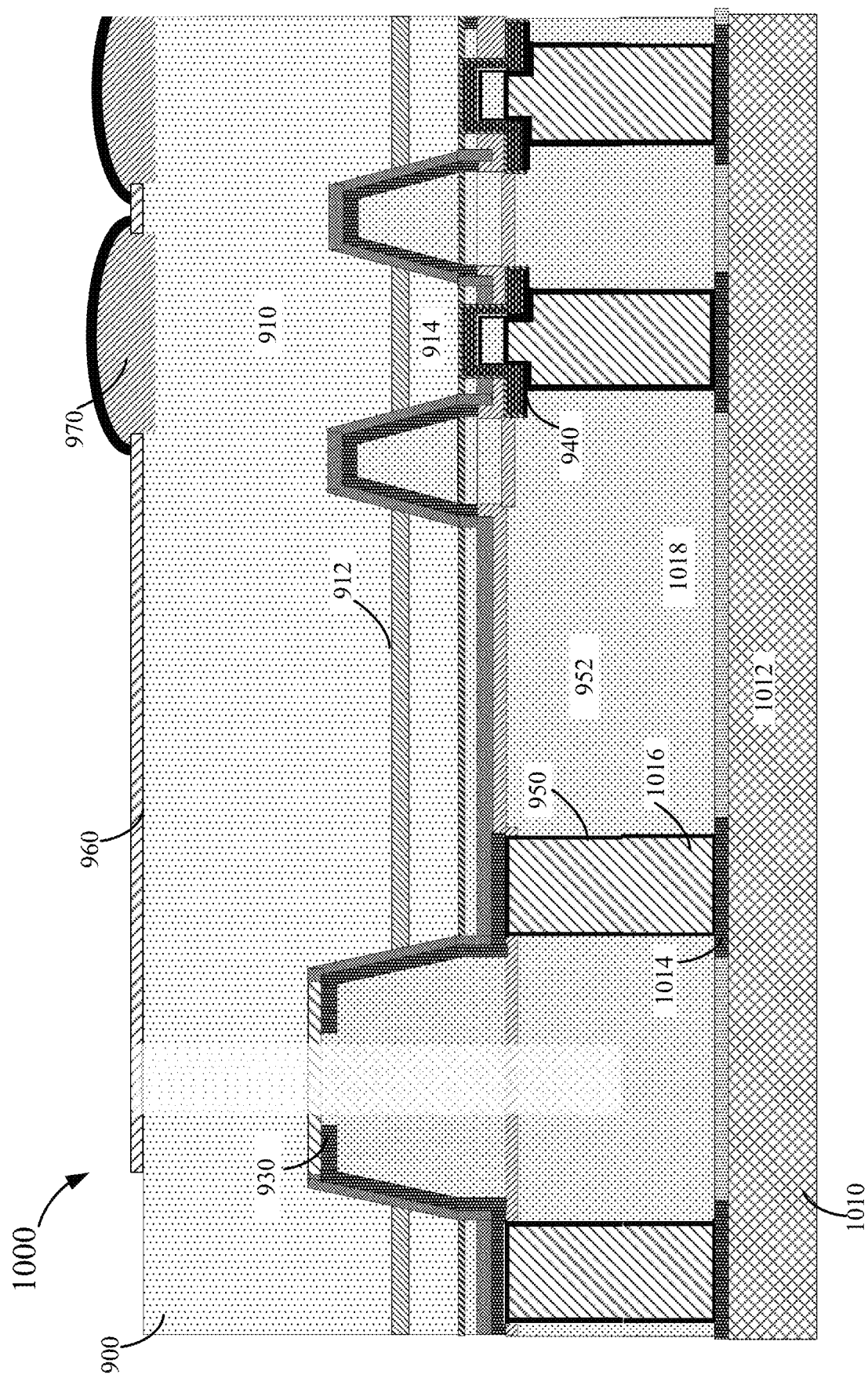
FIG. 10 illustrates an example of a micro-LED array bonded to a CMOS backplane according to certain embodiments.

FIG. 10 illustrates an example of a device 1000 including a micro-LED array (e.g., micro-LED array 900) bonded to a CMOS backplane 1010 according to certain embodiments. CMOS backplane 1010 may include a substrate 1012, such as a silicon substrate. CMOS integrated circuits 1014, such as micro-LED driving circuits, may be fabricated on substrate 1012. CMOS backplane 1010 may also include metal (e.g., Cu) interconnects 1016 formed in a dielectric (e.g., $SiO_2$) layer 1018. Micro-LED array 900 and CMOS backplane 1010 may be bonded such that metal interconnects 950 and metal interconnects 1016 may be bonded together and dielectric layer 952 and dielectric layer 1018 may be bonded together.

In some embodiments, the micro-LED array may be bonded to CMOS backplane 1010 using a die-to-wafer or wafer-to-wafer high-precision hybrid bonding process. For example, the surface of the micro-LED array wafer and the surface of the CMOS backplane wafer may be cleaned and then activated by a low temperature (e.g., room temperature) plasma surface activation process. The surface-activated wafers may be aligned and pre-bonded at low temperature (e.g., room temperature) to bond the dielectric layer on the surface of the micro-LED wafer to the dielectric layer on the surface of the CMOS backplane wafer. The pre-bonded wafers may then be annealed at an elevated temperature, such as about 180° C. to about 250° C., to bond metal pads on the micro-LED wafer to the metal pads on the CMOS backplane wafer.

Figure 11A:
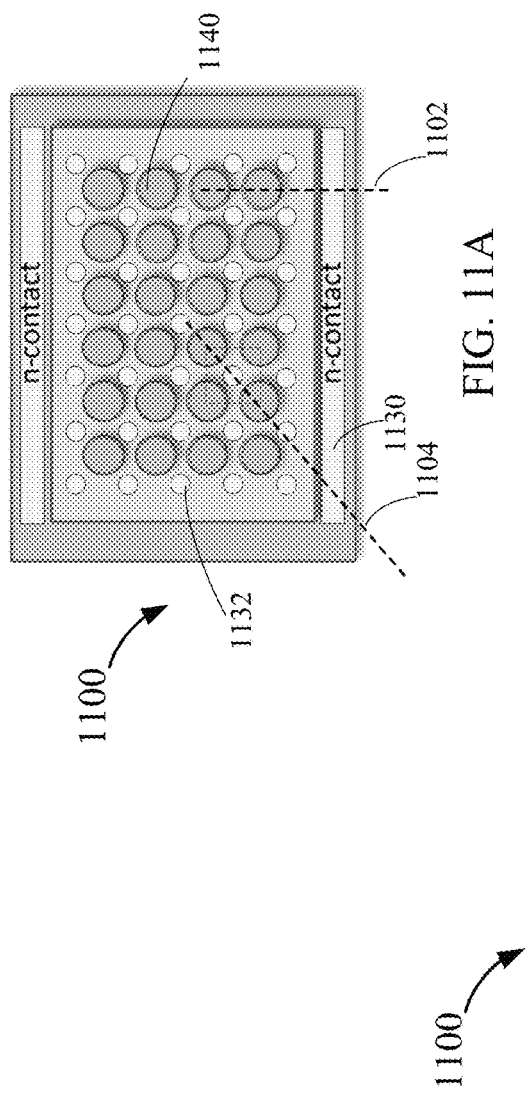
FIG. 11A illustrates an example of a micro-LED array according to certain embodiments.
Figure 11B:
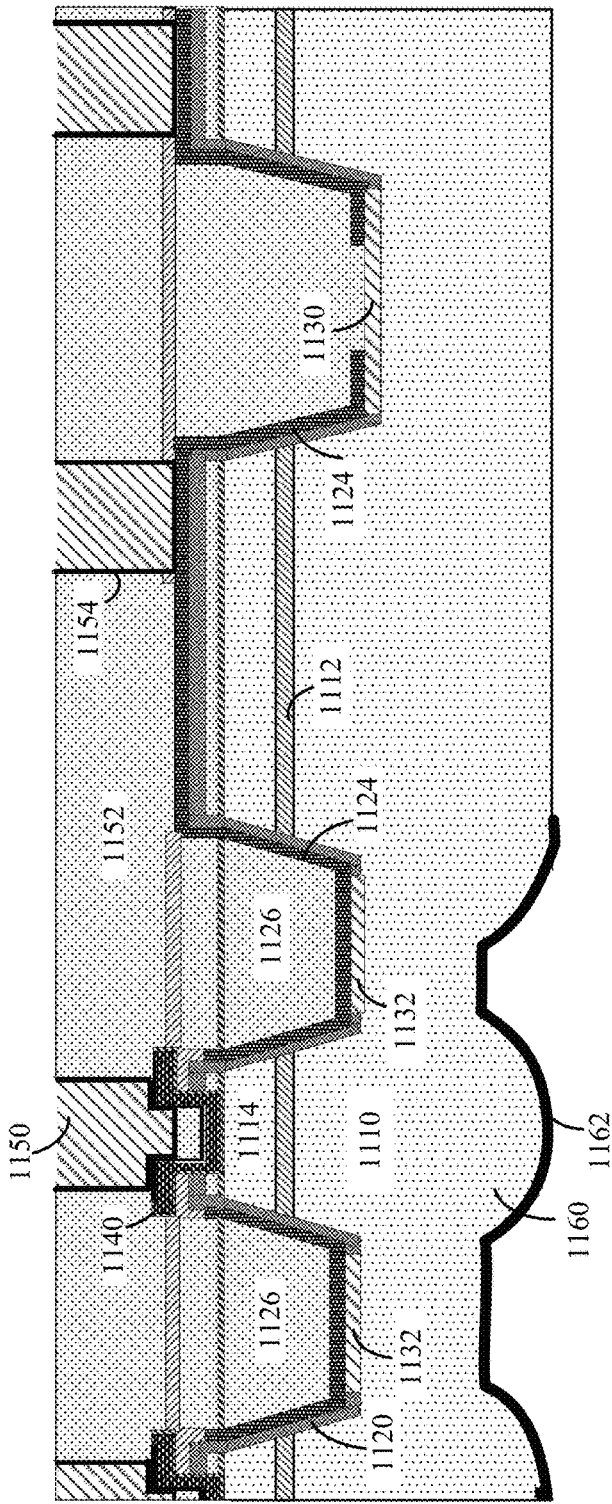
FIG. 11B illustrates a cross-sectional view of the example of micro-LED array shown in FIG. 11A according to certain embodiments.

FIG. 11A illustrates an example of a micro-LED array 1100 according to certain embodiments. FIG. 11B illustrates a cross-sectional view of the example of micro-LED array 1100 shown in FIG. 11A according to certain embodiments. Micro-LED array 1100 may include a two-dimensional array of micro-LEDs arranged in a plurality of columns and rows. FIG. 11A shows individual p-contacts 1140 for the micro-LEDs in micro-LED array 1100, two shared n-contacts 1130 near two edges of micro-LED array 1100, and n-contacts 1132 adjacent and between the mesa structures of individual micro-LEDs. FIG. 11B shows the cross-section along a line 1104.

In the example shown in FIG. 11B, micro-LED array 1100 may include an n-type semiconductor (e.g., GaN, InGaN, or GaInP) layer 1110, an active layer 1112 that may include one or more quantum wells, and a p-type semiconductor layer 1114. As described above, in some embodiments, at least a sublayer of n-type semiconductor layer 1110 may be heavily doped and thus mat have a higher conductivity for current spreading. Layers 1110, 1112, and 1114 may be etched to form individual mesa structures. A patterned dielectric layer 1120 (e.g., SiN) may be formed on the surfaces of the mesa structures as a barrier layer, and n-contacts 1130 and 1132 may be formed on the exposed n-type semiconductor layer 1110. The cross-sectional view along line 1104 in FIG. 11B shows n-contacts 1132 at locations where there may be larger gaps between adjacent mesa structures, such as the center of the diagonal line (e.g., along line 1104) between two adjacent mesa structures that are not in a same column or row of the two-dimensional micro-LED array 1100. In embodiments where the micro-LED may have a large pitch, n-contacts 1132 may also be at locations between adjacent mesa structures in a same row or column. A metal (e.g., aluminum) layer 1124 may be formed on dielectric layer 1120 and n-contacts 1130 and 1132. P-contacts 1140 may be formed on p-type semiconductor layers 1114 of the mesa structures. Regions between the mesa structures may be filled with a dielectric material 1126, such as $SiO_2$. Metal (e.g., Cu) interconnects 1150 may be formed in a dielectric layer 1152 to connect to p-contacts 1140 and n-contact 1130. A barrier and/or metal seed layer 1154 (e.g., TiN/Ti or TaN/Ta) may be between metal interconnects 1150 and dielectric layer 1152. Light extraction structures 1160 (e.g., micro-lenses) may be formed in n-type semiconductor layer 1110. An example of a process to manufacture micro-LED array 1100 is described in detail below. In some embodiments, an antireflective coating layer 1162 may be formed in light extraction structures 1160.

In some embodiments, light extraction structures 1160 may be formed on n-type semiconductor layer 1110 after micro-LED array 1100 is bonded to a driver circuit fabricated on a silicon wafer as described below, such that the silicon wafer may be used as the handle wafer and the processes can be performed from the side of n-type semiconductor layer 1110.

Figure 12:
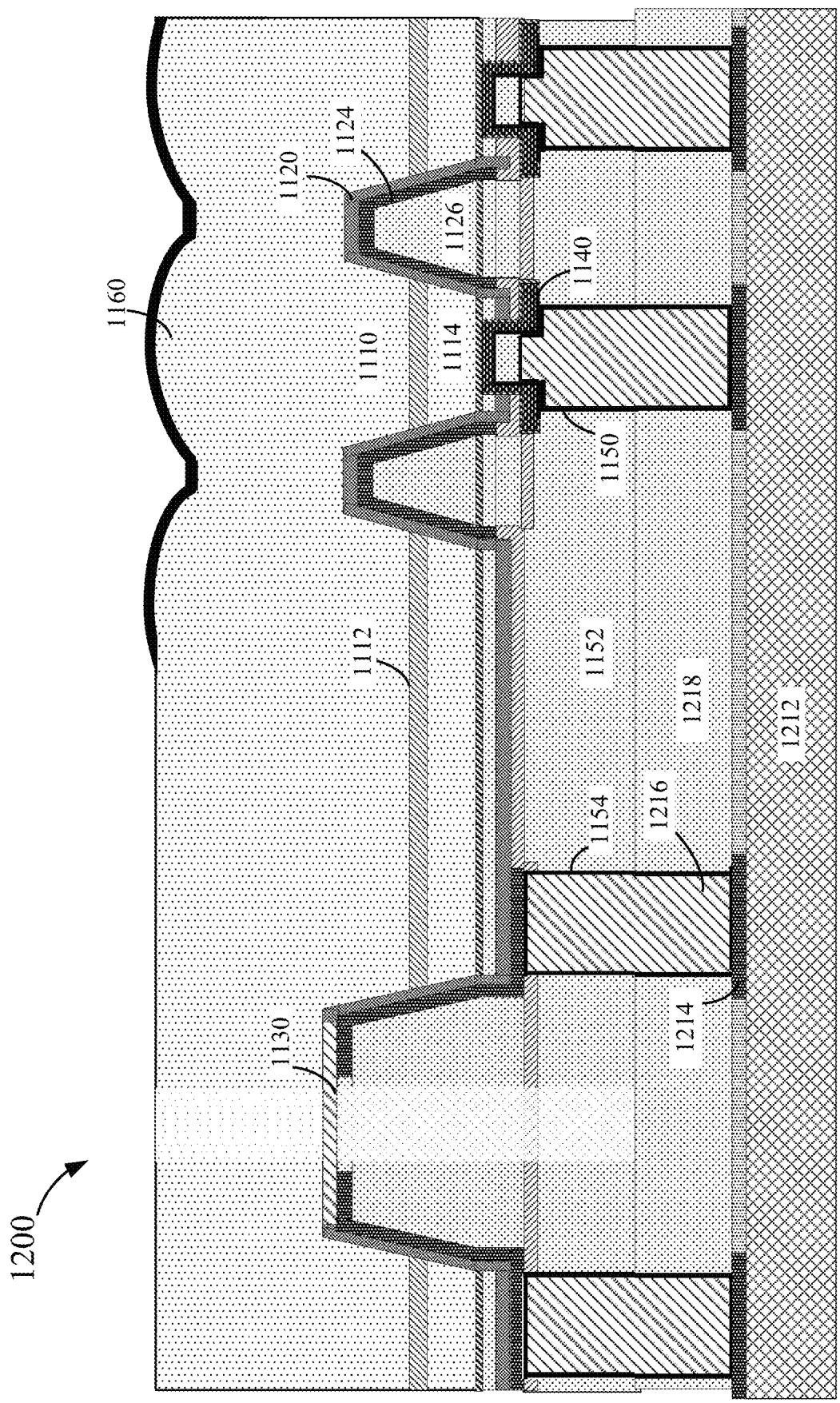
FIG. 12 illustrates an example of a micro-LED array bonded to a CMOS backplane according to certain embodiments.

FIG. 12 illustrates an example of a device 1200 including a micro-LED array (e.g., micro-LED array 1100) bonded to a CMOS backplane 1210 according to certain embodiments. CMOS backplane 1210 may include a substrate 1212, such as a silicon substrate. CMOS integrated circuits 1214, such as micro-LED driving circuits, may be fabricated on substrate 1212. CMOS backplane 1210 may also include metal (e.g., Cu) interconnects 1216 formed in a dielectric (e.g., SiO$_2$) layer 1218. Micro-LED array 1100 and CMOS backplane 1210 may be bonded such that metal interconnects 1150 and metal interconnects 1216 may be bonded together and dielectric layer 1152 and dielectric layer 1218 may be bonded together. FIG. 12 shows the cross-sectional view of micro-LED array 1100 long a line 1102 and thus n-contacts 1132 may not be viewable.

In some embodiments, the micro-LED array may be bonded to CMOS backplane 1210 using a die-to-wafer or wafer-to-wafer high-precision hybrid bonding process. For example, the surface of the micro-LED array wafer and the surface of the CMOS backplane wafer may be cleaned and then activated by a low temperature (e.g., room temperature) plasma surface activation process. The surface-activated wafers may be aligned and pre-bonded at low temperature (e.g., room temperature) to bond the dielectric layer on the surface of the micro-LED wafer to the dielectric layer on the surface of the CMOS backplane wafer. The pre-bonded wafers may then be annealed at an elevated temperature, such as about 180° C. to about 250° C., to bond metal pads on the micro-LED wafer to the metal pads on the CMOS backplane wafer.

Figure 13C:
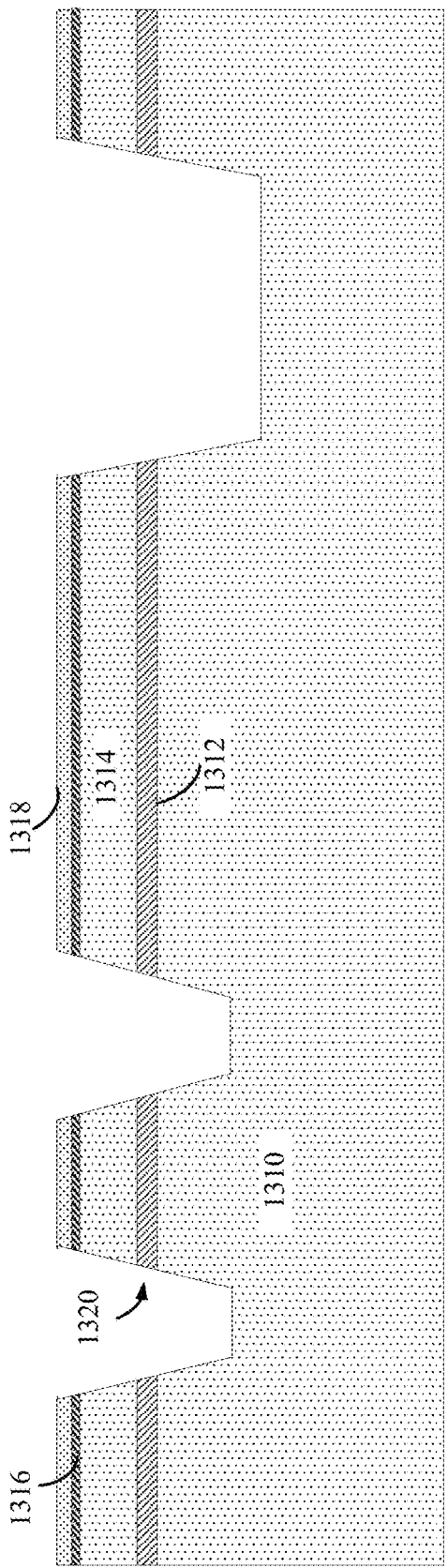
FIGS. 13A-13V illustrate examples of processes for fabricating a micro-LED array including a current spreading layer and multiple n-contacts according to certain embodiments.
Figure 13D:
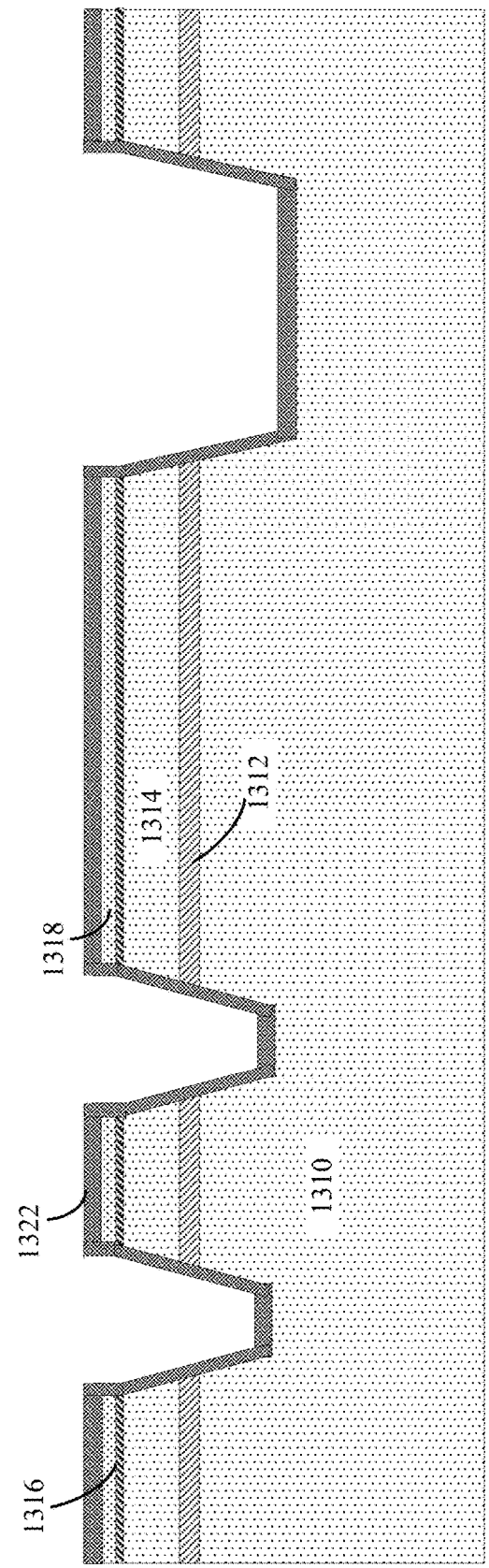

FIGS. 13A-13V illustrate examples of processes for fabricating micro-LED arrays, such as micro-LED array 900 or 1110, according to certain embodiments. FIG. 13A shows a layer stack including an n-type semiconductor (e.g., GaN, InGaN, or GaInP) layer 1310, an active layer 1312 that may include one or more quantum wells, and a p-type semiconductor layer 1314. The layer stack may also include a think ITO layer 1316 and a dielectric layer 1318 (e.g., a SiO$_2$ layer). Dielectric layer 1318 may be used as a hard mask layer for etching mesa structures. FIG. 13B illustrates that dielectric layer 1318 is patterned to open regions that may be etched to form mesa structures. FIG. 13C shows mesa structures 1320 being etched in p-type semiconductor layer 1314, active layer 1312, and at least a portion of n-type semiconductor layer 1310 by the etching. Dielectric layer 1318 may be at least partially etched away. FIG. 13D shows that a dielectric layer 1322 (e.g., SiN) is deposited on the surfaces of the structure formed by the etching, including the mesa top surfaces and sidewalls and the exposed surfaces of n-type semiconductor layer 1310. Dielectric layer 1322 may function as a barrier layer between the semiconductor layers and a metal layer.

Figure 13E:
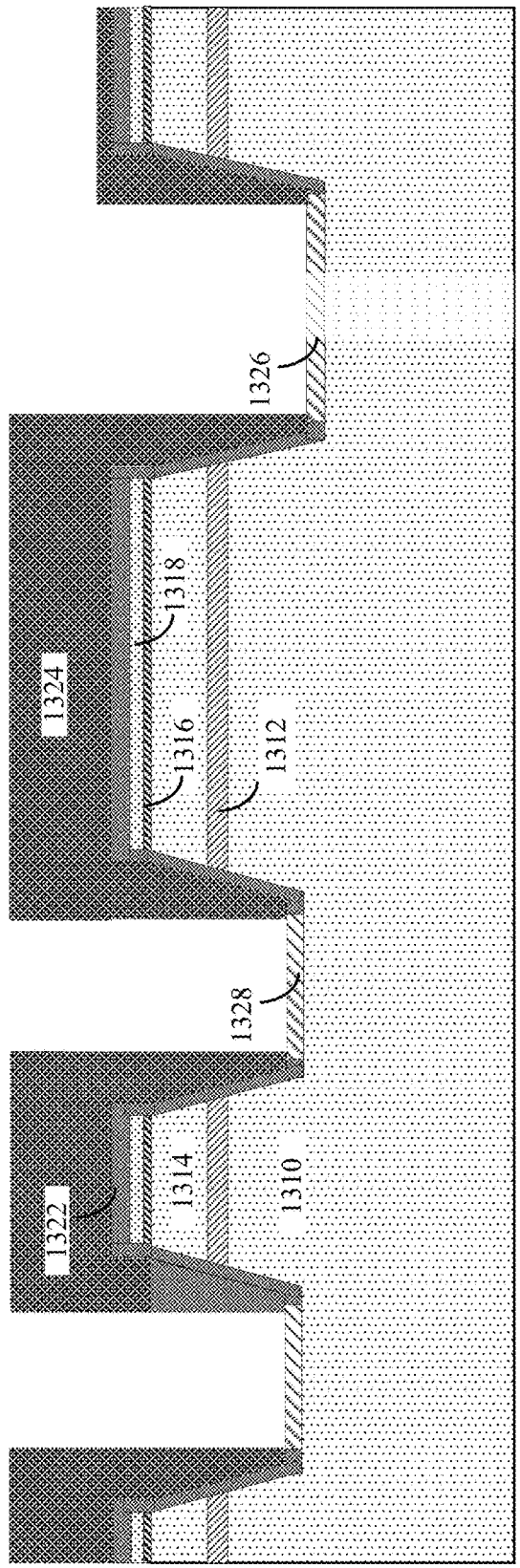
Figure 13F:
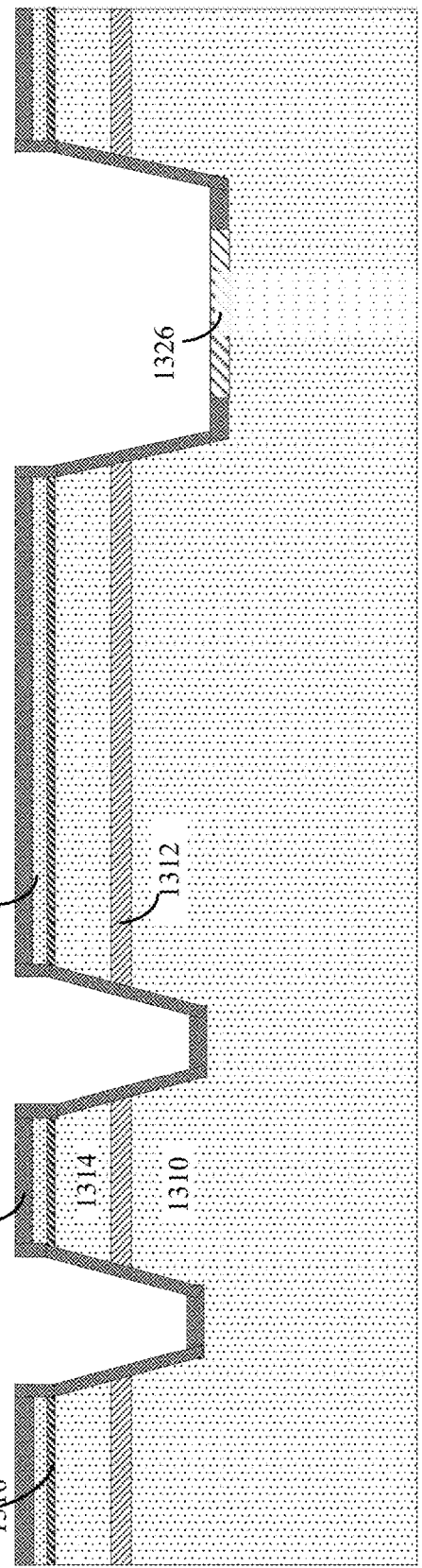

FIG. 13E shows that a patterned mask layer 1324 is formed on dielectric layer 1322. The exposed areas of dielectric layer 1322 may be etched to expose n-type semiconductor layer 1310. N-contacts 1326 and 1328 may be deposited (e.g., by sputtering) on the exposed surface of n-type semiconductor layer 1310. N-contact 1326 may be outside of the micro-LED array and near the edge of the micro-LED array, while n-contacts 1328 may be adjacent to the mesa structures. N-contacts 1326 and 1328 may include, for example, Al, Au, Ni, Ti, Pd, Ge, or any combination thereof, such as TiAu for blue and green micro-LEDs or PdAuGeTiAu for red micro-LEDs. The view shown in FIG. 13E may be a cross-sectional view along line 1104 shown in FIG. 11. N-contacts 1328 and 1326 may absorb visible light to improve the contrast ratio between the micro-LEDs in the micro-LED array. FIG. 13F shows the cross-sectional view of the micro-LED array along line 1102 in FIG. 11, where mask layer 1324 has been removed and n-contacts 1328 are not visible in the cross-sectional view.

Figure 13G:
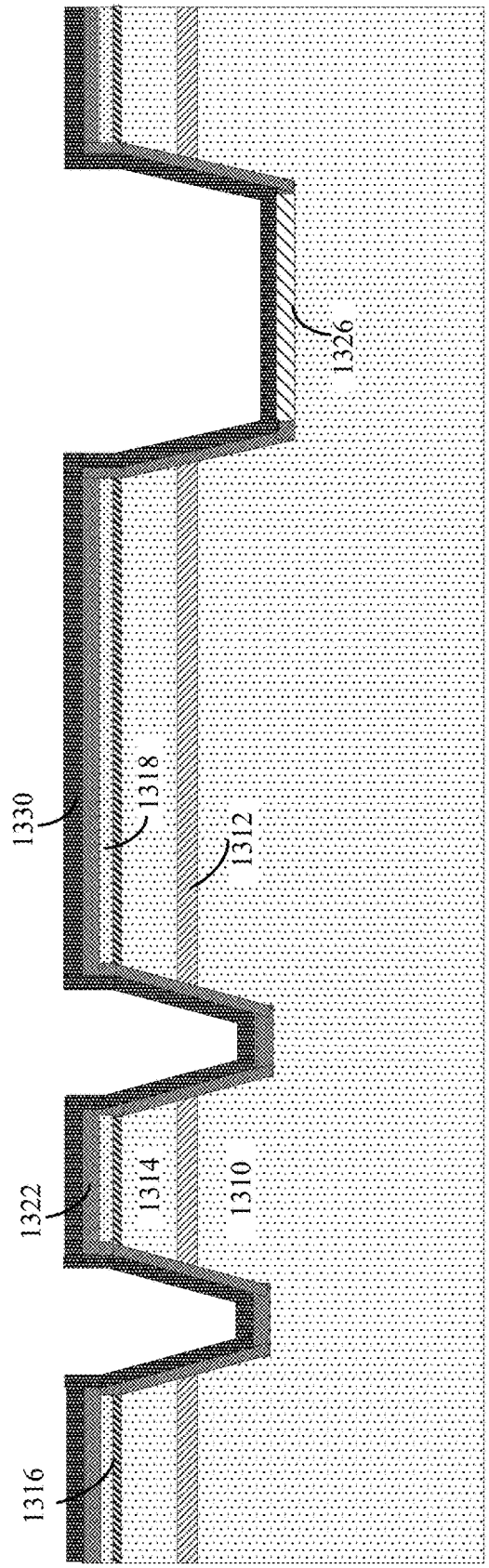
Figure 13H:
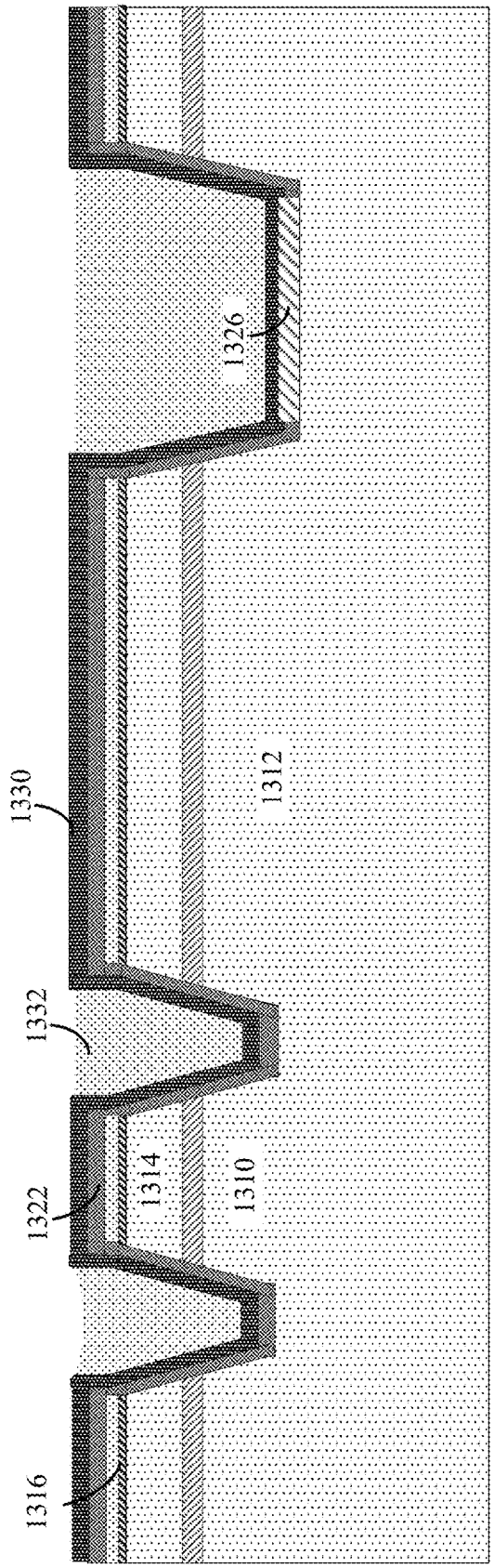

FIG. 13G shows that a metal layer 1330 may be deposited on dielectric layer 1322 and n-contacts 1326 and 1328. Metal layer 1330 may include, for example, Al, Au, TaN, ITO/Ag/TiN, or ITO/Ag/TaN/Ta. Metal layer 1330 may also form metal reflectors at sidewalls of the mesa structures. FIG. 13H shows that a dielectric layer 1332 (e.g., SiO$_2$) may be deposited on metal layer 1330. Dielectric layer 1332 may be planarized using, for example, chemical mechanical polishing (CMP) to remove the dielectric material on top of the mesa structures. Thus, the gaps between mesa structures may be filled with the dielectric material.

FIG. 13I shows that metal layer 1330 may be etched in some regions using a patterned resist layer 1334 and, for example, a dry etching process. FIG. 13J shows that a dielectric layer 1336 (e.g., SiN) may be deposited on top of the structure shown in FIG. 13I. Dielectric layer 1336 may be deposited using, for example, inductively coupled plasma-enhanced chemical vapor deposition (ICPECVD) techniques.

Figure 13K:
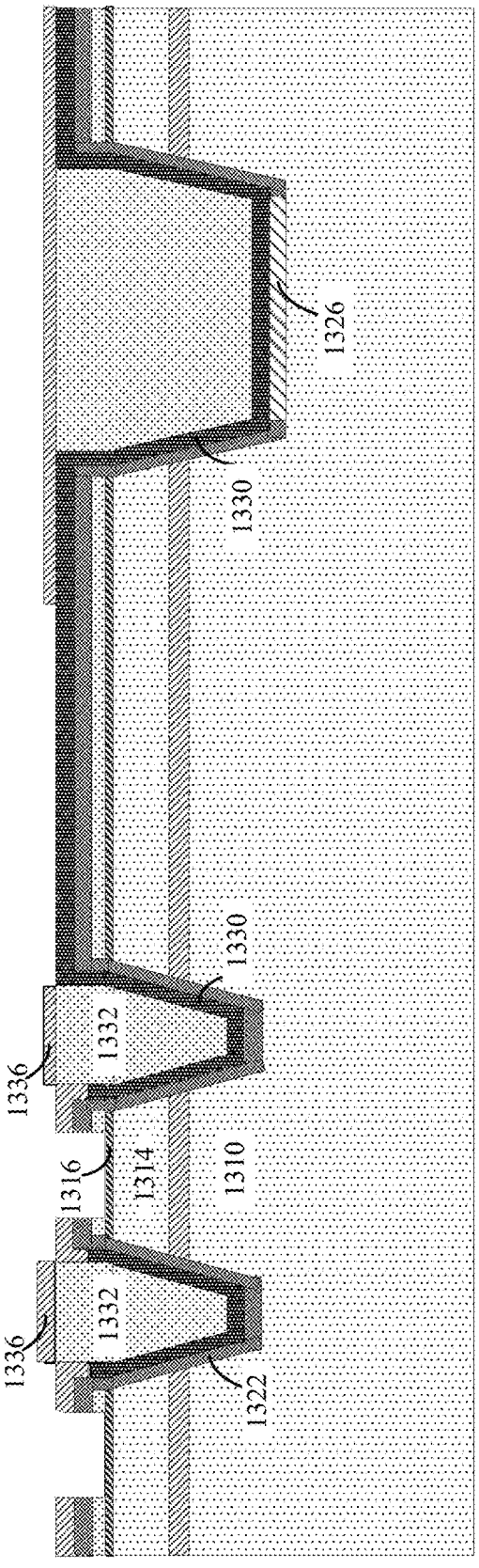
Figure 13L:
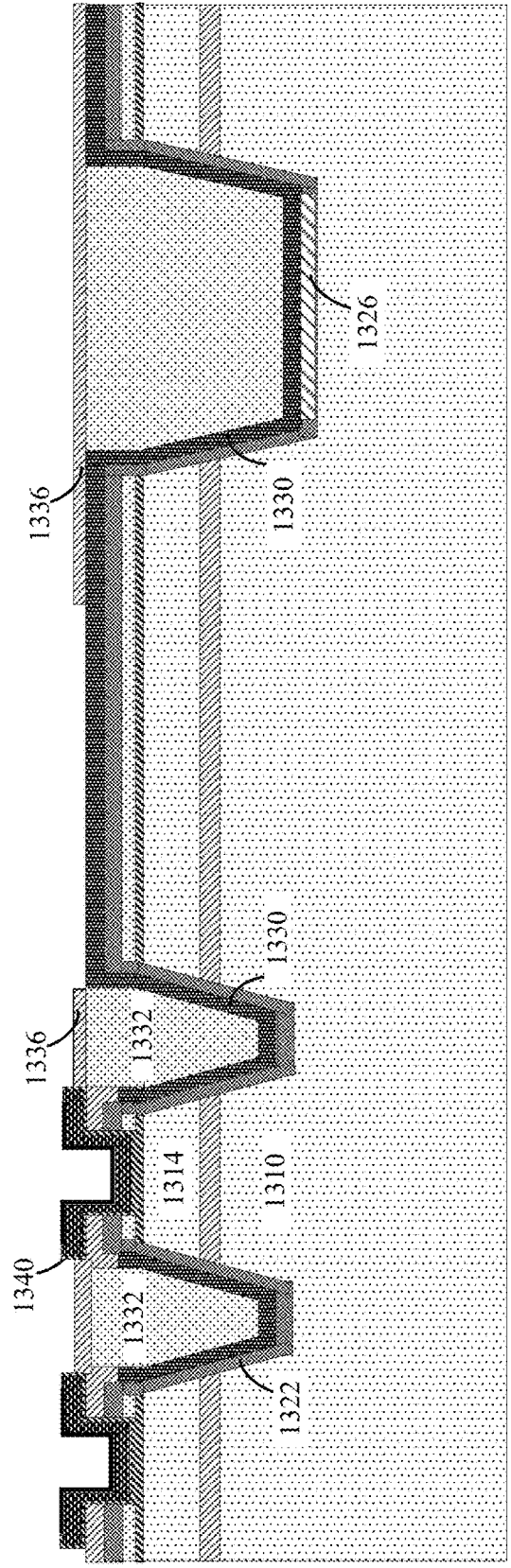

FIG. 13K shows that regions on top of the mesa structures have been etched to expose ITO layer 1316 or p-type semiconductor layer 1314. FIG. 13L shows that p-contacts 1340 may be formed in the etched regions on ITO layer 1316 or p-type semiconductor layer 1314. P-contacts 1340 may include a metal layer, such as an aluminum layer, and may be deposited by, for example, evaporation or sputtering. P-contacts 1340 may function as a reflector for reflecting emitted light to improve light extraction efficiency.

FIG. 13M shows a dielectric layer 1342 deposited on the structure shown in FIG. 13L using, for example, PECVD. A CMP process may be used to planarize the top surface of dielectric layer 1342. A lithography process may then be performed to form trenches 1344 in dielectric layer 1342. P-contacts 1340 may act as the etch stop layer for etching dielectric layer 1342.

FIG. 13N shows that a metal seed and/or barrier layer 1346 (e.g., TiN/Ti or TaN/Ta) may be deposited on sidewalls and bottom surfaces of trenches 1344 by, for example, physical vapor deposition (PVD) techniques. A copper layer may then be deposited by, for example, an electrochemical deposition (ECD) process, to fill trenches 1344. The copper layer may be annealed and planarized using, for example, CMP techniques, to form metal plugs 1348 in trenches 1344. Metal plugs 1348 may be the p-electrodes and the n-electrodes.

Figure 13O:
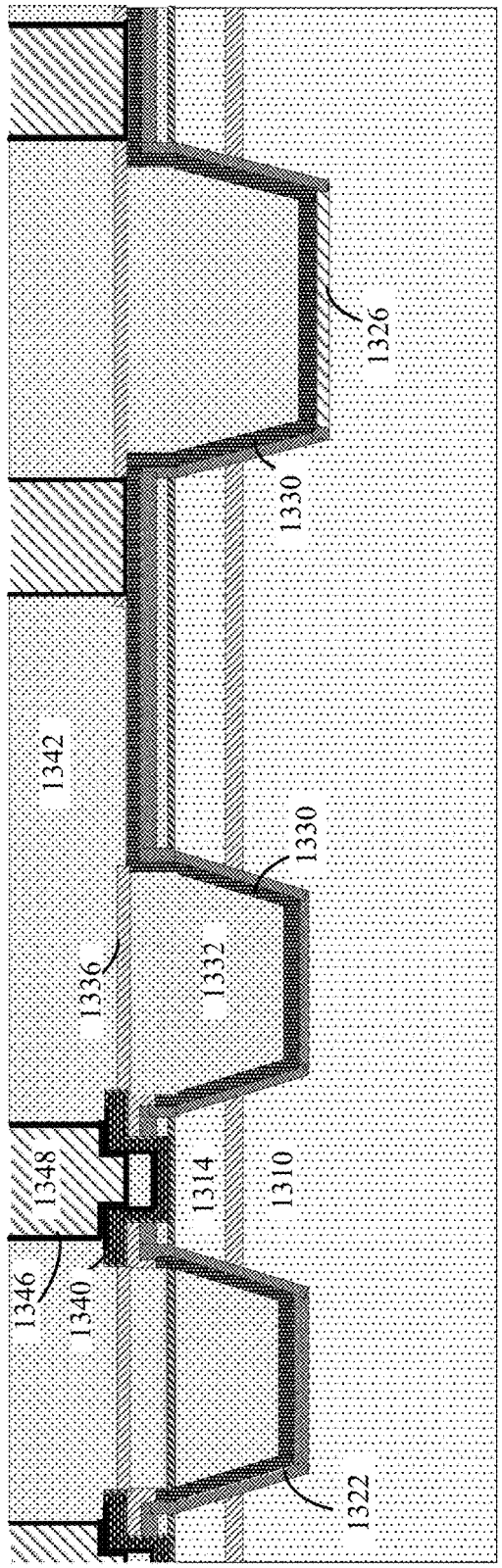

FIG. 13O is a cross-sectional view of an example of a micro-LED array (e.g., micro-LED array 900) formed by the processes described above with respect to FIGS. 13A-13N. FIG. 13O shows the cross-sectional view along a diagonal (e.g., line 904) of the micro-LED array. The example shown in FIG. 13O only includes shared n-contacts 1326 at the edges of the micro-LED array. The example of the micro-LED array shown in FIG. 13O may be made by a process in which n-contacts 1328 are not formed in operations shown in FIG. 13E.

Figure 13P:
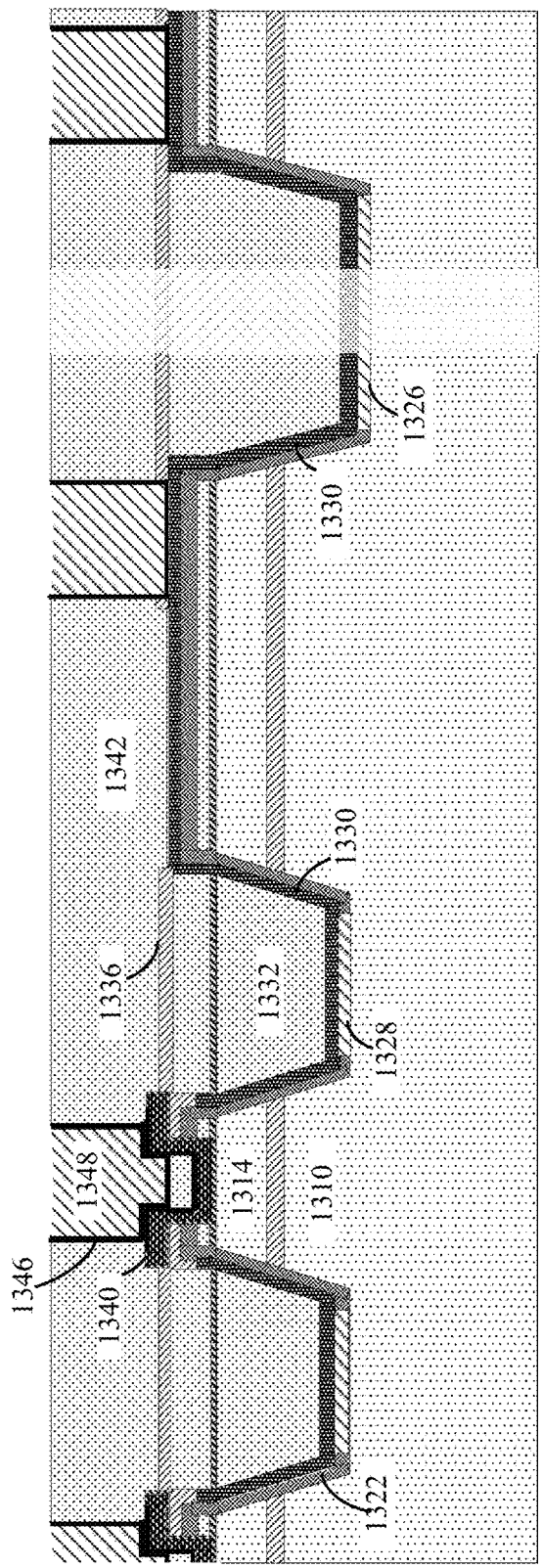

FIG. 13P is a cross-sectional view of an example of a micro-LED array (e.g., micro-LED array 1100) formed by the processes described above with respect to FIGS. 13A-13N. FIG. 13P shows the cross-sectional view along a diagonal (e.g., line 1104) of the micro-LED array. The example shown in FIG. 13P includes both shared n-contacts 1326 at the edges of the micro-LED array and shared n-contacts 1328 adjacent to the individual micro-LEDs.

In some embodiments, after the processes described above with respect to FIGS. 13A-13N, the resultant structure may be bonded to a CMOS backplane, such as CMOS backplane 1010 or 1210 as described above with respect to, for example, FIG. 10 and FIG. 12. The CMOS backplane may be used as the support wafer and the processes described below can be performed from the side of n-type semiconductor layer 1310. The CMOS backplane is not shown in FIGS. 13Q-13S below.

Figure 13Q:
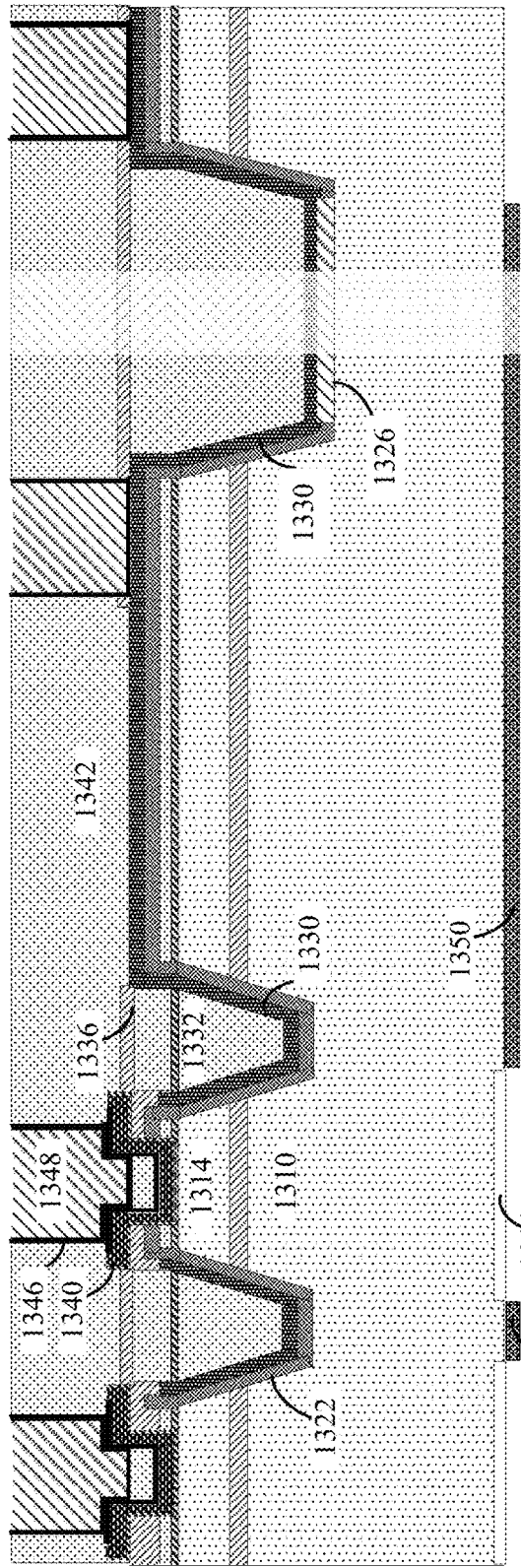

FIG. 13Q shows a metal layer 1350 deposited on the back surface of n-type semiconductor layer 1310 by, for example, a sputtering process. Metal layer 1350 may include, for example, Al, Au, Ni, Ti, Pd, Ge, or any combination thereof, such as TiAu, AuGeAu, or PdAuGeTiAu. Metal layer 1350 may be used as the current spreading layer and may form n-contacts of the micro-LEDs. Metal layer 1350 may also form metal absorbers at the back surface of n-type semiconductor layer 1310 to absorb parasitic internal light in n-type semiconductor layer 1310 or to absorb external light and reduce external light reflection, thereby improving the contrast ratio between the micro-LEDs in the micro-LED array of the μLED display to, for example, greater than about 30:1 or greater than about 100:1. As shown in FIG. 13Q, metal layer 1350 may be etched, for example, by a selective wet etching process, to form a patterned re-contact layer that includes individual n-contacts 1352 on the back surface of n-type semiconductor layer 1310. In some embodiments, a portion 1354 of n-type semiconductor layer 1310 may also be etched.

Figure 13R:
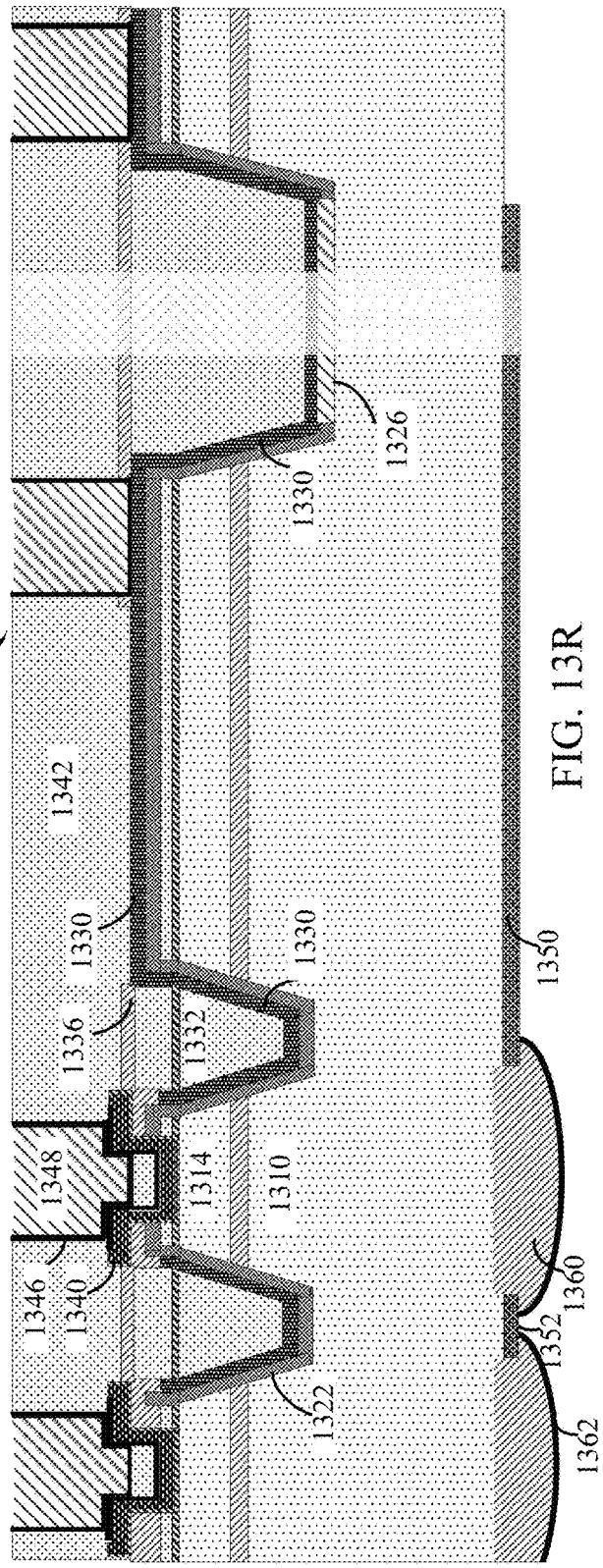

FIG. 13R shows micro-lenses 1360 form on n-type semiconductor layer 1310 between n-contacts 1352. Micro-lenses 1360 may be formed by, for example, depositing a dielectric layer (e.g., a SiN layer), coating a photoresist layer on the dielectric layer, patterning the photoresist layer and reflowing the photoresist (or using a gray-scale photolithography process) to form micro-lenses in the photoresist, and then transferring the shape of the photoresist to the dielectric layer to form micro-lenses 1360 in the dielectric layer by etching both the photoresist and the dielectric layer. In some embodiments, an antireflection layer 1362 (e.g., a $SiO_2$ layer) may be formed on surfaces of micro-lenses 1360 by, for example, $SiO_2$ ICPECVD or PECVD. The processes described with respect to FIGS. 13Q and 13R may be used to form individual n-contacts on the back surface of n-type semiconductor layer 1310 as in micro-LED array 900 and device 1000.

Figure 13S:
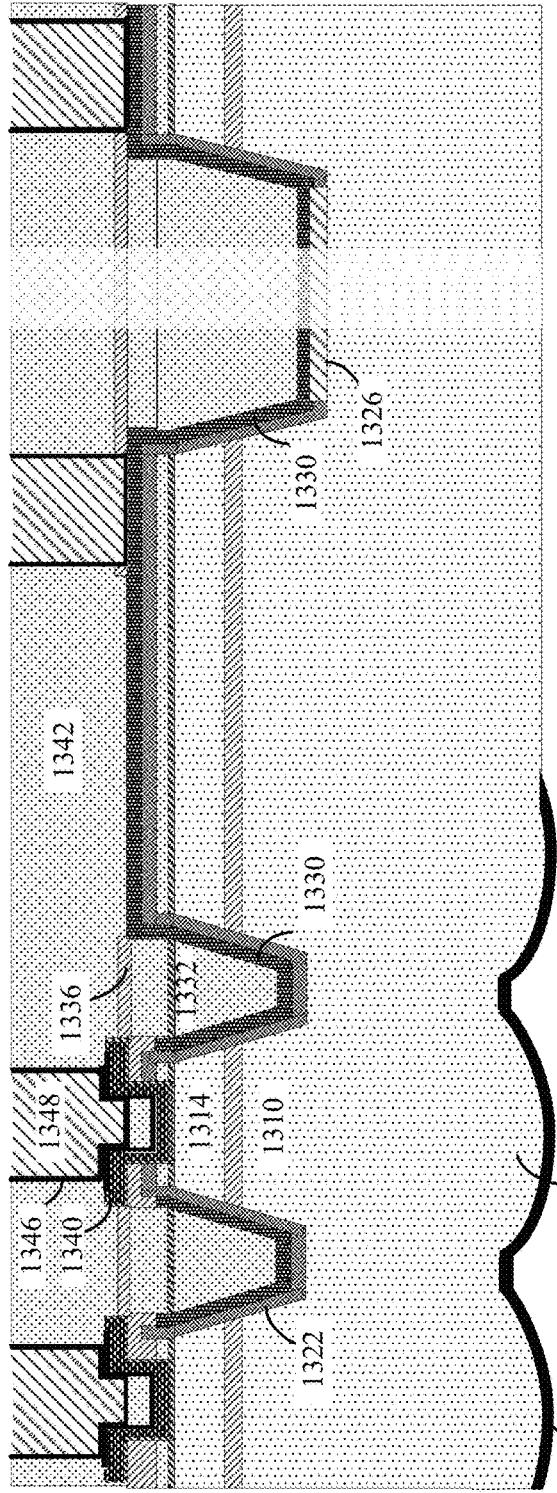
Figure 13T:
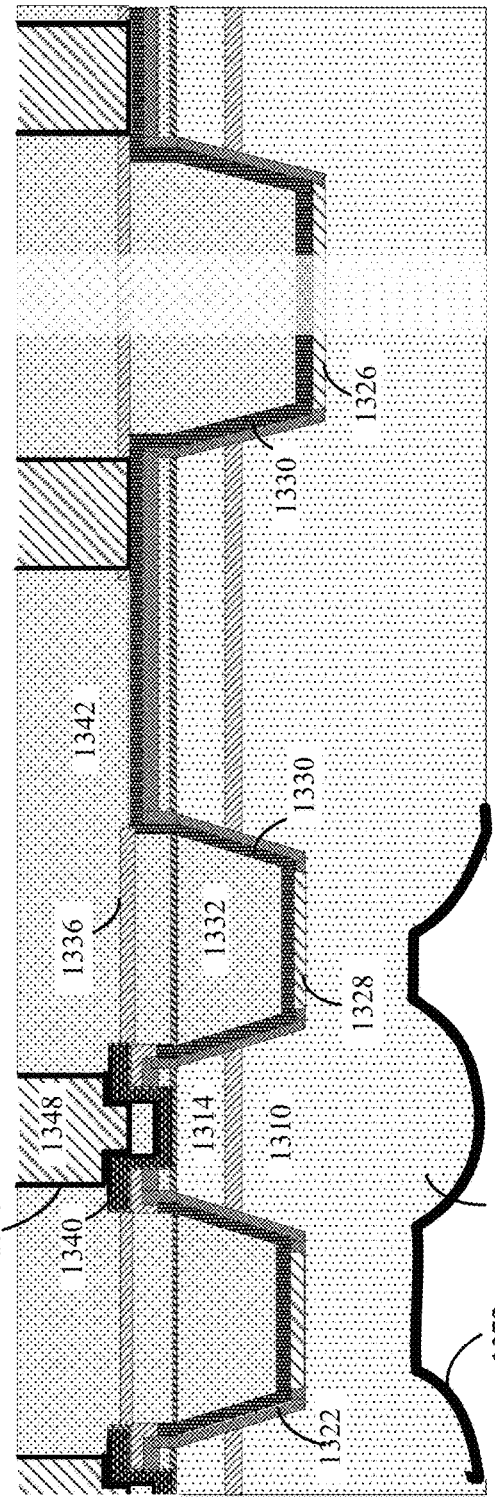

FIGS. 13S and 13T show micro-lenses 1370 formed on n-type semiconductor layer 1310. FIG. 13S shows the cross-sectional view along a column or row (e.g., along line 1102) of the micro-LED array. FIG. 13T shows the cross-sectional view along a diagonal (e.g., along line 1104) of the micro-LED array. Micro-lenses 1370 may be formed by, for example, coating a photoresist layer on n-type semiconductor layer 1310, patterning the photoresist layer and reflowing the photoresist (or using a gray-scale photolithography process) to form micro-lenses in the photoresist, and then transferring the shape of the photoresist to n-type semiconductor layer 1310 in one- or two-step etching to form micro-lenses 1370 in n-type semiconductor layer 1310. For example, the shape on the photoresist may be directly transferred to n-type semiconductor layer 1310 by etching both the photoresist and n-type semiconductor layer 1310 in a single etch step, or may be first transferred to an intermediate layer (e.g., a $SiO_2$ layer) in a first etch step and then transferred from the intermediate layer to n-type semiconductor layer 1310 in a second etch step. In some embodiments, an antireflection layer 1372 (e.g., a $SiO_2$ layer) may additionally be formed on surfaces of micro-lenses 1370 by, for example, $SiO_2$ ICPECVD or PECVD. The processes described with respect to FIGS. 13S and 13T may be used to form the light extraction structures 1260 in micro-LED array 1100 and device 1200 described above.

FIGS. 13U and 13V show an embodiment of a micro-LED array including an additional metal layer 1380 deposited on the back surface of n-type semiconductor layer 1310 by, for example, a sputtering process. FIG. 13U shows the cross-sectional view along a column or row (e.g., along line 1102) of the micro-LED array. FIG. 13V shows the cross-sectional view along a diagonal (e.g., along line 1104) of the micro-LED array. Metal layer 1380 may be similar to metal layer 1350, and may include, for example, Al, Au, Ni, Ti, Pd, Ge, or any combination thereof, such as TiAu, AuGeAu, or PdAuGeTiAu. Metal layer 1380 may be used as an additional current spreading layer and additional n-contacts of the micro-LEDs. Metal layer 1380 may also form metal absorbers at the back surface of n-type semiconductor layer 1310 to absorb parasitic internal light in n-type semiconductor layer 1310 or to reduce external light reflection, thereby (in combination with n-contacts 1326 and 1328 and/or metal layer 1330) improving the contrast ratio between the micro-LEDs in the micro-LED array of the μLED display to, for example, greater than about 30:1 or greater than about 100:1.

Figure 14:
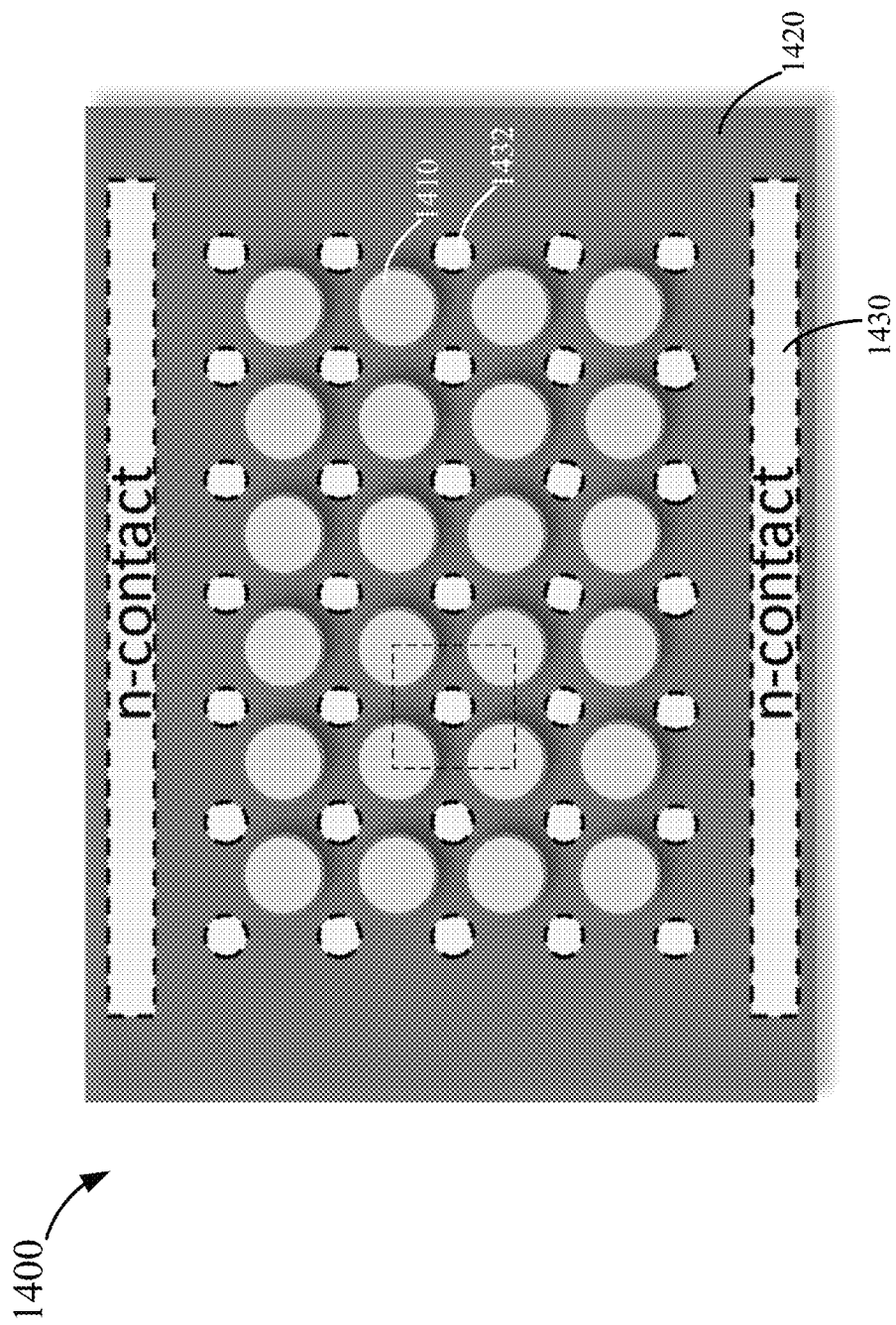
FIG. 14 is a top view of an example of a micro-LED array showing a current spreading layer and multiple n-contacts according to certain embodiments.

FIG. 14 is a top view of an example of a micro-LED array 1400 showing a current spreading layer and multiple n-contacts according to certain embodiments. FIG. 14 shows a two-dimensional array of p-contacts 1410 for a two-dimensional array of micro-LEDs. A metal layer 1420 (e.g., an aluminum layer) may be in other regions of micro-LED array 1400, such as the sidewalls of the mesa structures, the bottom surfaces of the gaps between mesa structures, and regions where no mesa structures are formed (e.g., the edge regions). Large n-contacts 1430 and individual n-contacts 1432 may be under metal layer 1420 and may be in contact with metal layer 1420 and an n-type semiconductor layer. Thus, metal layer 1420 may be a current spreading layer for connecting n-type semiconductor layer of each mesa structure (through n-contacts 1432 and large n-contacts 1430) to a common n-electrode. Thus, the current from each micro-LED may flow from the n-type semiconductor layer of the micro-LED, through the two-dimensional array of n-contacts 1432 and large n-contacts 1430, to metal layer 1420 and the n-electrode. Therefore, the resistance of the electrical path of the current flow can be low to reduce resistive loss and voltage drop.

Figure 15:
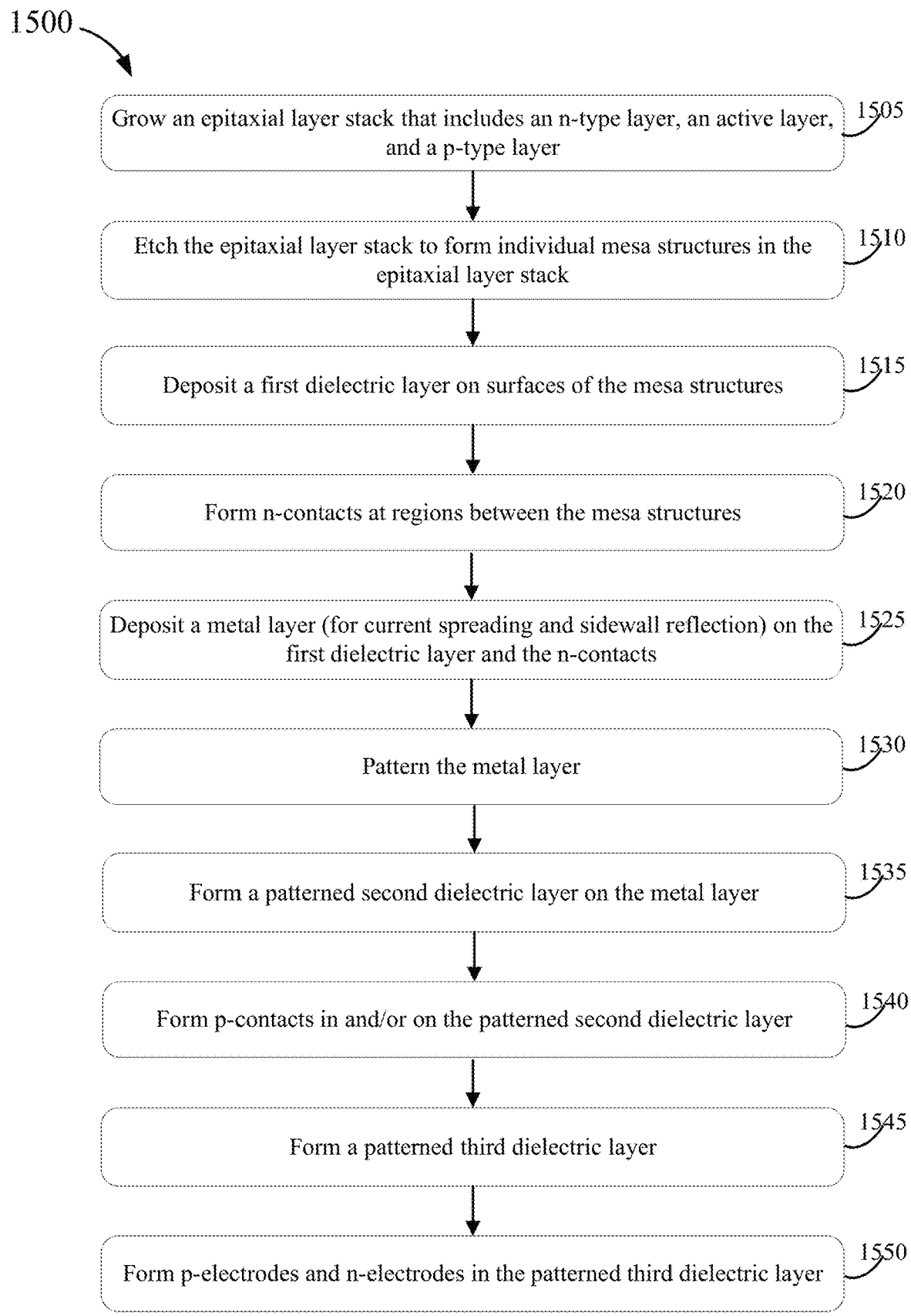
FIG. 15 illustrates an example of a method of fabricating a micro-LED array including a current spreading layer and multiple n-contacts according to certain embodiments.

FIG. 15 includes a flowchart 1500 illustrating an example of a method of fabricating a micro-LED array including a current spreading layer and multiple n-contacts according to certain embodiments. It should be appreciated that the specific operations illustrated in FIG. 15 provide a particular process of fabricating a micro-LED array including a current spreading layer and multiple n-contacts. Other sequences of steps may also be performed according to alternative embodiments. For example, alternative embodiments may perform the operations outlined above in a different order. Moreover, the individual operations illustrated in FIG. 15 may include multiple sub-steps that may be performed in various sequences as appropriate to the individual operation. Furthermore, additional operations may be added or some operations may not be performed depending on the particular applications. One of ordinary skill in the art would recognize many variations, modifications, and alternatives.

At block 1505, a layer stack may be epitaxially grown on a substrate. As described above with respect to, for example, FIGS. 7A-8B and 13A, the layer stack may include an n-type semiconductor layer, an active layer, and a p-type semiconductor layer. The active layer may include one or more epitaxial layers, which may form one or more quantum wells each between two barrier layers. In some embodiments, a transparent conductive layer (e.g., ITO) layer may be formed on the p-type semiconductor layer.

At block 1510, the epitaxially grown layer stack may be etched to form individual mesa structures in the layer stack. As illustrated by the example shown in FIGS. 13A-13C, the mesa structures may be etched by patterning an etch mask layer (e.g., a dielectric layer) on the layer stack and etching the layer stack using the patterned etch mask layer to the n-type semiconductor layer, such that each mesa structure includes a portion of the n-type semiconductor layer, the active layer, and the p-type semiconductor layer. As described above, the mesa structures may have various shapes, such as a cylindrical, conical, or parabolic shape. The mesa structures may include a two-dimensional array of mesa structures as shown in, for example, FIGS. 8A, 9A, and 11A. The mesa structures may each have a linear lateral dimension less than about 5 µm, less than about 3 µm, less than about 2 µm, or less than about 1 µm. The pitch or period of the two-dimensional array of mesa structures may be less than about 5 µm, less than about 3 µm, less than about 2 µm, or less than about 1 µm.

At block 1515, a first dielectric layer may be deposited on surfaces of the mesa structures. As shown in the example illustrated in FIG. 13D, the first dielectric layer may be deposited on the top surfaces and sidewalls of the mesa structures and the exposed surfaces of the n-type semiconductor layer in regions between the mesa structures. In one example, the dielectric layer may include a SiN layer. The dielectric layer may function as a barrier layer between the semiconductor layers and metal materials that may be deposited on the dielectric layer in later processes.

At block 1520, n-contacts may be formed at regions between the mesa structures. For example, as shown in FIG. 11A, FIG. 13E, and FIG. 13F, n-contacts may be formed at edge regions of the two dimensional array of mesa structures. N-contacts may also be formed at regions near the mesa structures, such as at a center of a square region including four adjacent mesa structures. The n-contacts may be formed by etching the first dielectric layer at selected regions to expose regions of the n-type semiconductor layer and then depositing metal materials on the exposed regions of the n-type semiconductor layer. As described above, the n-contacts may include, for example, Al, Au, Ni, Ti, Pd, Ge, or any combination thereof, such as TiAu for blue and green micro-LEDs or PdAuGeTiAu for red micro-LEDs.

At block 1525, a metal layer may be deposited on the dielectric layer and the n-contacts as shown in, for example, FIG. 13G. The metal layer may include, for example, Al, Au, ITO/Ag/TaN/Ta, ITO/Ag/TiN, and the like, and may have a thickness greater than about 50 nm, greater than about 100 nm, or greater than about 150 nm. The metal layer may contact the n-contacts and thus may be used for current spreading to the n-contacts. The metal layer may also be used to form mesa sidewall reflector with the first dielectric layer.

At block 1530, the metal layer may be patterned to remove the metal layer at some regions. In one example shown in FIGS. 13H and 13I, a dielectric material (e.g., SiO$_2$) may be deposited on the metal layer to fill the gaps between the mesa structures, the dielectric layer may be planarized, a patterned resist layer may be formed on the planarized surface, and then certain regions of the metal layer may be etched using the pattern resist layer as the etch mask.

At block 1535, a second dielectric layer may be formed and patterned on the metal layer. The second dielectric layer may include, for example, a SiN layer deposited on the metal layer by ICPECVD and/or ALD. The second dielectric layer may be etched away at regions on top of the mesa top surfaces. An example of the patterned second dielectric layer (e.g., dielectric layer 1336) is shown in FIG. 13K.

At block 1540, p-contacts may be formed in and/or on the patterned second dielectric layer. The p-contacts may include, for example, Al, ITO/Au, Ag/TiN, or the like. The p-contact may be formed by, for example, evaporation or sputtering followed by etching using an etch mask. FIG. 13L illustrates examples of p-contacts on the p-type semiconductor layer of the mesa structures.

At block 1545, a third dielectric layer may be deposited on top of the structure formed after the operations at block 1540. The third dielectric layer may include, for example, SiO$_2$. The third dielectric layer may be relatively thick, such as about a few hundred nanometers or about a micrometer. The third dielectric layer may be planarized and patterned using a lithography process and an etch process to expose the p-contacts and regions of the metal layer connected to the n-contacts as shown in FIG. 13M. The metal materials of the p-contacts and the metal layer may be used as the etch stop layer for patterning the third dielectric layer.

At block 1550, p-electrodes and n-electrodes may be formed in the patterned third dielectric layer. For example, a barrier and/or metal seed layer, such as TiN/Ti or TaN/Ta may be deposited on the sidewalls of the openings in third dielectric layer, and then copper may be deposited in the openings and on the third dielectric layer. The copper material may contact the p-contacts and the metal layer connected to the n-contacts, and thus may form p-electrodes and n-electrodes in the third dielectric layer. The copper may be annealed and planarized to form a relatively flat surface with copper pads at the surface, as shown in FIGS. 13N-13P. The copper pads may be used to bond with metal contact pads on an electrical integrated circuit, such as an electrical backplane, as described above and below.

Figure 16:
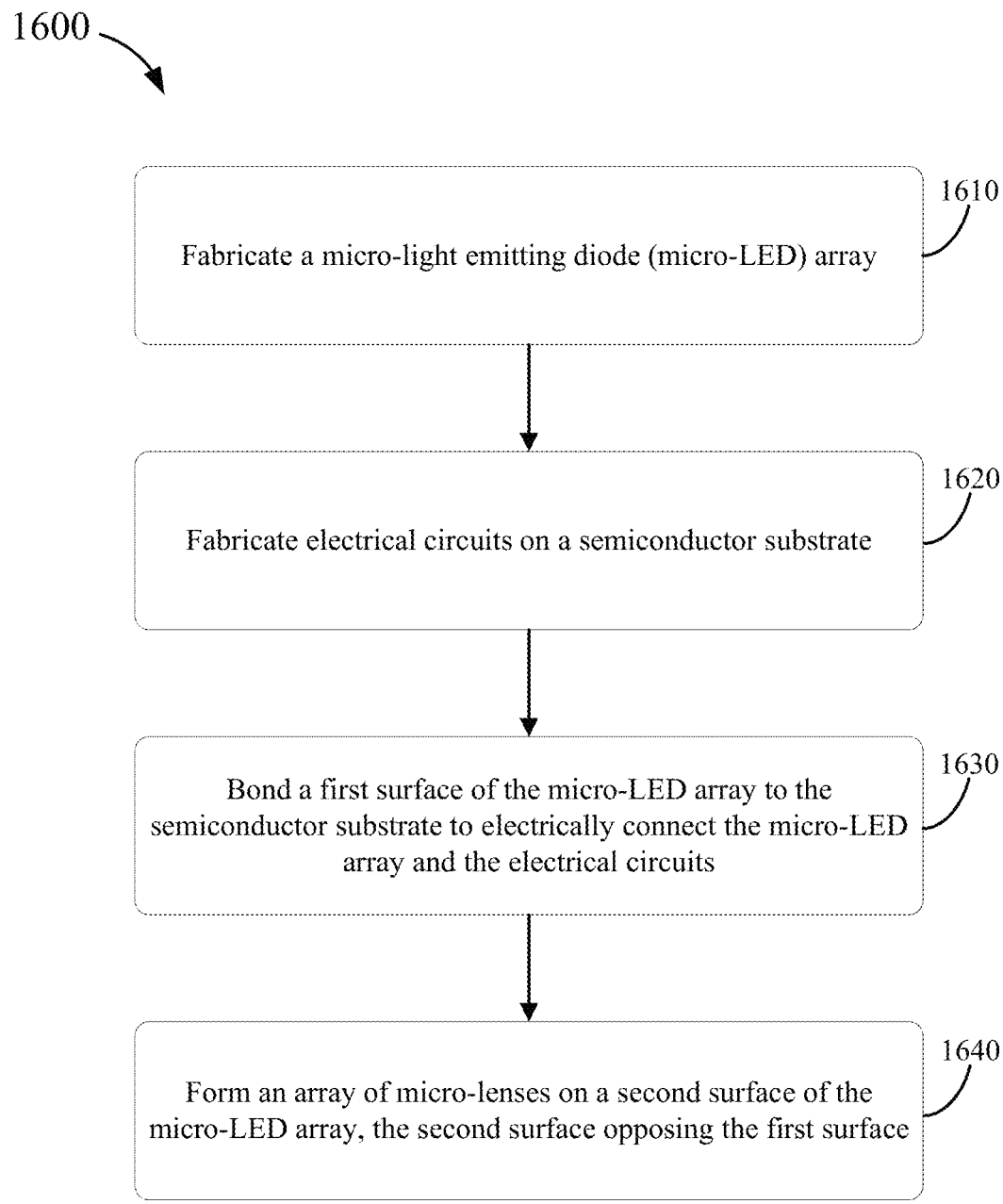
FIG. 16 illustrates an example of a method of fabricating a display device including a micro-LED array according to certain embodiments.

FIG. 16 includes a flowchart 1600 illustrating an example of a method of fabricating a display device including a micro-LED array according to certain embodiments. It should be appreciated that the specific operations illustrated in FIG. 16 provide a particular process of fabricating a display device including an array of micro-LEDs. Other sequences of steps may also be performed according to alternative embodiments. For example, alternative embodiments may perform the operations outlined above in a different order. Moreover, the individual operations illustrated in FIG. 16 may include multiple sub-steps that may be performed in various sequences as appropriate to the individual operation. Furthermore, additional operations may be added or some operations may not be performed depending on the particular applications. One of ordinary skill in the art would recognize many variations, modifications, and alternatives.

Operations in block 1610 may include fabricating a micro-LED array. In one example, the micro-LED array may be fabricated using the method described above with respect to, for example, FIGS. 13A-13P and FIG. 15. The micro-LED array may include a two-dimensional array of micro-LEDs, where each micro-LED may have a lateral dimension less than about a few micrometers or one micrometer, and the pitch of the micro-LED array may be less than about a few micrometers or one micrometer. A first (e.g., top) surface of the micro-LED array may include metal contact pads that are connected to the electrodes of the micro-LEDs in the micro-LED array.

Operations in block 1620 may include fabricating electrical circuits on a semiconductor substrate. The electrical circuits and the semiconductor substrate may form an electrical backplane (e.g., CMOS backplane 1010 or 1210) that includes driving circuits for driving the micro-LED array. The top surface of the electrical backplane may include metal contact pads.

Operations in block 1630 may include bonding the first surface of the micro-LED array to the top surface of the electrical backplane. The metal contact pads on the first surface of the micro-LED array may be bonded to the metal contact pads on the top surface of the electrical backplane to electrically connect the micro-LED array and the electrical circuits. Dielectric materials at the surfaces of the micro-LED array and the electrical backplane may also be bonded together.

In some embodiments, the micro-LED array may be bonded to the CMOS backplane using a die-to-wafer or wafer-to-wafer hybrid bonding process. For example, the surface of the micro-LED array wafer and the surface of the CMOS backplane wafer may be cleaned and then activated by a low temperature (e.g., room temperature) plasma surface activation process. The surface-activated wafers may be aligned and pre-bonded at low temperature (e.g., room temperature) to bond the dielectric layer on the surface of the micro-LED wafer to the dielectric layer on the surface of the CMOS backplane wafer. The pre-bonded wafers may then be annealed at an elevated temperature, such as about 180° C. to about 250° C., to bond metal pads on the micro-LED wafer to the metal pads on the CMOS backplane wafer.

Operations in block 1640 may include forming an array of micro-lenses on a second surface of the micro-LED array that opposes the first surface. The micro-lenses may be etched in the substrate or the n-type semiconductor layer of the micro-LED array or may be etched in a material layer deposited on the substrate of the micro-LED array. In some embodiments, an antireflection layer may be coated in the micro-lenses. In some embodiments, n-contacts may be formed at the regions of the second surface of the micro-LED array between the micro-lenses. The n-contacts between the micro-lenses may absorb internal and external visible light to improve the contrast ratio between the micro-LEDs in the micro-LED array.

One or two-dimensional arrays of the LEDs described above may be manufactured on a wafer to form light sources (e.g., light source 642). Driver circuits (e.g., driver circuit 644) may be fabricated, for example, on a silicon wafer using CMOS processes. The LEDs and the driver circuits on wafers may be diced and then bonded together, or may be bonded on the wafer level and then diced. Various bonding techniques can be used for bonding the LEDs and the driver circuits, such as adhesive bonding, metal-to-metal bonding, metal oxide bonding, wafer-to-wafer bonding, die-to-wafer bonding, hybrid bonding, and the like.

FIG. 17A illustrates an example of a method of die-to-wafer bonding for arrays of LEDs according to certain embodiments. In the example shown in FIG. 17A, an LED array 1701 may include a plurality of LEDs 1707 on a carrier substrate 1705. Carrier substrate 1705 may include various materials, such as GaAs, InP, GaN, AlN, sapphire, SiC, Si, or the like. LEDs 1707 may be fabricated by, for example, growing various epitaxial layers, forming mesa structures, and forming electrical contacts or electrodes, before performing the bonding. The epitaxial layers may include various materials, such as GaN, InGaN, AlGaN (including AlGaN for infrared or mid-infrared), (AlGaIn)P, (AlGaIn)AsP, (AlGaIn)AsN, (Eu:InGa)N, (AlGaIn)N, InSb, or the like, and may include an n-type layer, a p-type layer, and an active layer that includes one or more heterostructures, such as one or more quantum wells or MQWs. The electrical contacts may include various conductive materials, such as a metal or a metal alloy.

A wafer 1703 may include a base layer 1709 having passive or active integrated circuits (e.g., driver circuits 1711) fabricated thereon. Base layer 1709 may include, for example, a silicon wafer. Driver circuits 1711 may be used to control the operations of LEDs 1707. For example, the driver circuit for each LED 1707 may include a 2T1C pixel structure that has two transistors and one capacitor. Wafer 1703 may also include a bonding layer 1713. Bonding layer 1713 may include various materials, such as a metal, an oxide, a dielectric, CuSn, AuTi, and the like. In some embodiments, a patterned layer 1715 may be formed on a surface of bonding layer 1713, where patterned layer 1715 may include a metallic grid made of a conductive material, such as Cu, Ag, Au, Al, or the like.

LED array 1701 may be bonded to wafer 1703 via bonding layer 1713 or patterned layer 1715. For example, patterned layer 1715 may include metal pads or bumps made of various materials, such as CuSn, AuSn, or nanoporous Au, that may be used to align LEDs 1707 of LED array 1701 with corresponding driver circuits 1711 on wafer 1703. In one example, LED array 1701 may be brought toward wafer 1703 until LEDs 1707 come into contact with respective metal pads or bumps corresponding to driver circuits 1711. Some or all of LEDs 1707 may be aligned with driver circuits 1711, and may then be bonded to wafer 1703 via patterned layer 1715 by various bonding techniques, such as metal-to-metal bonding. After LEDs 1707 have been bonded to wafer 1703, carrier substrate 1705 may be removed from LEDs 1707.

FIG. 17B illustrates an example of a method of wafer-to-wafer bonding for arrays of LEDs according to certain embodiments. As shown in FIG. 17B, a first wafer 1702 may include a substrate 1704, a first semiconductor layer 1706, active layers 1708, and a second semiconductor layer 1710. Substrate 1704 may include various materials, such as GaAs, InP, GaN, AlN, sapphire, SiC, Si, or the like. First semiconductor layer 1706, active layers 1708, and second semiconductor layer 1710 may include various semiconductor materials, such as GaN, InGaN, AlGaN (including AlGaN for infrared and mid-infrared), (AlGaIn)P, (AlGaIn)AsP, (AlGaIn)AsN, (Eu:InGa)N, (AlGaIn)N, InSb, or the like. In some embodiments, first semiconductor layer 1706 may be an n-type layer, and second semiconductor layer 1710 may be a p-type layer. For example, first semiconductor layer 1706 may be an n-doped GaN layer (e.g., doped with Si or Ge), and second semiconductor layer 1710 may be a p-doped GaN layer (e.g., doped with Mg, Ca, Zn, or Be). Active layers 1708 may include, for example, one or more GaN layers, one or more InGaN layers, one or more AlInGaP layers, and the like, which may form one or more heterostructures, such as one or more quantum wells or MQWs.

In some embodiments, first wafer 1702 may also include a bonding layer. Bonding layer 1712 may include various materials, such as a metal, an oxide, a dielectric, CuSn, AuTi, or the like. In one example, bonding layer 1712 may include p-contacts and/or n-contacts (not shown). In some embodiments, other layers may also be included on first wafer 1702, such as a buffer layer between substrate 1704 and first semiconductor layer 1706. The buffer layer may include various materials, such as polycrystalline GaN or AlN. In some embodiments, a contact layer may be between second semiconductor layer 1710 and bonding layer 1712. The contact layer may include any suitable material for providing an electrical contact to second semiconductor layer 1710 and/or first semiconductor layer 1706.

First wafer 1702 may be bonded to wafer 1703 that includes driver circuits 1711 and bonding layer 1713 as described above, via bonding layer 1713 and/or bonding layer 1712. Bonding layer 1712 and bonding layer 1713 may be made of the same material or different materials. Bonding layer 1713 and bonding layer 1712 may be substantially flat. First wafer 1702 may be bonded to wafer 1703 by various methods, such as metal-to-metal bonding, eutectic bonding, metal oxide bonding, anodic bonding, thermo-compression bonding, ultraviolet (UV) bonding, and/or fusion bonding.

As shown in FIG. 17B, first wafer 1702 may be bonded to wafer 1703 with the p-side (e.g., second semiconductor layer 1710) of first wafer 1702 facing down (i.e., toward wafer 1703). After bonding, substrate 1704 may be removed from first wafer 1702, and first wafer 1702 may then be processed from the n-side. The processing may include, for example, the formation of certain mesa shapes for individual LEDs, as well as the formation of optical components corresponding to the individual LEDs.

Figure 18A:
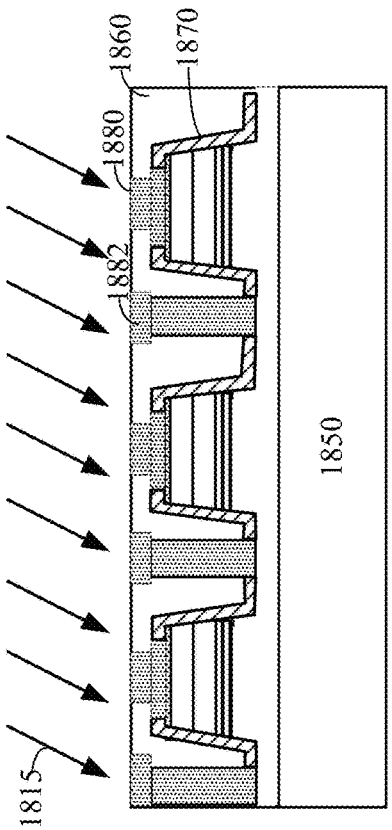
FIGS. 18A-18D illustrate an example of a method of hybrid bonding for arrays of LEDs according to certain embodiments.

FIGS. 18A-18D illustrate an example of a method of hybrid bonding for arrays of LEDs according to certain embodiments. The hybrid bonding may generally include wafer cleaning and activation, high-precision alignment of contacts of one wafer with contacts of another wafer, dielectric bonding of dielectric materials at the surfaces of the wafers at room temperature, and metal bonding of the contacts by annealing at elevated temperatures. FIG. 18A shows a substrate 1810 with passive or active circuits 1820 manufactured thereon. As described above with respect to FIGS. 8A-8B, substrate 1810 may include, for example, a silicon wafer. Circuits 1820 may include driver circuits for the arrays of LEDs. A bonding layer may include dielectric regions 1840 and contact pads 1830 connected to circuits 1820 through electrical interconnects 1822. Contact pads 1830 may include, for example, Cu, Ag, Au, Al, W, Mo, Ni, Ti, Pt, Pd, or the like. Dielectric materials in dielectric regions 1840 may include SiCN, SiO$_2$, SiN, Al$_2$O$_3$, HfO$_2$, ZrO$_2$, Ta$_2$O$_5$, or the like. The bonding layer may be planarized and polished using, for example, chemical mechanical polishing, where the planarization or polishing may cause dishing (a bowl like profile) in the contact pads. The surfaces of the bonding layers may be cleaned and activated by, for example, an ion (e.g., plasma) or fast atom (e.g., Ar) beam 1805. The activated surface may be atomically clean and may be reactive for formation of direct bonds between wafers when they are brought into contact, for example, at room temperature.

Figure 18B:
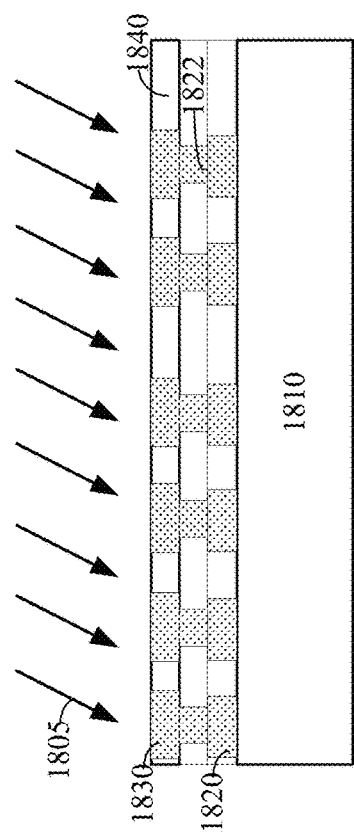

FIG. 18B illustrates a wafer 1850 including an array of micro-LEDs 1870 fabricated thereon as described above with respect to, for example, FIGS. 7A-8B. Wafer 1850 may be a carrier wafer and may include, for example, GaAs, InP, GaN, AlN, sapphire, SiC, Si, or the like. Micro-LEDs 1870 may include an n-type layer, an active region, and a p-type layer epitaxially grown on wafer 1850. The epitaxial layers may include various III-V semiconductor materials described above, and may be processed from the p-type layer side to etch mesa structures in the epitaxial layers, such as substantially vertical structures, parabolic structures, conic structures, or the like. Passivation layers and/or reflection layers may be formed on the sidewalls of the mesa structures. P-contacts 1880 and n-contacts 1882 may be formed in a dielectric material layer 1860 deposited on the mesa structures and may make electrical contacts with the p-type layer and the n-type layers, respectively. Dielectric materials in dielectric material layer 1860 may include, for example, SiCN, SiO$_2$, SiN, Al$_2$O$_3$, HfO$_2$, ZrO$_2$, Ta$_2$O$_5$, or the like. P-contacts 1880 and n-contacts 1882 may include, for example, Cu, Ag, Au, Al, W, Mo, Ni, Ti, Pt, Pd, or the like. The top surfaces of p-contacts 1880, n-contacts 1882, and dielectric material layer 1860 may form a bonding layer. The bonding layer may be planarized and polished using, for example, chemical mechanical polishing, where the polishing may cause dishing in p-contacts 1880 and n-contacts 1882. The bonding layer may then be cleaned and activated by, for example, an ion (e.g., plasma) or fast atom (e.g., Ar) beam 1815. The activated surface may be atomically clean and reactive for formation of direct bonds between wafers when they are brought into contact, for example, at room temperature.

Figure 18D:
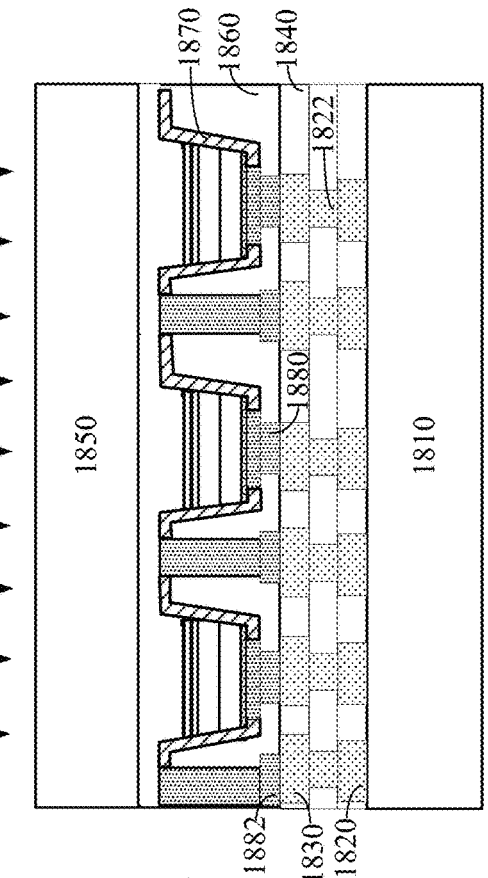
Figure 18C:
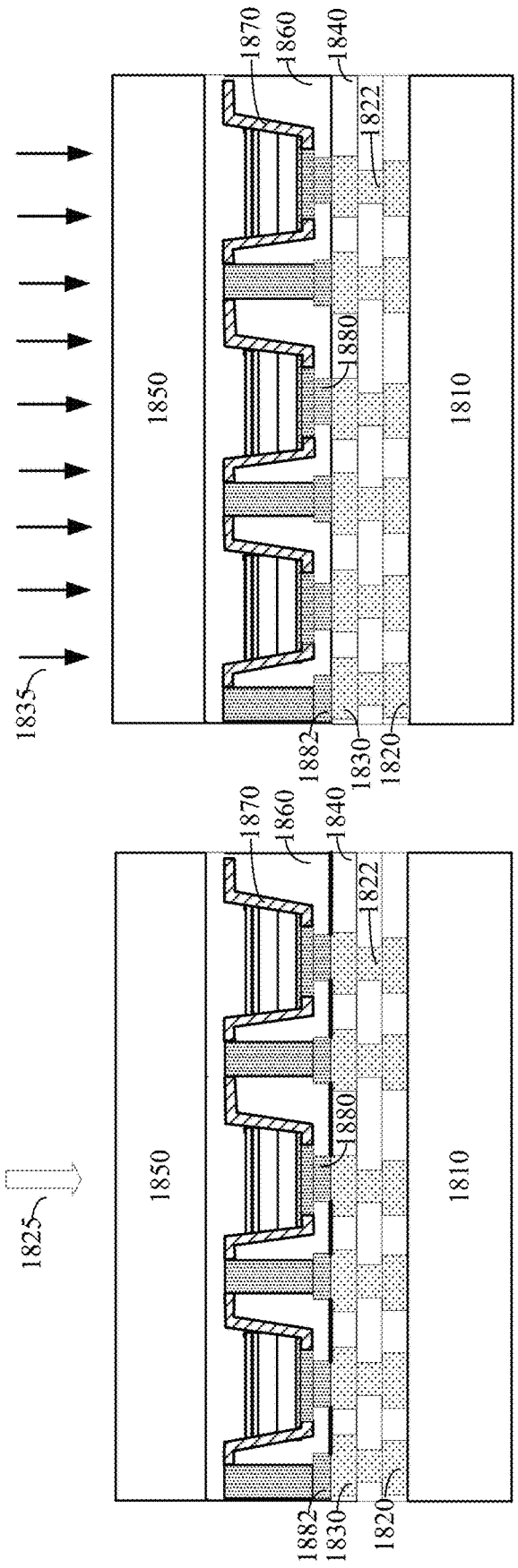

FIG. 18C illustrates a room temperature bonding process for bonding the dielectric materials in the bonding layers. For example, after the bonding layer that includes dielectric regions 1840 and contact pads 1830 and the bonding layer that includes p-contacts 1880, n-contacts 1882, and dielectric material layer 1860 are surface activated, wafer 1850 and micro-LEDs 1870 may be turned upside down and brought into contact with substrate 1810 and the circuits formed thereon. In some embodiments, compression pressure 1825 may be applied to substrate 1810 and wafer 1850 such that the bonding layers are pressed against each other. Due to the surface activation and the dishing in the contacts, dielectric regions 1840 and dielectric material layer 1860 may be in direct contact because of the surface attractive force, and may react and form chemical bonds between them because the surface atoms may have dangling bonds and may be in unstable energy states after the activation. Thus, the dielectric materials in dielectric regions 1840 and dielectric material layer 1860 may be bonded together with or without heat treatment or pressure.

FIG. 18D illustrates an annealing process for bonding the contacts in the bonding layers after bonding the dielectric materials in the bonding layers. For example, contact pads 1830 and p-contacts 1880 or n-contacts 1882 may be bonded together by annealing at, for example, about 200-400° C. or higher. During the annealing process, heat 1835 may cause the contacts to expand more than the dielectric materials (due to different coefficients of thermal expansion), and thus may close the dishing gaps between the contacts such that contact pads 1830 and p-contacts 1880 or n-contacts 1882 may be in contact and may form direct metallic bonds at the activated surfaces.

In some embodiments where the two bonded wafers include materials having different coefficients of thermal expansion (CTEs), the dielectric materials bonded at room temperature may help to reduce or prevent misalignment of the contact pads caused by the different thermal expansions. In some embodiments, to further reduce or avoid the misalignment of the contact pads at a high temperature during annealing, trenches may be formed between micro-LEDs, between groups of micro-LEDs, through part or all of the substrate, or the like, before bonding.

After the micro-LEDs are bonded to the driver circuits, the substrate on which the micro-LEDs are fabricated may be thinned or removed, and various secondary optical components may be fabricated on the light emitting surfaces of the micro-LEDs to, for example, extract, collimate, and redirect the light emitted from the active regions of the micro-LEDs. In one example, micro-lenses may be formed on the micro-LEDs, where each micro-lens may correspond to a respective micro-LED and may help to improve the light extraction efficiency and collimate the light emitted by the micro-LED. In some embodiments, the secondary optical components may be fabricated in the substrate or the n-type layer of the micro-LEDs. In some embodiments, the secondary optical components may be fabricated in a dielectric layer deposited on the n-type side of the micro-LEDs. Examples of the secondary optical components may include a lens, a grating, an antireflection (AR) coating, a prism, a photonic crystal, or the like.

Figure 19:
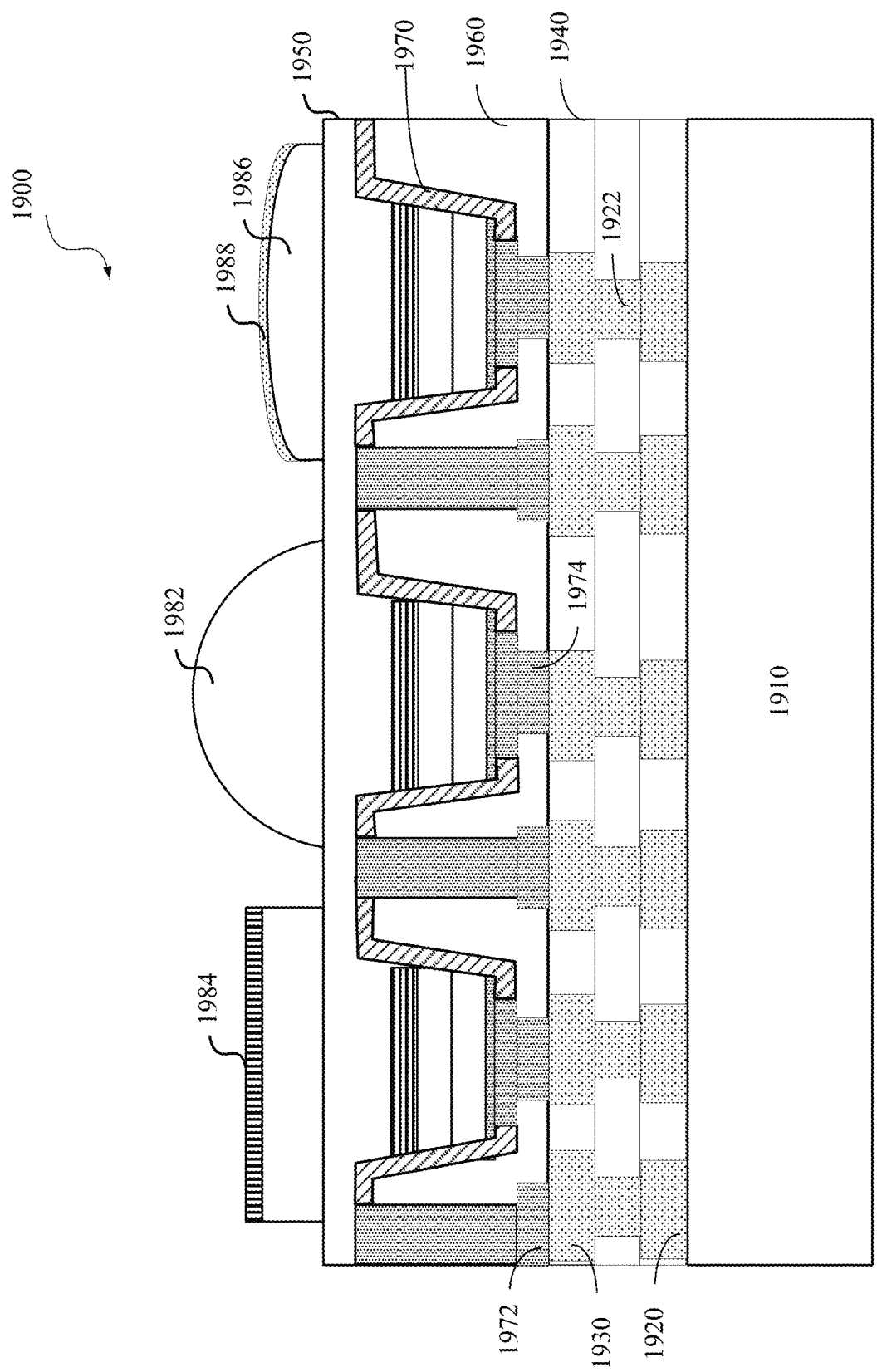
FIG. 19 illustrates an example of an LED array with secondary optical components fabricated thereon according to certain embodiments.

FIG. 19 illustrates an example of an LED array 1900 with secondary optical components fabricated thereon according to certain embodiments. LED array 1900 may be made by bonding an LED chip or wafer with a silicon wafer including electrical circuits fabricated thereon, using any suitable bonding techniques described above with respect to, for example, FIGS. 17A-18D. In the example shown in FIG. 19, LED array 1900 may be bonded using a wafer-to-wafer hybrid bonding technique as described above with respect to FIG. 18A-18D. LED array 1900 may include a substrate 1910, which may be, for example, a silicon wafer. Integrated circuits 1920, such as LED driver circuits, may be fabricated on substrate 1910. Integrated circuits 1920 may be connected to p-contacts 1974 and n-contacts 1972 of micro-LEDs 1970 through interconnects 1922 and contact pads 1930, where contact pads 1930 may form metallic bonds with p-contacts 1974 and n-contacts 1972. Dielectric layer 1940 on substrate 1910 may be bonded to dielectric layer 1960 through fusion bonding.

The substrate (not shown) of the LED chip or wafer may be thinned or may be removed to expose the n-type layer 1950 of micro-LEDs 1970. Various secondary optical components, such as a spherical, semi-parabolic, or parabolic micro-lens 1982, a grating 1984, a micro-lens 1986, an antireflection layer 1988, and the like, may be formed in or on top of n-type layer 1950. For example, spherical micro-lens arrays may be etched in the semiconductor materials of micro-LEDs 1970 using a gray-scale mask and a photoresist with a linear response to exposure light, or using an etch mask formed by thermal reflowing of a patterned photoresist layer. The secondary optical components may also be etched in a dielectric layer deposited on n-type layer 1950 using similar photolithographic techniques or other techniques. For example, micro-lens arrays may be formed in a polymer layer through thermal reflowing of the polymer layer that is patterned using a binary mask. The micro-lens arrays in the polymer layer may be used as the secondary optical components or may be used as the etch mask for transferring the profiles of the micro-lens arrays into a dielectric layer or a semiconductor layer. The dielectric layer may include, for example, SiCN, SiO$_2$, SiN, Al$_2$O$_3$, HfO$_2$, ZrO$_2$, Ta$_2$O$_5$, or the like. In some embodiments, a micro-LED 1970 may have multiple corresponding secondary optical components, such as a micro-lens and an anti-reflection coating, a micro-lens etched in the semiconductor material and a micro-lens etched in a dielectric material layer, a micro-lens and a grating, a spherical lens and an aspherical lens, and the like. Three different secondary optical components are illustrated in FIG. 19 to show some examples of secondary optical components that can be formed on micro-LEDs 1970, which does not necessary imply that different secondary optical components are used simultaneously for every LED array.

Embodiments disclosed herein may be used to implement components of an artificial reality system or may be implemented in conjunction with an artificial reality system. Artificial reality is a form of reality that has been adjusted in some manner before presentation to a user, which may include, for example, a virtual reality, an augmented reality, a mixed reality, a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including an HMD connected to a host computer system, a standalone HMD, a mobile device or computing system, or any other hardware platform capable of providing artificial reality content to one or more viewers.

Figure 20:
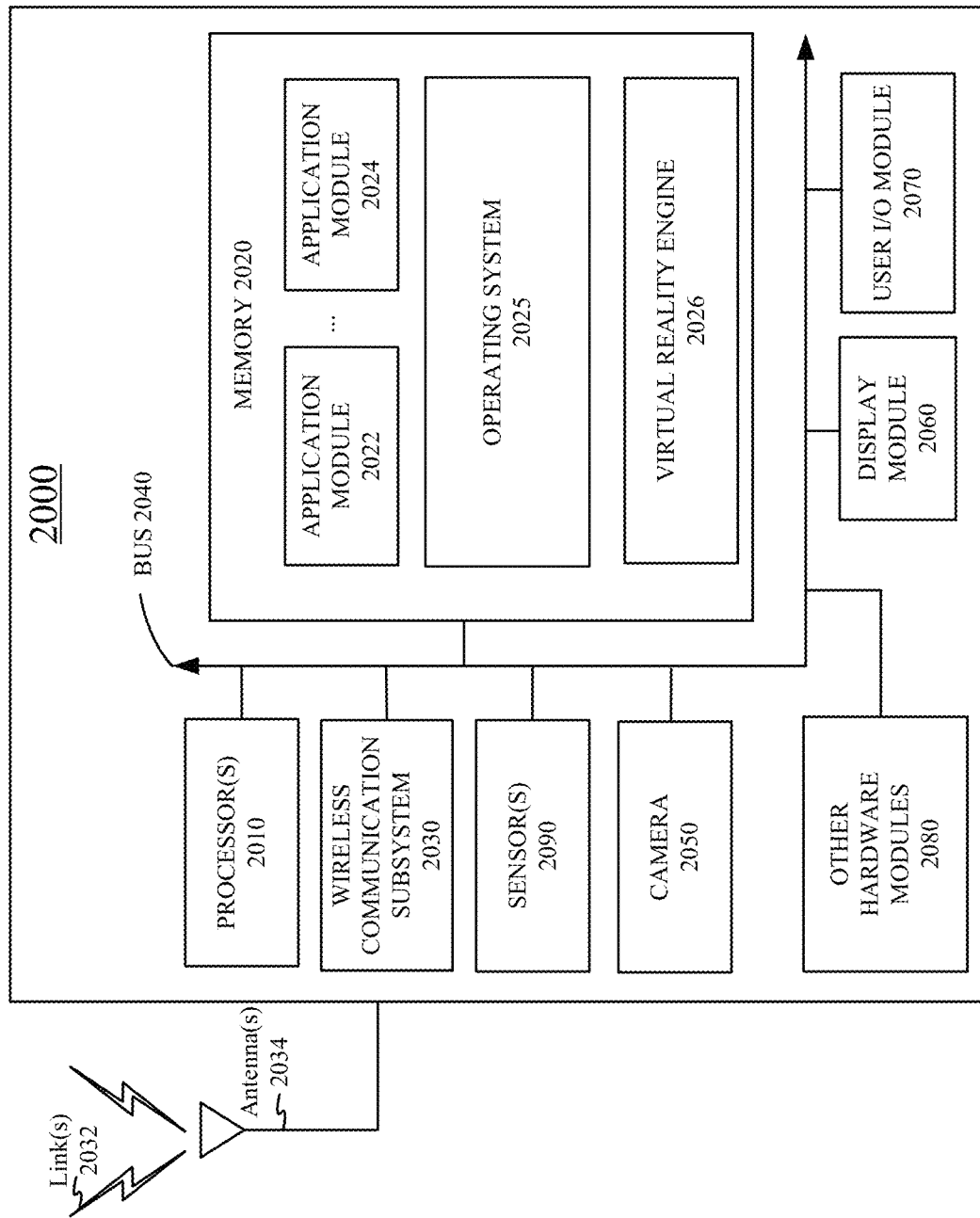
FIG. 20 is a simplified block diagram of an electronic system of an example of a near-eye display according to certain embodiments.

FIG. 20 is a simplified block diagram of an example electronic system 2000 of an example near-eye display (e.g., HMD device) for implementing some of the examples disclosed herein. Electronic system 2000 may be used as the electronic system of an HMD device or other near-eye displays described above. In this example, electronic system 2000 may include one or more processor(s) 2010 and a memory 2020. Processor(s) 2010 may be configured to execute instructions for performing operations at a number of components, and can be, for example, a general-purpose processor or microprocessor suitable for implementation within a portable electronic device. Processor(s) 2010 may be communicatively coupled with a plurality of components within electronic system 2000. To realize this communicative coupling, processor(s) 2010 may communicate with the other illustrated components across a bus 2040. Bus 2040 may be any subsystem adapted to transfer data within electronic system 2000. Bus 2040 may include a plurality of computer buses and additional circuitry to transfer data.

Memory 2020 may be coupled to processor(s) 2010. In some embodiments, memory 2020 may offer both short-term and long-term storage and may be divided into several units. Memory 2020 may be volatile, such as static random access memory (SRAM) and/or dynamic random access memory (DRAM) and/or non-volatile, such as read-only memory (ROM), flash memory, and the like. Furthermore, memory 2020 may include removable storage devices, such as secure digital (SD) cards. Memory 2020 may provide storage of computer-readable instructions, data structures, program modules, and other data for electronic system 2000. In some embodiments, memory 2020 may be distributed into different hardware modules. A set of instructions and/or code might be stored on memory 2020. The instructions might take the form of executable code that may be executable by electronic system 2000, and/or might take the form of source and/or installable code, which, upon compilation and/or installation on electronic system 2000 (e.g., using any of a variety of generally available compilers, installation programs, compression/decompression utilities, etc.), may take the form of executable code.

In some embodiments, memory 2020 may store a plurality of application modules 2022 through 2024, which may include any number of applications. Examples of applications may include gaming applications, conferencing applications, video playback applications, or other suitable applications. The applications may include a depth sensing function or eye tracking function. Application modules 2022-2024 may include particular instructions to be executed by processor(s) 2010. In some embodiments, certain applications or parts of application modules 2022-2024 may be executable by other hardware modules 2080. In certain embodiments, memory 2020 may additionally include secure memory, which may include additional security controls to prevent copying or other unauthorized access to secure information.

In some embodiments, memory 2020 may include an operating system 2025 loaded therein. Operating system 2025 may be operable to initiate the execution of the instructions provided by application modules 2022-2024 and/or manage other hardware modules 2080 as well as interfaces with a wireless communication subsystem 2030 which may include one or more wireless transceivers. Operating system 2025 may be adapted to perform other operations across the components of electronic system 2000 including threading, resource management, data storage control and other similar functionality.

Wireless communication subsystem 2030 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 2000 may include one or more antennas 2034 for wireless communication as part of wireless communication subsystem 2030 or as a separate component coupled to any portion of the system. Depending on desired functionality, wireless communication subsystem 2030 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN. Wireless communications subsystem 2030 may permit data to be exchanged with a network, other computer systems, and/or any other devices described herein. Wireless communication subsystem 2030 may include a means for transmitting or receiving data, such as identifiers of HMD devices, position data, a geographic map, a heat map, photos, or videos, using antenna(s) 2034 and wireless link(s) 2032. Wireless communication subsystem 2030, processor(s) 2010, and memory 2020 may together comprise at least a part of one or more of a means for performing some functions disclosed herein.

Embodiments of electronic system 2000 may also include one or more sensors 2090. Sensor(s) 2090 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 2090 may include one or more inertial measurement units (IMUs) and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or any combination thereof. The position sensors may be located external to the IMU, internal to the IMU, or any combination thereof. At least some sensors may use a structured light pattern for sensing.

Electronic system 2000 may include a display module 2060. Display module 2060 may be a near-eye display, and may graphically present information, such as images, videos, and various instructions, from electronic system 2000 to a user. Such information may be derived from one or more application modules 2022-2024, virtual reality engine 2026, one or more other hardware modules 2080, a combination thereof, or any other suitable means for resolving graphical content for the user (e.g., by operating system 2025). Display module 2060 may use LCD technology, LED technology (including, for example, OLED, ILED, µ-LED, AMO-LED, TOLED, etc.), light emitting polymer display (LPD) technology, or some other display technology.

Electronic system 2000 may include a user input/output module 2070. User input/output module 2070 may allow a user to send action requests to electronic system 2000. An action request may be a request to perform a particular action. For example, an action request may be to start or end an application or to perform a particular action within the application. User input/output module 2070 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 2000. In some embodiments, user input/output module 2070 may provide haptic feedback to the user in accordance with instructions received from electronic system 2000. For example, the haptic feedback may be provided when an action request is received or has been performed.

Electronic system 2000 may include a camera 2050 that may be used to take photos or videos of a user, for example, for tracking the user's eye position. Camera 2050 may also be used to take photos or videos of the environment, for example, for VR, AR, or MR applications. Camera 2050 may include, for example, a complementary metal-oxide-semiconductor (CMOS) image sensor with a few millions or tens of millions of pixels. In some implementations, camera 2050 may include two or more cameras that may be used to capture 3-D images.

In some embodiments, electronic system 2000 may include a plurality of other hardware modules 2080. Each of other hardware modules 2080 may be a physical module within electronic system 2000. While each of other hardware modules 2080 may be permanently configured as a structure, some of other hardware modules 2080 may be temporarily configured to perform specific functions or temporarily activated. Examples of other hardware modules 2080 may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 2080 may be implemented in software.

In some embodiments, memory 2020 of electronic system 2000 may also store a virtual reality engine 2026. Virtual reality engine 2026 may execute applications within electronic system 2000 and receive position information, acceleration information, velocity information, predicted future positions, or any combination thereof of the HMD device from the various sensors. In some embodiments, the information received by virtual reality engine 2026 may be used for producing a signal (e.g., display instructions) to display module 2060. For example, if the received information indicates that the user has looked to the left, virtual reality engine 2026 may generate content for the HMD device that mirrors the user's movement in a virtual environment. Additionally, virtual reality engine 2026 may perform an action within an application in response to an action request received from user input/output module 2070 and provide feedback to the user. The provided feedback may be visual, audible, or haptic feedback. In some implementations, processor(s) 2010 may include one or more GPUs that may execute virtual reality engine 2026.

In various implementations, the above-described hardware and modules may be implemented on a single device or on multiple devices that can communicate with one another using wired or wireless connections. For example, in some implementations, some components or modules, such as GPUs, virtual reality engine 2026, and applications (e.g., tracking application), may be implemented on a console separate from the head-mounted display device. In some implementations, one console may be connected to or support more than one HMD.

In alternative configurations, different and/or additional components may be included in electronic system 2000. Similarly, functionality of one or more of the components can be distributed among the components in a manner different from the manner described above. For example, in some embodiments, electronic system 2000 may be modified to include other system environments, such as an AR system environment and/or an MR environment.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A light source comprising:
an epitaxial layer stack including an n-type semiconductor layer, a light-emitting layer, and a p-type semiconductor layer, the epitaxial layer stack including a two-dimensional (2-D) array of mesa structures formed therein;
an array of p-contacts electrically coupled to the p-type semiconductor layer of the 2-D array of mesa structures;
a metal layer surrounding each individual mesa structure of the 2-D array of mesa structures; and
a plurality of n-contacts coupling the metal layer to the n-type semiconductor layer at a plurality of locations between the individual mesa structures of the 2-D array of mesa structures.

2. The light source of claim 1, wherein the plurality of n-contacts and the array of p-contacts are on a same side of the n-type semiconductor layer or are on opposite sides of the n-type semiconductor layer.

3. The light source of claim 1, further comprising an elongated n-contact at an area outside of the 2-D array of mesa structures, the elongated n-contact coupling the metal layer to the n-type semiconductor layer at the area outside of the 2-D array of mesa structures.

4. The light source of claim 1, further comprising an array of micro-lenses on a surface of the n-type semiconductor layer.

5. The light source of claim 4, wherein the array of micro-lenses is formed in the n-type semiconductor layer or a dielectric layer formed on the n-type semiconductor layer.

6. The light source of claim 4, wherein the metal layer is between individual micro-lenses of the array of micro-lenses.

7. The light source of claim 1, wherein the metal layer is on sidewalls of the 2-D array of mesa structures and regions between the 2-D array of mesa structures.

8. The light source of claim 7, further comprising a dielectric layer between the sidewalls of the 2-D array of mesa structures and the metal layer, wherein the dielectric layer and the metal layer form a sidewall reflector.

9. The light source of claim 1, further comprising a transparent conductive material layer between the array of p-contacts and the p-type semiconductor layer.

10. The light source of claim 1, wherein each n-contact of the plurality of n-contacts is located at a center of a square region including four mesa structures.

11. The light source of claim 1, wherein:
a pitch of the 2-D array of mesa structures is equal to or less than 5 µm; and
each mesa structure of the 2-D array of mesa structures is characterized by a lateral linear dimension equal to or less than 3 µm.

12. The light source of claim 1, further comprising a second metal layer on a surface of the n-type semiconductor layer, wherein the metal layer and the second metal layer are on opposite sides of the n-type semiconductor layer.

13. The light source of claim 12, wherein the second metal layer is configured to absorb visible light.

14. The light source of claim 1, wherein the metal layer is characterized by at least one of:
a thickness greater than 50 nm; or
a drive current density equal to or greater than 1 A/cm$^2$ at a drive voltage equal to or less than 4.5 V.

15. The light source of claim 1, wherein the metal layer includes Al, Au, Ni, Ti, Pd, Ge, Ag, Cu, or any combination thereof.

16. The light source of claim 1, wherein at least one of the metal layer or the plurality of n-contacts is configured to absorb visible light.

17. The light source of claim 1, wherein the n-type semiconductor layer includes a heavily doped sublayer.

18. The light source of claim 1, further comprising a semiconductor substrate including electrical circuits fabricated thereon, the electrical circuits electrically coupled to the array of p-contacts and the plurality of n-contacts.

19. A method comprising:
fabricating a micro-light emitting diode (micro-LED) array that comprises:
an epitaxial layer stack including an n-type semiconductor layer, a light-emitting layer, and a p-type semiconductor layer, the epitaxial layer stack including a two-dimensional (2-D) array of mesa structures formed therein;
an array of p-contacts electrically coupled to the p-type semiconductor layer of the 2-D array of mesa structures;
a metal layer surrounding each individual mesa structure of the 2-D array of mesa structures; and
a plurality of n-contacts coupling the metal layer to the n-type semiconductor layer at a plurality of locations between the individual mesa structures of the 2-D array of mesa structures;
fabricating electrical circuits on a semiconductor substrate; and
bonding the micro-LED array to the semiconductor substrate such that the electrical circuits are coupled to the array of p-contacts and the plurality of n-contacts.

20. The method of claim 19, further comprising forming a second metal layer on the n-type semiconductor layer, the metal layer and the second metal layer on opposite sides of the n-type semiconductor layer.

21. The method of claim 19, wherein fabricating the micro-LED array comprises:
growing the epitaxial layer stack on a second substrate;
etching the epitaxial layer stack to form the 2-D array of mesa structures in the epitaxial layer stack;
depositing a first dielectric layer on surfaces of the 2-D array of mesa structures;
forming the plurality of n-contacts at regions between mesa structures of the 2-D array of mesa structures;
depositing the metal layer on the first dielectric layer and the plurality of n-contacts;
patterning the metal layer;
forming a patterned second dielectric layer on the metal layer;
forming the array of p-contacts in the patterned second dielectric layer;
forming a patterned third dielectric layer; and
forming p-electrodes and n-electrodes in the patterned third dielectric layer, the p-electrodes electrically connected to the array of p-contacts, and the n-electrodes electrically connected to the plurality of n-contacts.

* * * * *